US006992333B2

(12) United States Patent  
Nagai et al.

(10) Patent No.: US 6,992,333 B2  
(45) Date of Patent: Jan. 31, 2006

(54) LIGHT-EMITTING UNIT, LIGHT-EMITTING UNIT ASSEMBLY, AND LIGHTING APPARATUS PRODUCED USING A PLURALITY OF LIGHT-EMITTING UNITS

(75) Inventors: Hideo Nagai, Takatsuki (JP); Nobuyuki Matsui, Uji (JP); Tetsushi Tamura, Takatsuki (JP); Masanori Shimizu, Kyotanabe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/914,788

(22) Filed: Aug. 9, 2004

(65) Prior Publication Data

US 2005/0024868 A1    Feb. 3, 2005

Related U.S. Application Data

(62) Division of application No. 10/055,403, filed on Jan. 22, 2002, now Pat. No. 6,891,200.

(30) Foreign Application Priority Data

| Jan. 25, 2001 | (JP) | ............................. 2001-016663 |
| Sep. 20, 2001 | (JP) | ............................. 2001-287665 |
| Sep. 20, 2001 | (JP) | ............................. 2001-287666 |
| Sep. 20, 2001 | (JP) | ............................. 2001-287668 |

(51) Int. Cl.  
*H01L 83/00* (2006.01)

(52) U.S. Cl. ........................... 257/88; 257/83; 257/92; 257/99; 257/100

(58) Field of Classification Search ................. 257/88, 257/83, 89, 91, 92, 98, 99, 100, 95; 438/22; 362/368, 373; 372/36

See application file for complete search history.

(56) References Cited

U.S. PATENT DOCUMENTS

| 4,935,665 | A | 6/1990 | Murata |
| 5,491,349 | A | 2/1996 | Komoto et al. ............... 257/88 |
| 5,648,977 | A | 7/1997 | Miyazaki .................... 313/506 |
| 5,874,748 | A | 2/1999 | Osawa ........................ 257/91 |
| 5,893,633 | A | 4/1999 | Uchio et al. ................ 362/244 |
| 6,183,100 | B1 | 2/2001 | Suckow et al. .............. 362/35 |
| 6,262,531 | B1 | 7/2001 | Inoguchi et al. ............ 313/506 |
| 2001/0007360 | A1 | 7/2001 | Yoshida et al. .............. 257/89 |
| 2002/0006040 | A1 | 1/2002 | Kamada et al. ............. 362/237 |

FOREIGN PATENT DOCUMENTS

| JP | 06310763 | 11/1994 |
| JP | 2602063 | 1/1997 |

*Primary Examiner*—Minhloan Tran  
*Assistant Examiner*—Tan Tran

(57) ABSTRACT

A number of red LEDs, green LEDs, and blue LEDs are mounted on one surface of a polygonal flexible multilayer substrate. The LEDs are connected in series according to color. A red feeder terminal, a green feeder terminal, a blue feeder terminal, and a common terminal are provided on each of at least three sides of the periphery of the flexible multilayer substrate. Circuit patterns for connecting LEDs at the high-potential end of the red, green, and blue series-connected LEDs respectively to the red feeder terminals, green feeder terminals, and blue feeder terminals are provided to the flexible multilayer substrate. Also, a circuit pattern for connecting LEDs at the low-potential end of the red, green, and blue series-connected LEDs all to the common terminals is provided to the flexible multilayer substrate.

9 Claims, 71 Drawing Sheets

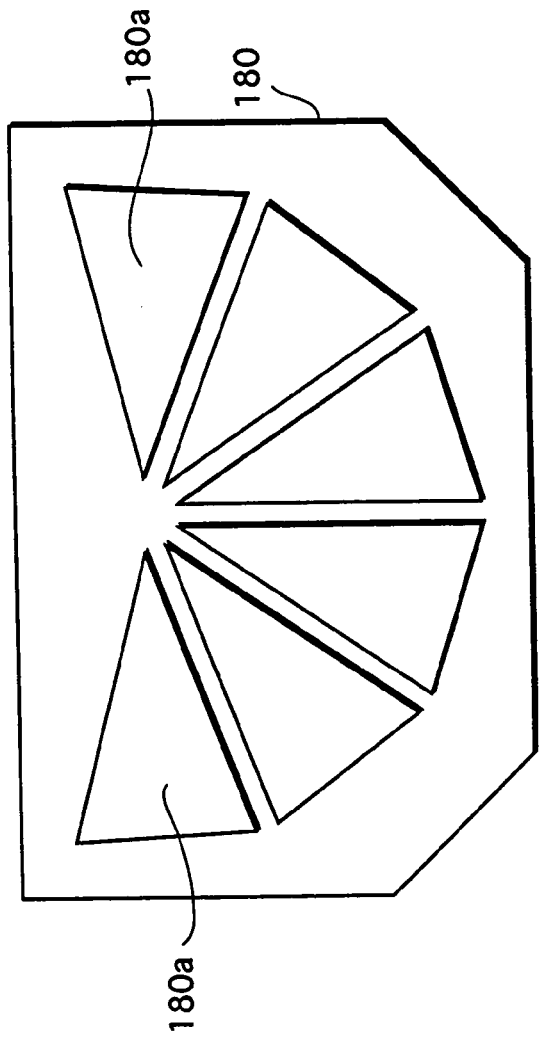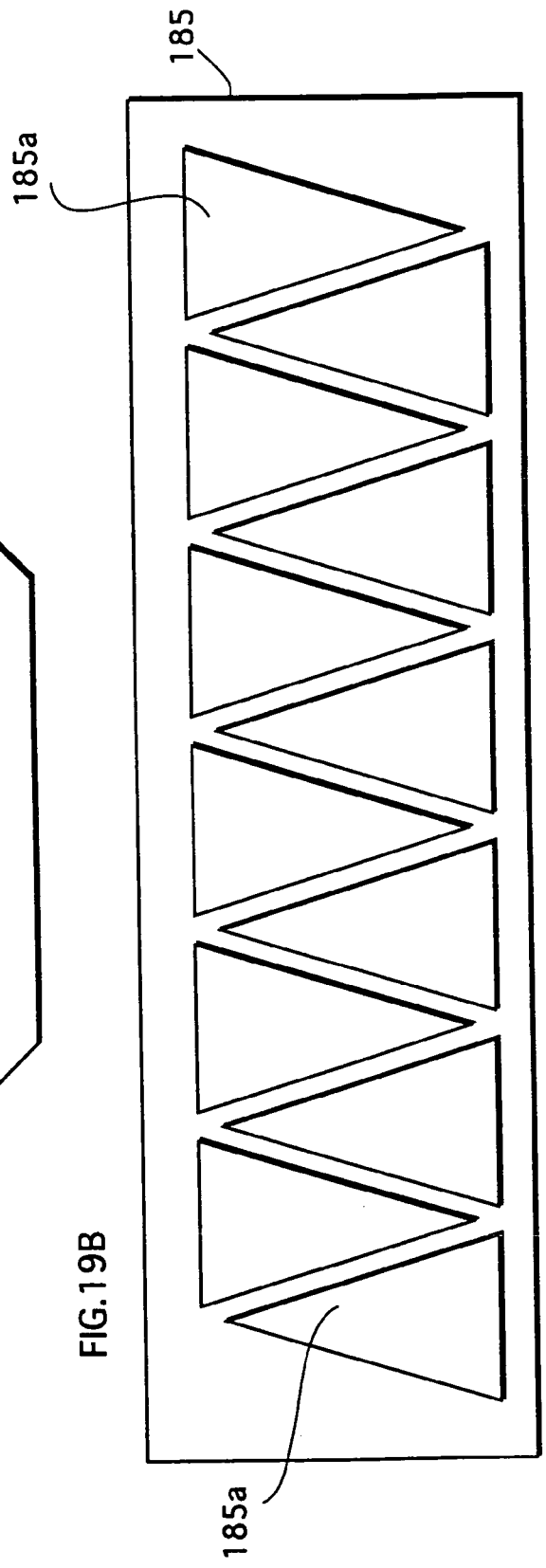

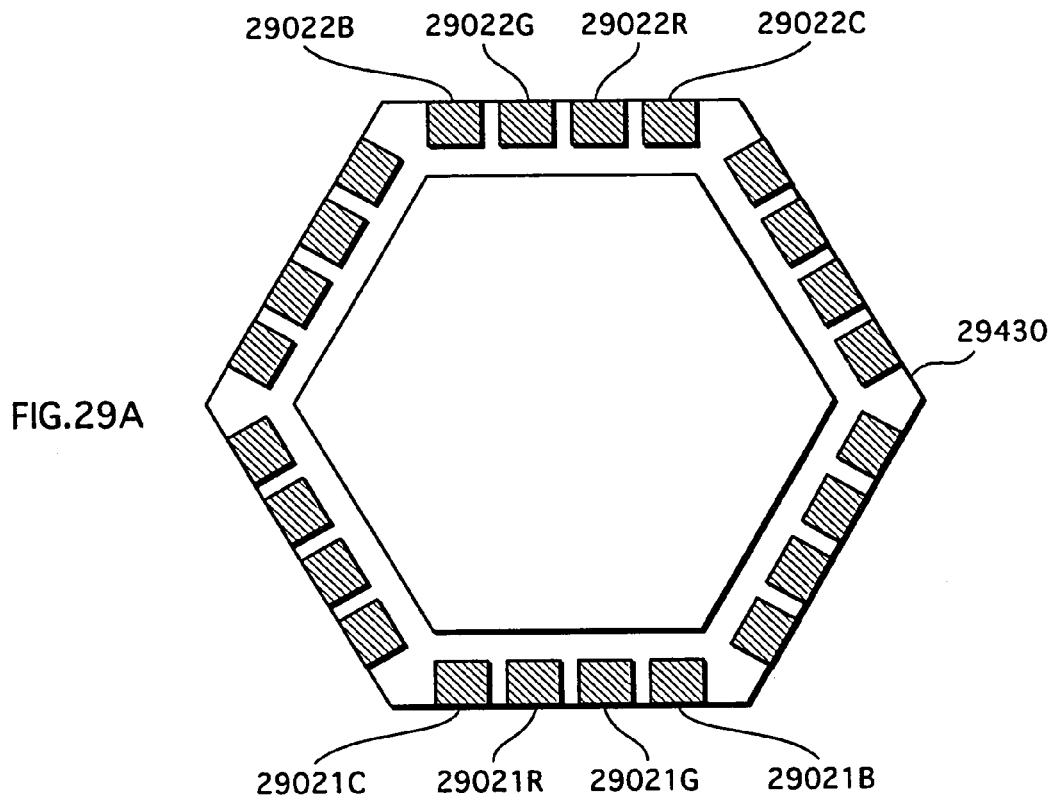
FIG.29A
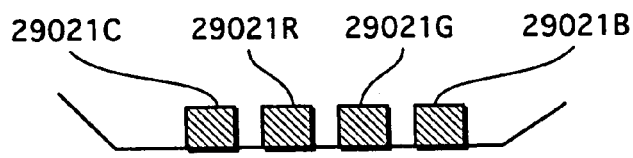
FIG.29B
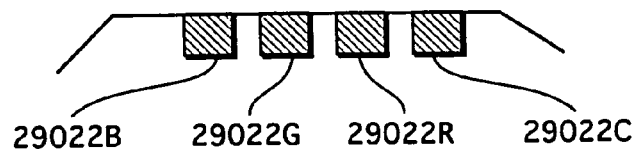
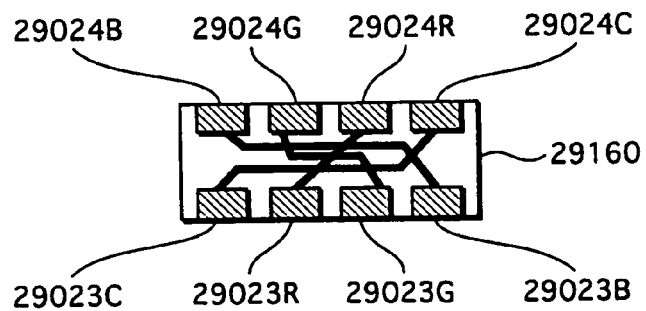
FIG.29C

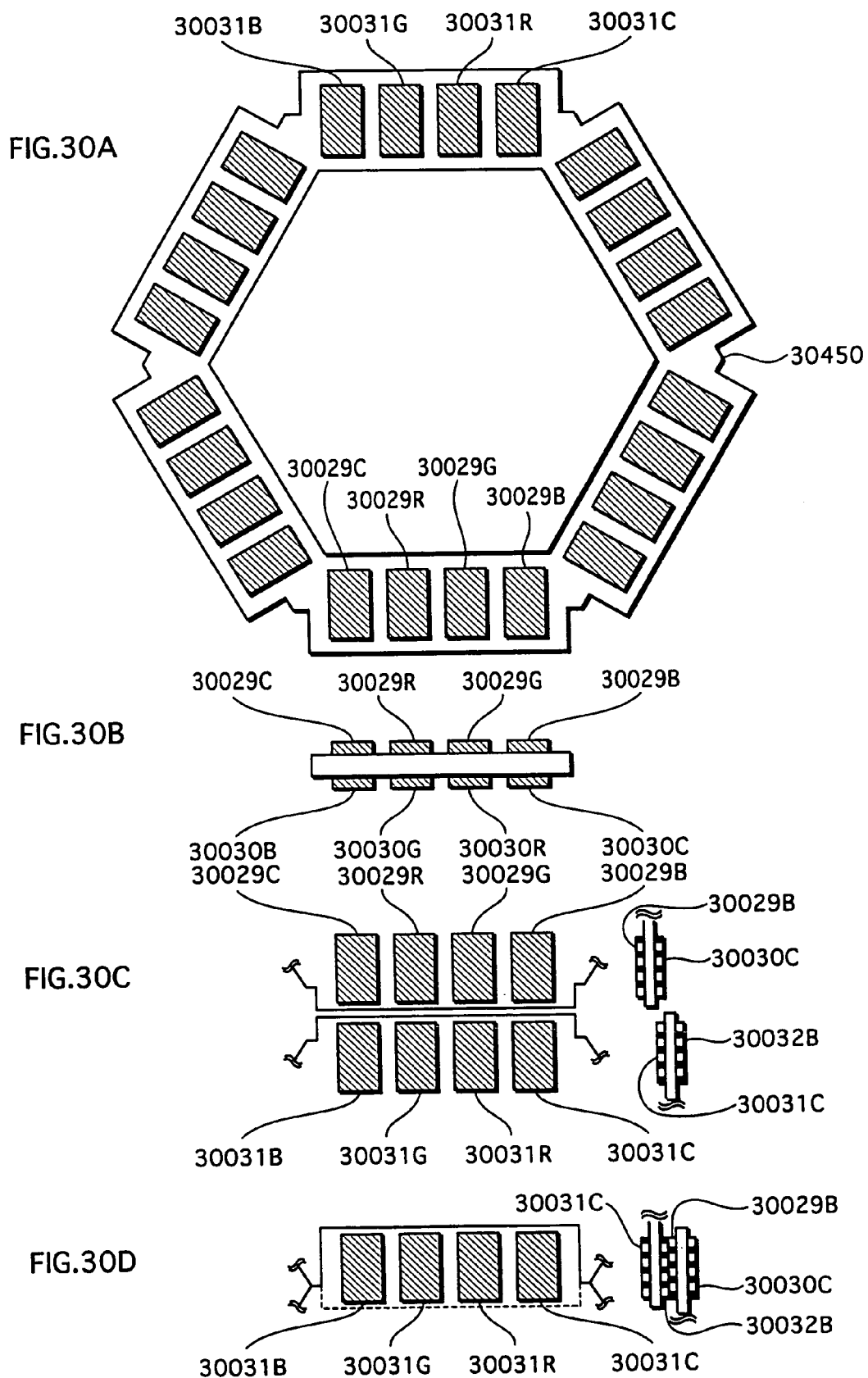

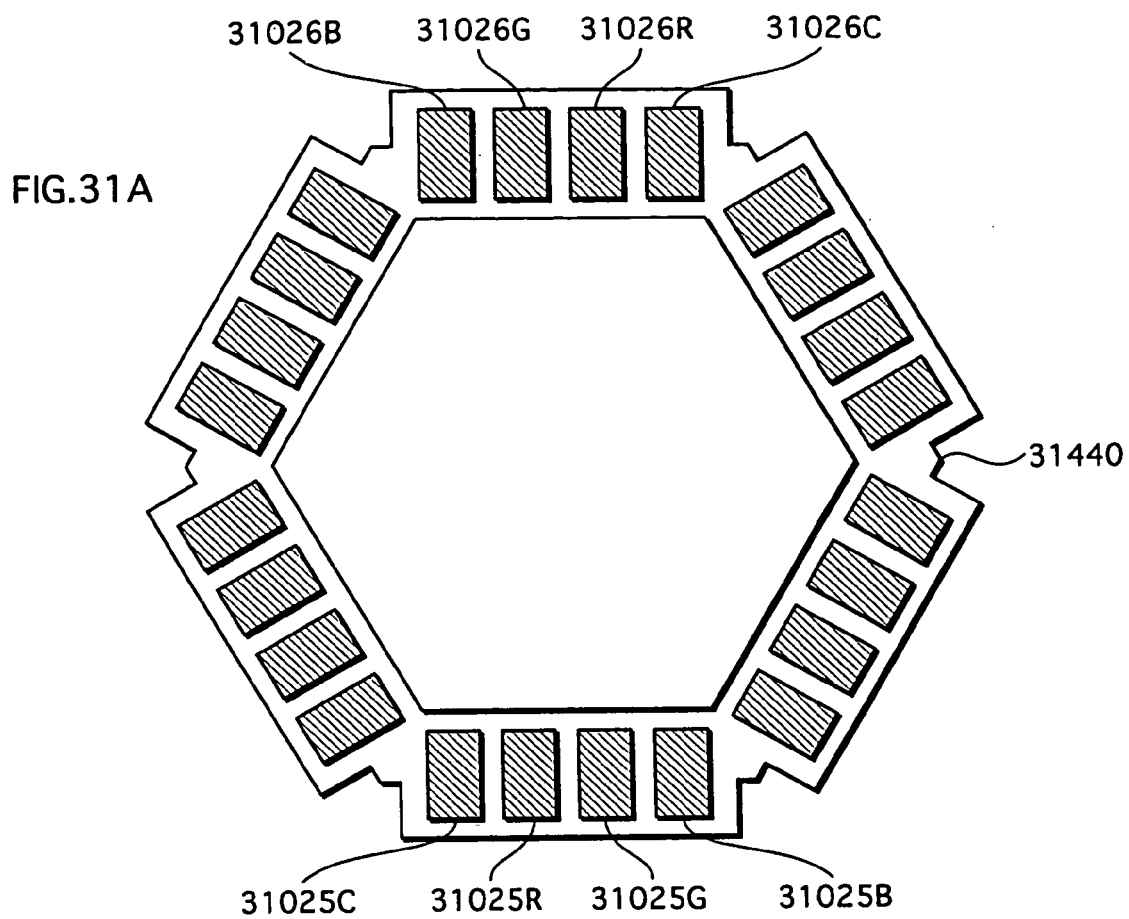
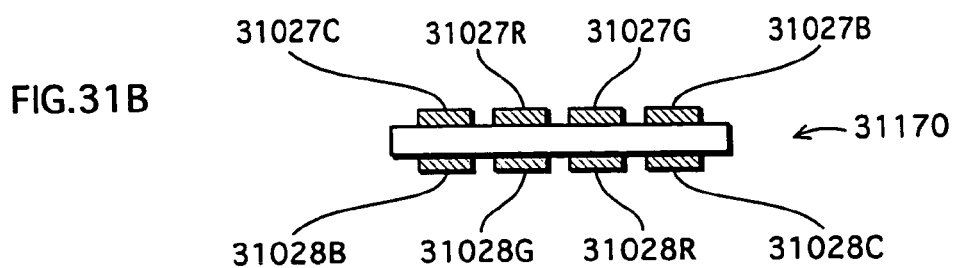
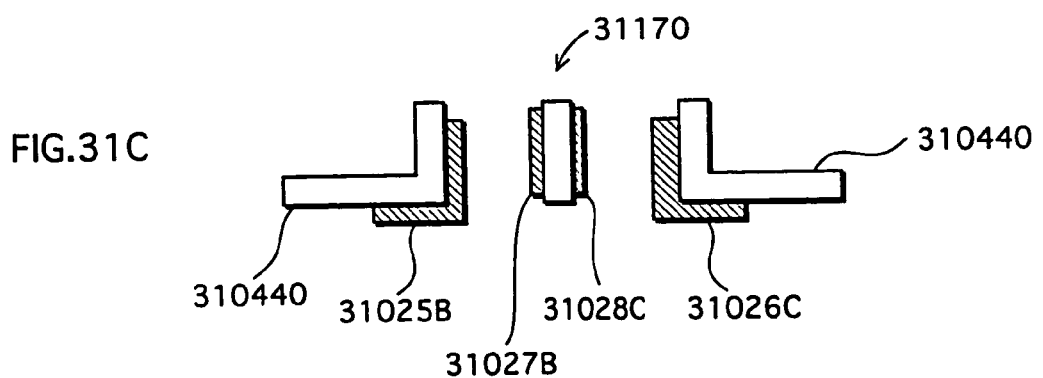
FIG.31A
FIG.31B
FIG.31C

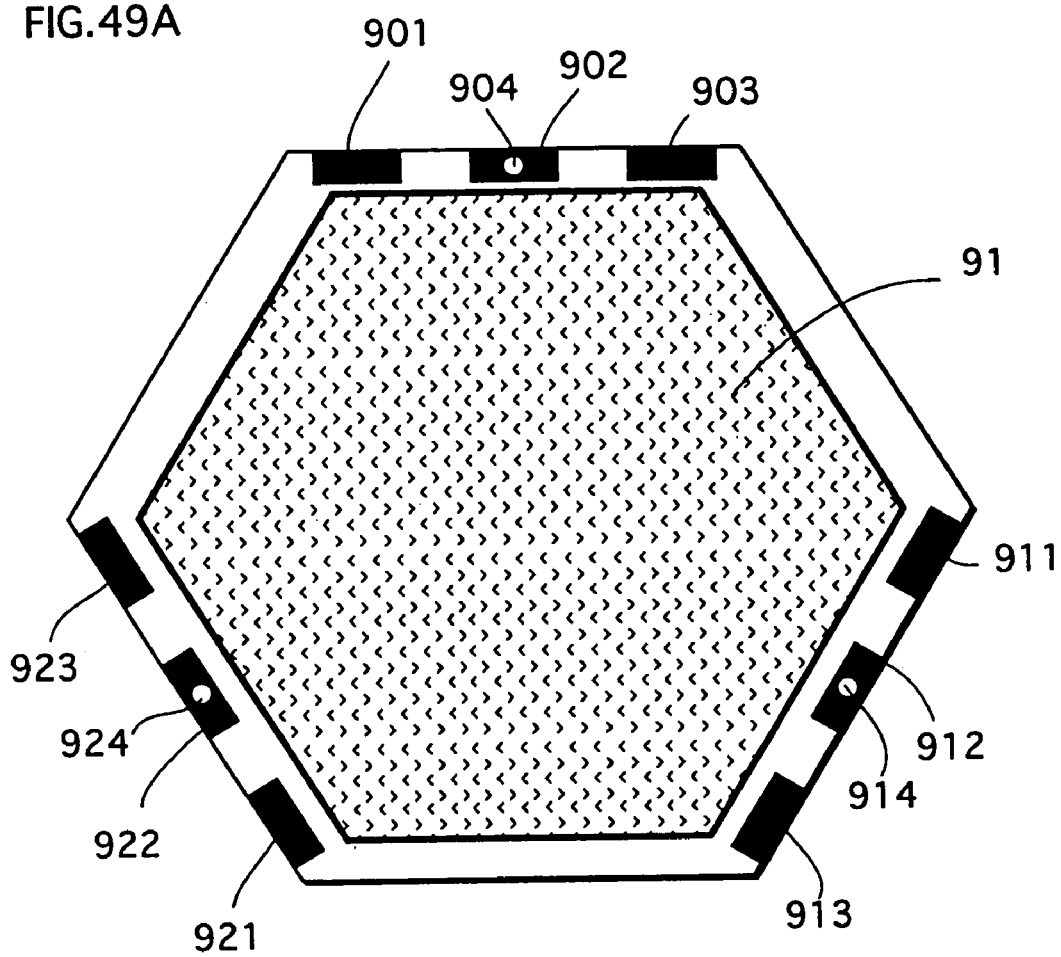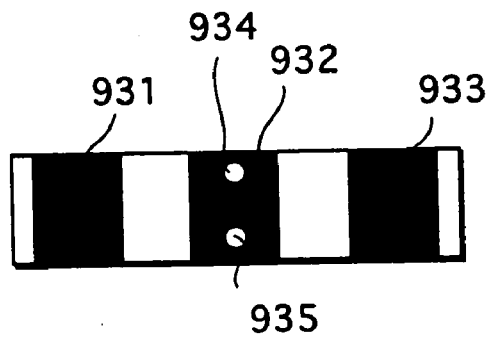

H1

H11

H12

LIGHT-EMITTING UNIT, LIGHT-EMITTING UNIT ASSEMBLY, AND LIGHTING APPARATUS PRODUCED USING A PLURALITY OF LIGHT-EMITTING UNITS

RELATED APPLICATIONS

This is a divisional application of U.S. Ser. No. 10/055,4032, filed on Jan. 22, 2002 now U.S. Pat. No. 6,891,200.

This application is based on applications Nos. 2001-016663, 2001-287665, 2001-287666, and 2001-287668 filed in Japan, the contents of which are hereby incorporated by reference.

BACKGROUND OF THE INVENTION

1. Field of the Invention

The present invention relates to a light-emitting unit, a light-emitting unit assembly, and a lighting apparatus manufactured using a plurality of light-emitting units.

2. Related Art

With diversification of fashions and consumer tastes, designs of various products, both movables and immovables, are increasingly diversified in recent years. Lighting apparatuses are no exception. Attractive and functional designs which are free from conventional shapes are being proposed.

One example is a lighting apparatus that is assembled by connecting a plurality of flat light-emitting units. Such a lighting apparatus comes in several different shapes depending on how the plurality of light-emitting units are combined.

However, the number of shapes realized by this type of lighting apparatus is still limited, with there being only a low degree of design freedom.

SUMMARY OF THE INVENTION

The first object of the present invention is to provide a novel light-emitting unit that realizes an assembly in a wide variety of shapes of both flat and solid appearances.

The second object of the present invention is to provide a light-emitting unit assembly that realizes a wide variety of shapes of both flat and solid appearances.

The third object of the present invention is to provide a novel lighting apparatus that is produced using a plurality of light-emitting units.

The first object can be achieved by a light-emitting unit including: a flat polygonal member; a light-emitting member which is provided on a main surface of the polygonal member; three sets of terminals, each set of terminals being provided on a different side of a periphery of the polygonal member; and a wiring pattern which is provided to the polygonal member to connect the set of terminals with the light-emitting member.

Here, "to provide a set of terminals on one side of the periphery of the polygonal member" means to provide a set of terminals along one side of the polygonal member. In other words, the set of terminals is not necessarily positioned at the outer edge of the polygonal member, as it may be positioned a predetermined distance inside the outer edge of the polygonal member.

The second object can be achieved by a light-emitting unit assembly including at least two light-emitting units, wherein each light-emitting unit includes: a flat polygonal member; a light-emitting member which is provided on a main surface of the polygonal member; three sets of terminals, each set of terminals being provided on a different side of a periphery of the polygonal member; and a wiring pattern which is provided to the polygonal member to connect the set of terminals with the light-emitting member, and wherein one side of a polygonal member of a light-emitting unit on which a set of terminals has been provided is set facing one side of a polygonal member of another light-emitting unit on which a set of terminals has been provided, and corresponding terminals on the facing sides of the two light-emitting units are electrically connected.

The third object can be achieved by a lighting apparatus including: a plurality of light-emitting units; and a feeder unit which is connected to an external power supply, wherein each light-emitting unit includes: a flat polygonal member; a light-emitting member which is provided on a main surface of the polygonal member; three sets of terminals, each set of terminals being provided on a different side of a periphery of the polygonal member; and a wiring pattern which is provided to the polygonal member to connect the set of terminals with the light-emitting member, the feeder unit includes: a polygonal substrate; and three sets of feeder terminals, each set of feeder terminals being provided on a different side of a periphery of the polygonal substrate, each feeder terminal being connected in parallel to corresponding feeder terminals on other sides, the plurality of light-emitting units and the feeder unit are joined at predetermined sides so as to form a polyhedral shape, the predetermined sides each being a side on which a set of terminal or a set of feeder terminal has been provided, and corresponding terminals on joined sides of the plurality of light-emitting units are electrically connected, and the plurality of light-emitting units are each electrically connected to the feeder unit in parallel.

The third object can also be achieved by a lighting apparatus that includes a plurality of light-emitting units and receives power from an external power supply circuit, wherein each light-emitting unit includes: a flat polygonal member; a light-emitting member which is provided on a main surface of the polygonal member; three sets of terminals, each set of terminals being provided on a different side of a periphery of the polygonal member; and a wiring pattern which is provided to the polygonal member to connect the set of terminals with the light-emitting member, and wherein the plurality of light-emitting units are joined at predetermined sides so as to form a polyhedral shape, the predetermined sides each being a side on which a set of terminal has been provided, and corresponding terminals on joined sides of the plurality of light-emitting units are electrically connected, and the plurality of light-emitting units are each electrically connected to the external power supply circuit in parallel.

BRIEF DESCRIPTION OF THE DRAWINGS

These and other objects, advantages and features of the invention will become apparent from the following description thereof taken in conjunction with the accompanying drawings which illustrate specific embodiments of the invention.

In the drawings:

FIG. 19A is a top view of a jig used for assembling light-emitting units into a pyramid;

FIG. 19B is a top view of a jig used for assembling light-emitting units into a cylinder;

FIG. 29A shows example feeder terminals in light-emitting units and feeder unit;

FIG. 29B show the feeder terminals shown in FIG. 29A;

FIG. 29C shows a joint plate for connecting the feeder terminals shown in FIG. 29B;

FIG. 30A shows example feeder terminals in light-emitting units and feeder unit;

FIG. 30B is a side view of the feeder terminals shown in FIG. 30A;

FIGS. 30C and 30D show a method of connecting the feeder terminals shown in FIGS. 30A and 30B;

FIG. 31A shows example feeder terminals in light-emitting units and feeder unit;

FIG. 31B is a side view of the feeder terminals shown in FIG. 31A;

FIG. 31C shows a method of connecting the feeder terminals shown in FIGS. 31A and 31B;

FIG. 34 is a perspective view of a lighting apparatus that is provided with a balloon (not illustrated) filled with helium or the like;

FIG. 49A shows a light-emitting unit to which the modification (2b) of the third embodiment relates;

FIG. 49B shows a joint plate for connecting the light-emitting unit shown in FIG. 49A with another light-emitting unit of the same type;

FIG. 56B shows the state where the side of the light-emitting unit shown in FIG. 56A is set facing a side of another light-emitting unit to be connected with;

DESCRIPTION OF THE PREFERRED EMBODIMENTS (First Embodiment)

The following describes the first embodiment of the present invention by referring to drawings.

Figure 1:
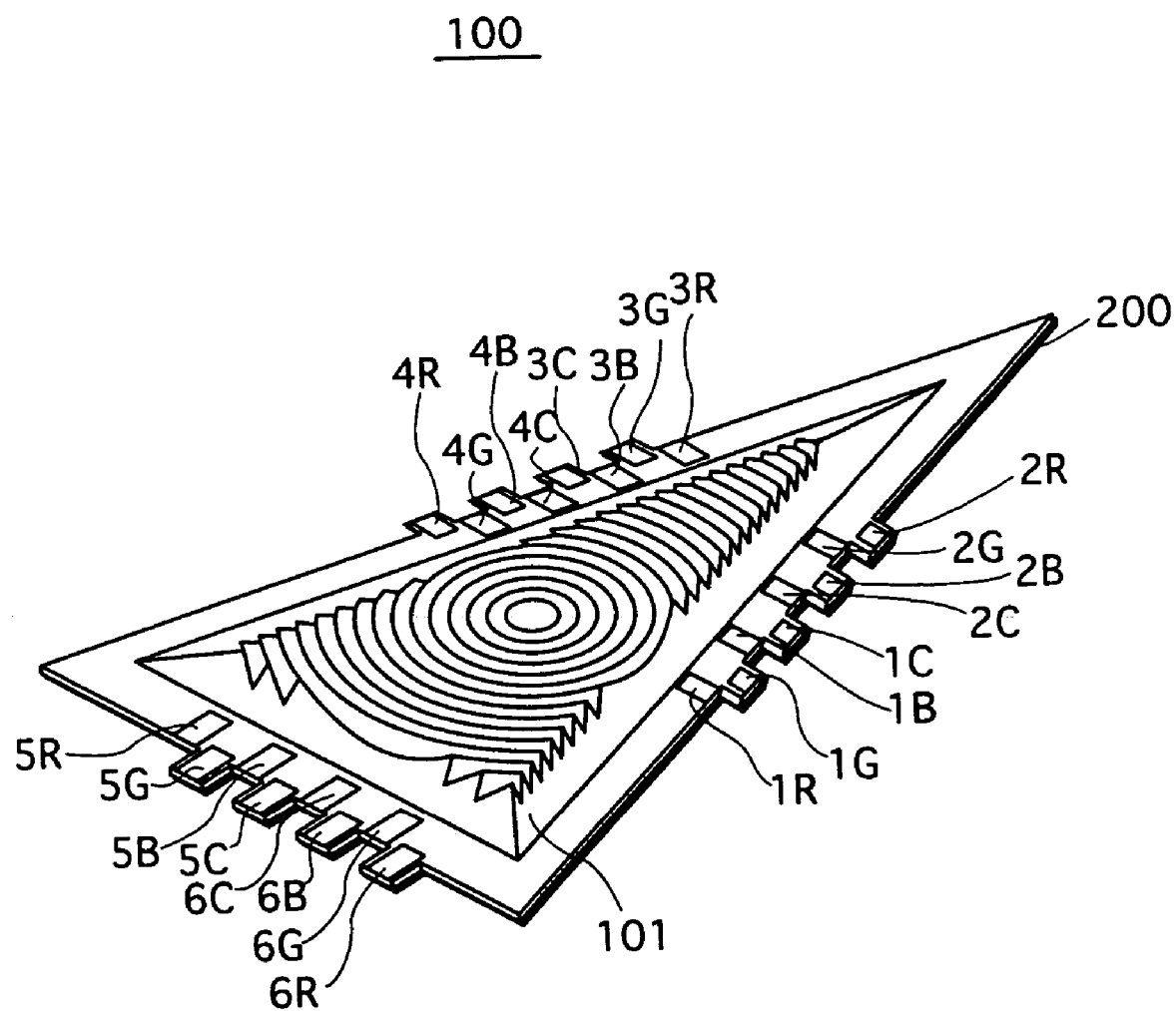
FIG. 1 is a perspective view showing an appearance of a light-emitting unit to which the first embodiment of the present invention relates.

FIG. 1 is a perspective view showing an appearance of a light-emitting unit to which the first embodiment of the invention relates. A light-emitting unit 100 is shaped like an isosceles triangular plate (sheet) The light-emitting unit 100 emits light from a main surface, using power which is supplied through any of the feeder terminals (1R–6R, 1G–6G, 1B–6B, and 1C–6C) provided on the sides of the isosceles triangle.

Figure 2:
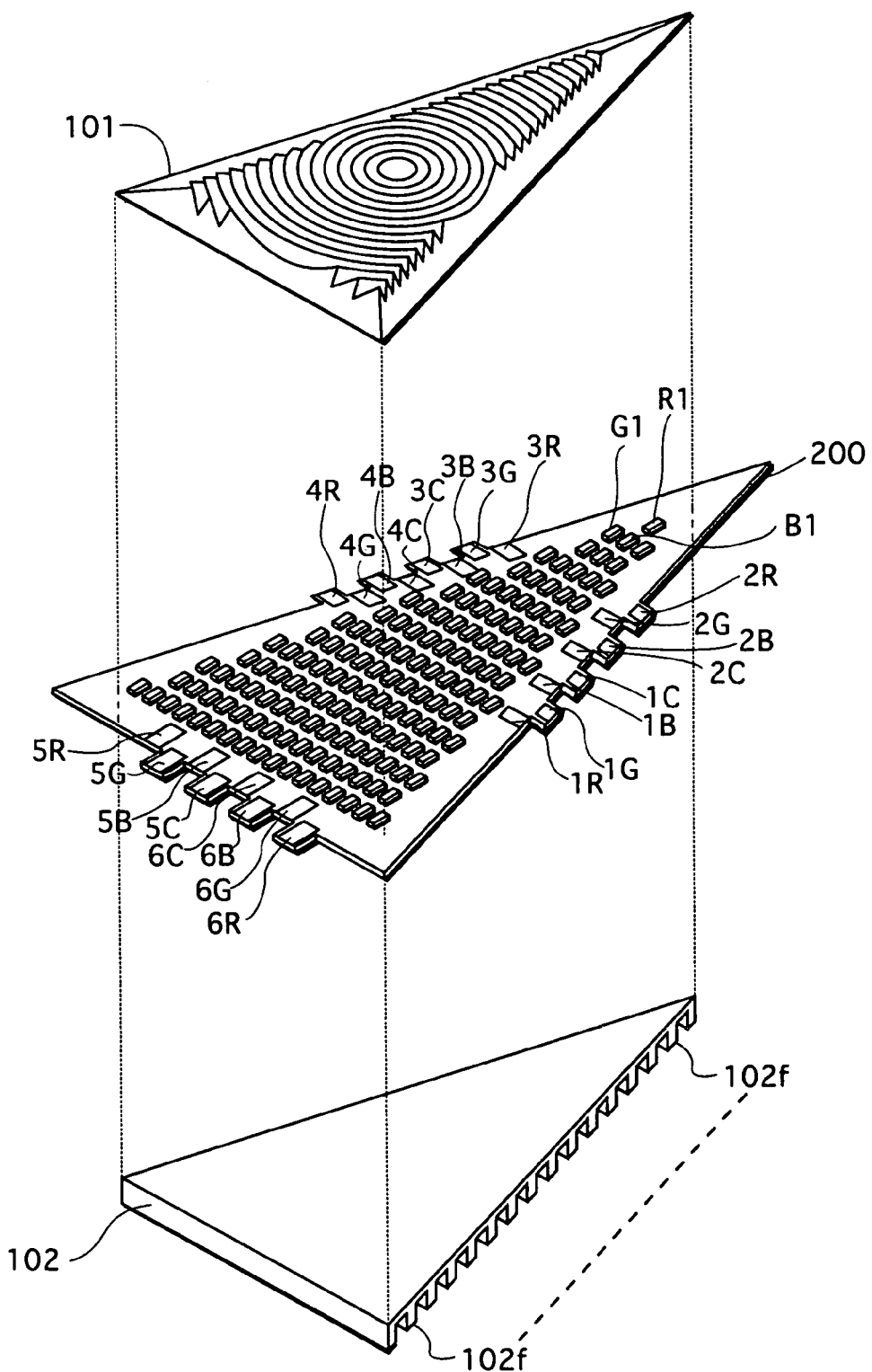
FIG. 2 is an exploded perspective view of the light-emitting unit shown in FIG. 1.

FIG. 2 is an exploded perspective view of the light-emitting unit 100.

As illustrated, the light-emitting unit 100 is roughly made up of a Fresnel lens 101, a multilayer flexible substrate (hereafter simply referred to as "multilayer substrate") 200, and a radiating plate 102 which are placed one on top of the other. The Fresnel lens 101 is formed from an epoxy resin which is a translucent material. The multilayer substrate 200 has a number of light-emitting diode bear chips (hereafter "LED chips") R1, . . . , G1, . . . , and B1, . . . which are light-emitting elements, mounted on its main surface.

The multilayer substrate 200 is formed by laminating a plurality of substrates (four substrates in the present example as shown in FIG. 4), and has flexibility. Each of the plurality of substrates is made by printing a conductor pattern on one or both surfaces of an insulating plate made of a polyimide resin.

Red, green, and blue LED chips R1, . . . , G1, . . . , and B1, . . . are disposed with frequent and regular intervals on an LED mounting area on the multilayer substrate 200.

The LED mounting area is an isosceles triangular area which is a predetermined distance inside the periphery of the multilayer substrate 200 and therefore is a size smaller than the main surface of the multilayer substrate 200. As described later, surface light emission is achieved by illuminating these LED chips substantially in bulk. The number of LED chips, and in particular the spacing of LED chips, need to be such that one can visually identify the emission of light from the LED mounting area when the LED chips are illuminated.

FIG. 3 shows structures of LED chips mounted on the multilayer substrate 200.

Figure 3A:
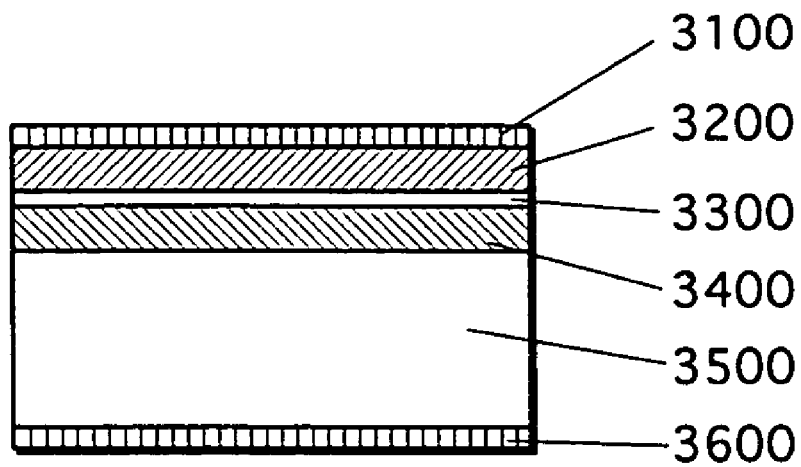
FIG. 3A shows a structure of a red LED in the light-emitting unit shown in FIG. 2.

FIG. 3A shows a structure of a red LED chip.

AlInGap is used for the red LED chip. As illustrated, an N-type AlInGaP layer 3400, an active layer 3300, and a P-type AlInGaP layer 3200 are laminated on a conductive N-type GaAs substrate 3500. Power is supplied through an anode electrode 3100 and cathode electrode 3600 which are provided at the top and bottom respectively.

Figure 3B:
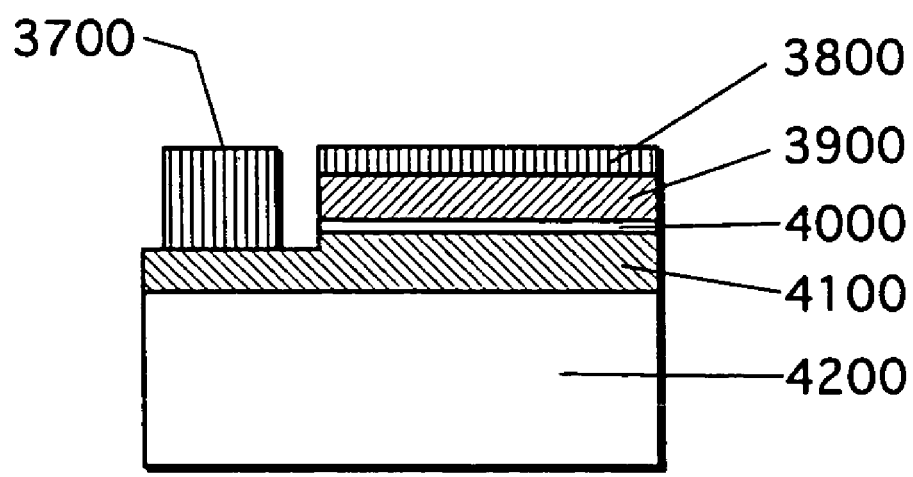
FIG. 3B shows a structure of a green LED and blue LED in the light-emitting unit shown in FIG. 2.

FIG. 3B shows a structure of a green LED chip and a blue LED chip. AlInGaN is used for the green LED chip and the blue LED chip. As illustrated, an N-type AlInGaN layer 4100, an active layer 4000, and a P-type AlInGaN layer 3900 are laminated on an insulating sapphire substrate 4200. Power is supplied through an anode electrode 3800 and a cathode electrode 3700 which are provided on the P-type layer 3900 and N-type layer 4100 respectively.

In FIG. 2, feeder terminals 1R–6R (hereafter "red terminals") are connected to the anode electrode of one of the red LED chips. Feeder terminals 1G–6G (hereafter "green terminals") are connected to the anode electrode of one of the green LED chips. Feeder terminals 1B–6B (hereafter "blue terminals") are connected to the anode electrode of one of the blue LED chips. Feeder terminals 1C–6C (hereafter "common terminals") are connected to the cathode electrode of one of the LED chips of each color. A set of eight feeder terminals made up of four pairs of these red, green, blue, and common terminals is provided on each side of the multilayer substrate 200. In this specification, components such as electrodes, terminals, and wiring patterns that relate to red, green, and blue LEDs are respectively marked with "R", "G", and "B", whereas components that are common to red, green, and blue LEDs are marked with "C".

Four out of the eight feeder terminals are provided inside the side of the multilayer substrate 200, whereas the other four feeder terminals are mainly provided on the parts of the multilayer substrate 200 which project outward in the form of squares (hereafter referred to as "projections"), though these feeder terminals extend back over the main body of the multilayer substrate 200 to some extent. The inside feeder terminals and the projected feeder terminals are arranged alternately.

When the projections are formed with a predetermined spacing in this way, the gaps between the adjacent projections can be regarded as depressions. Hence the eight feeder terminals are each placed at a different one of the alternately-formed projections and depressions.

The arrangement order of the eight feeder terminals is the same for each side of the multilayer substrate 200. Counterclockwise, the eight feeder terminals are arranged in the order of red→green→blue→common→common→blue→green→red. In otherwords, the two common terminals are positioned at the midpoint of the side, and the pair of terminals of each color are symmetrically positioned with respect to the common terminals (in this case the center of the gap between the two common terminals corresponds to the midpoint of the side).

Power is supplied from an external power supply to each LED chip through these different kinds of feeder terminals. Connections between the LED chips and the feeder terminals, and connections between the LED chips themselves are described later.

The Fresnel lens 101 is provided so as to cover the entire LED mounting area. Here, the center of the Fresnel lens 101 substantially matches the barycenter of the isosceles triangular LED mounting area. After the LED chips are mounted on the multilayer substrate 200, the Fresnel lens 101 is molded integrally with the multilayer substrate 200. This causes the epoxy resin to spread around the LED chips. Hence the Fresnel lens 101 serves as a protection cover for protecting the LED chips (bear chips). Also, an alumina powder with a particle diameter of about 100 nm (not illustrated) is uniformly mixed in the epoxy resin as a light scattering material. The alumina powder has a function of appropriately diffusing (scattering) red, green, and blue light that is emitted from the different-colored LED chips and that has directional orientations, thereby mixing the different colors. The alumina powder also has a function of letting heat generated from the LED chips escape to the outside. The mixed light is emitted from the Fresnel lens 101 in a forward direction.

The radiating plate 102 is formed from an aluminum alloy (e.g. Duralumin), and has the shape of an isosceles triangle that is substantially the same size as the LED mounting area. The surface facing the multilayer substrate 200 is flat, whereas the other surface has a fin 102f to enhance radiating effects. The radiating plate 102 is bonded to the surface of the multilayer substrate 200 which is opposite to the LED mounting surface using an insulating (nonconductive) adhesive, so as to correspond to the position of the LED mounting area (though not in direct contact with the LED mounting area).

The thicknesses of the Fresnel lens 101, multilayer substrate 200, and radiating plate 102 are 2 mm, 0.4 mm, and 1 mm respectively, so that the total thickness of the light-emitting unit 100 is about 3.4 mm.

Figure 4A:
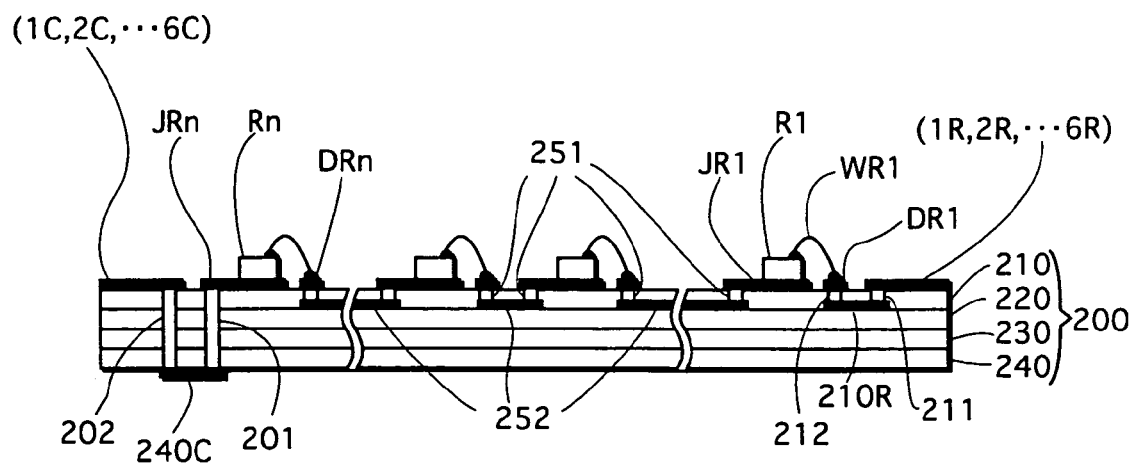
FIG. 4A shows a wiring pattern for red LEDs in a multilayer substrate that is included in the light-emitting unit shown in FIG. 2.
Figure 4B:
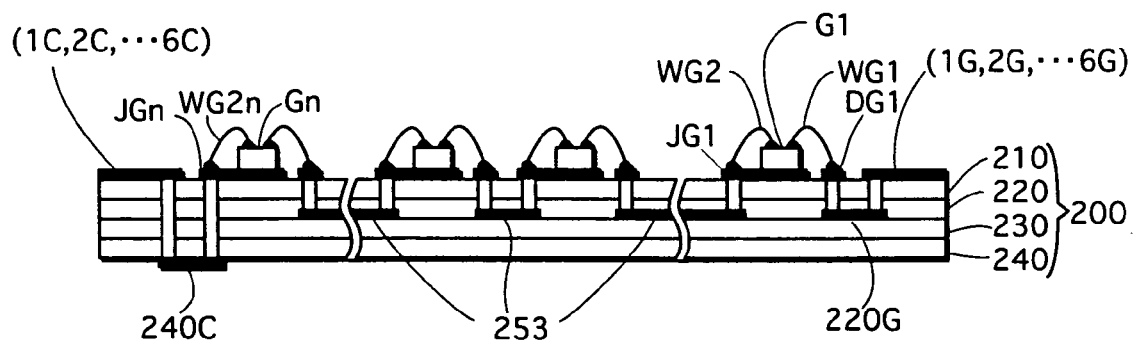
FIG. 4B shows a wiring pattern for green LEDs in the multilayer substrate in the light-emitting unit shown in FIG. 2.
Figure 4C:
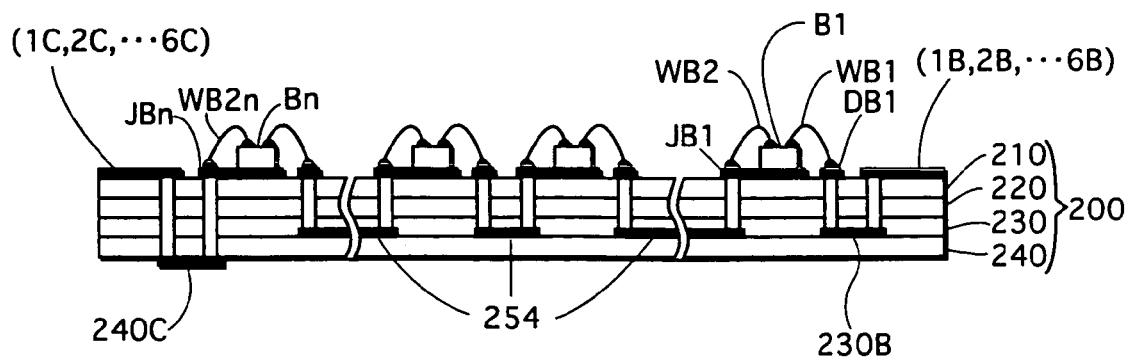
FIG. 4C shows a wiring pattern for blue LEDs in the multilayer substrate in the light-emitting unit shown in FIG. 2.
Figure 5A:
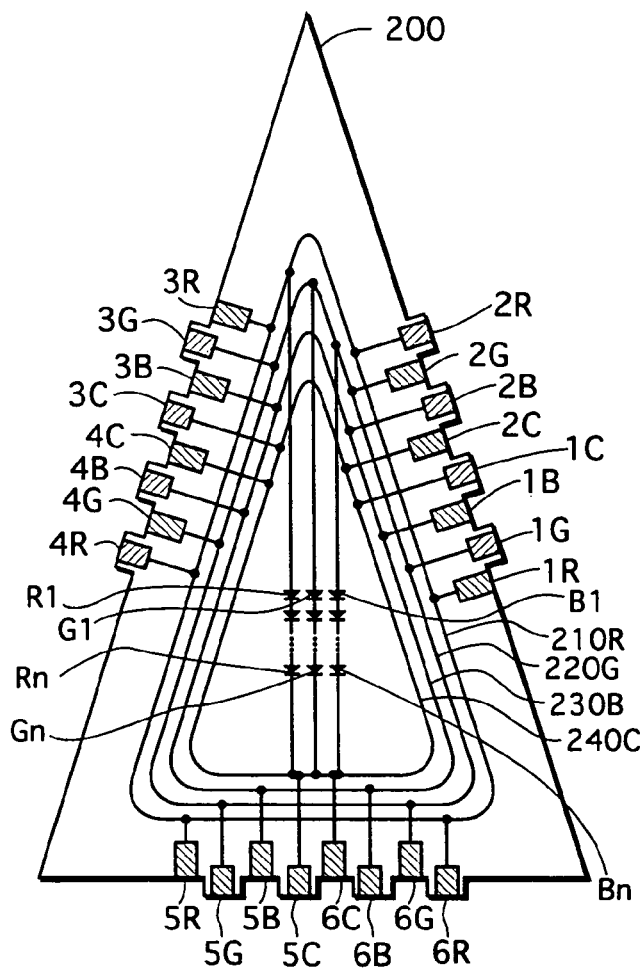
FIG. 5A is a conceptual wiring diagram showing connections between different-colored LEDs and feeder terminals on the multilayer substrate.

FIGS. 4A–4C are diagrammatic cross-sections of the multilayer substrate 200, illustrating the connections between the feeder terminals and the LED chips and the connections between the LED chips themselves. FIG. 5A is a conceptual wiring diagram showing these connections. Here, the four layers that compose the multilayer substrate 200 are referred to as a first layer 210, a second layer 220, a third layer 230, and a fourth layer 240 from top to bottom.

First, the connections of the red LED chips are explained with reference to FIG. 4A.

The red LED chips R1–Rn have their cathode electrodes soldered to mounting pads (feeder terminals) JR1–JRn formed on the first layer 210, and their anode electrodes connected to electrode pads (feeder terminals) DR1–DRn formed on the first layer 210 via bonding wires WR1–WRn.

The red LED chips R1–Rn are connected to each other in series (hereafter a set of LED chips that are connected in series is called an "LED chip train"). The electrode pad DR1 (hereafter called a "high-potential feeder terminal" in an LED chip train) which is connected to the anode electrode of the red LED chip R1 at the high-potential end of the red LED chip train is connected to a red terminal (any of the red terminals 1R–6R) formed on the first layer 210, through two vias 211 and 212 provided in the first layer 210 and a circuit pattern 210R provided on the second layer 220.

On the other hand, the mounting pad JRn (hereafter called a "low-potential feeder terminal" in an LED chip train) which is connected to the cathode electrode of the red LED chip Rn at the low-potential end of the red LED chip train is connected to a common terminal (any of the common terminals 1C–6C) formed on the first layer 210, through two through-holes 201 and 202 provided in the first to fourth layers 210–240 and a circuit pattern 240C provided beneath the fourth layer 240.

The red LED chips between the high-potential feeder terminal and the low-potential feeder terminal have their cathode and anode electrodes connected in series, through vias 251 provided in the first layer 210 and circuit patterns 252 provided on the second layer 220.

The circuit pattern (hereafter a "high-potential circuit pattern") 210R is provided on the second layer 220 to connect the anode electrode of the high-potential red LED chip R1 and the red terminal (any of 1R–6R). Likewise, the circuit pattern (hereafter a "low-potential circuit pattern") 240C is provided beneath the fourth layer 240 to connect the cathode electrode of the low-potential red LED chip Rn and the common terminal (any of 1C–6C). As shown in FIG. 5A, the high-potential circuit pattern 210R and the low-potential circuit pattern 240C are formed in isosceles triangle along the sides of the multilayer substrate 200. The high-potential circuit pattern 210R is connected to all red terminals 1R–6R provided on the three sides of the multilayer substrate 200, through the vias formed in the first layer 210. Meanwhile, the low-potential circuit pattern 240C is connected to all common terminals 1C–6C provided on the three sides of the multilayer substrate 200, through the through-holes formed in the multilayer substrate 200.

The connections of the green LED chips G1–Gn and the connections of the blue LED chips B1–Bn are shown in FIGS. 4B and 4C, respectively. As illustrated, these connections differ with those of the red LED chips R1–Rn in the following two points.

(1) The cathode electrodes are connected to mounting pads JG1–JGn and JB1–JBn formed on the first layer 210, through bonding wires WG1–WG2n and WB1–WB2n respectively.

(2) A high-potential circuit pattern 220G for connecting an anode electrode at the high-potential end of the green LED chip train to a green terminal and circuit patterns 253 for connecting the green LED chips in series are provided on the third layer 230, and a high-potential circuit pattern 230B for connecting an anode electrode at the high-potential end of the blue LED chip train to a blue terminal and circuit patterns 254 for connecting the blue LED chips in series are provided on the fourth layer 240.

Otherwise, the connections of the green LED chips G1–Gn and the connections of the blue LED chips B1–Bn are the same as those of the red LED chips R1–Rn, so that their further explanation has been omitted here.

The multilayer substrate 200 having the above circuit patterns and vias can be fabricated using a buildup method. In the buildup method, a circuit pattern is formed by applying copper foil to a polyimide resin insulating plate and removing unwanted parts by etching. Also, a via is formed by making a hole in the insulating plate using a laser and filling it with a copper paste. Such processed insulating plates are laminated to form the multilayer substrate 200.

Here, at least one current limiter diode may be inserted in series in each LED chip train, to prevent the LED chips from being damaged by overcurrent.

Figure 5B:
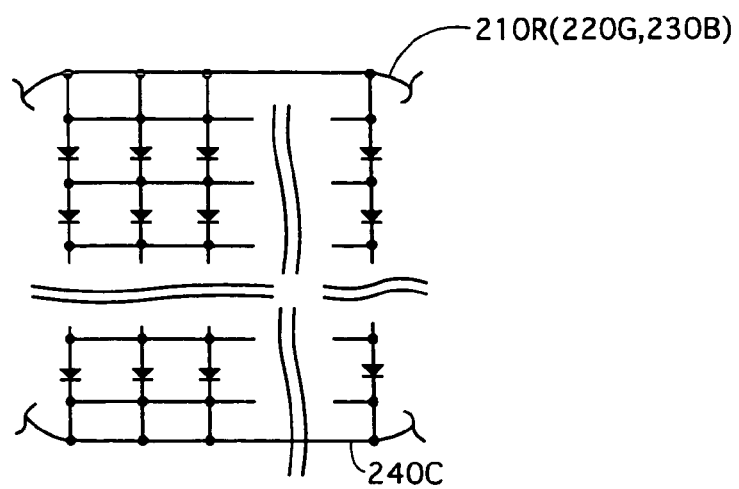
FIG. 5B shows another example of the connections between LEDs shown in FIG. 5A.

Though the LED chips of the same color are connected in series in the above example, they may be connected in series-parallel as shown in FIG. 5B. In doing so, even when part of the wiring pattern is broken, only one LED chip corresponding to the broken part fails to illuminate. Also, even when one LED chip is damaged and ceases conduction, that LED chip alone fails to illuminate. Hence the problem of all LED chips failing to illuminate can be avoided.

As mentioned above, the feeder terminals, namely, the red terminals 1R–6R, the green terminals 1G–6G, the blue terminals 1B–6B, and the common terminals 1C–6C, are provided on the three sides of the multilayer substrate 200 in the light-emitting unit 100. Also, the circuit patterns (the high-potential circuit patterns 210R, 220G, and 230B and the low-potential circuit pattern 240C) which serve to connect in parallel the four pairs of feeder terminals (the pair of red terminals, the pair of green terminals, the pair of blue terminals, and the pair of common terminals) on each side of the multilayer substrate 200 respectively to the high-potential feeder terminals DR1, DG1, and DB1 and the low-potential feeder terminals JRn, JGn, and JBn of the red, green, an&blue LED chip trains are provided on the first to fourth layers 210–240. Accordingly, the LED chips can be illuminated by supplying power through any feeder terminal on any side of the multilayer substrate 200.

The following explains a method of connecting light-emitting units 100 that have the above construction.

FIG. 6 shows an example connection of light-emitting units 100. In FIG. 6 and the subsequent drawings, only the parts of light-emitting units and the like which require explanation are illustrated and the other parts are omitted.

Figure 6A:
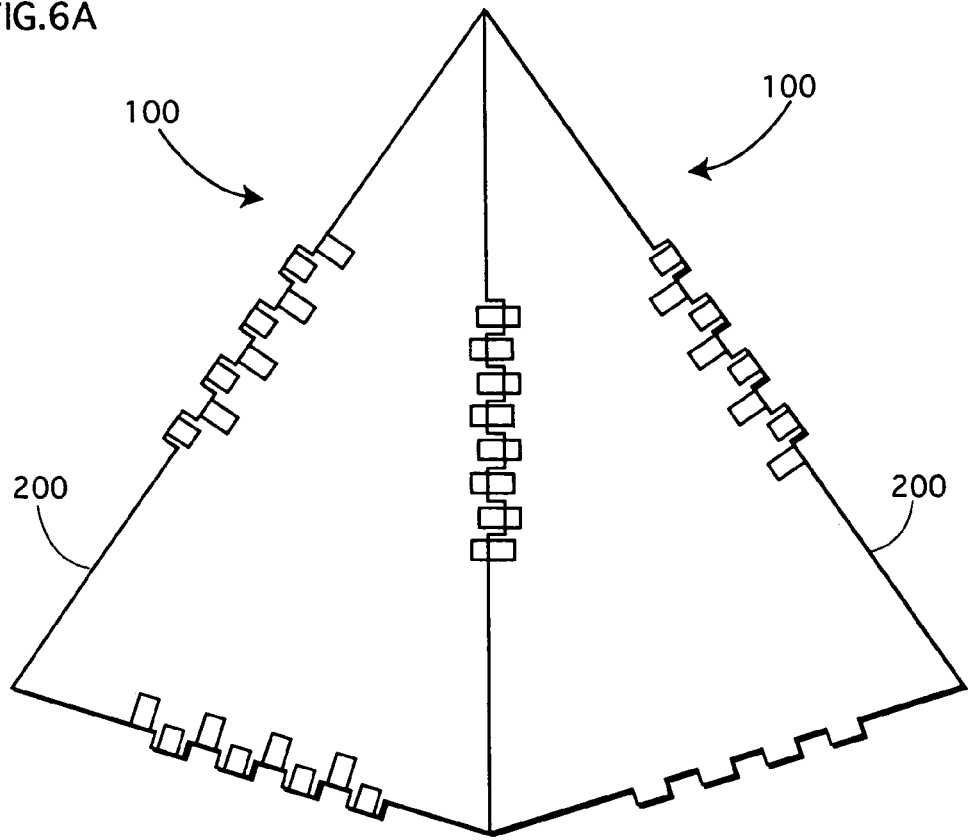
FIG. 6A shows an example combination of light-emitting units.

In FIG. 6A, two substantially isosceles triangular light-emitting units 100 are connected with their vertexes pointing in the same direction and their equal sides being butted against each other.

Figure 6B:
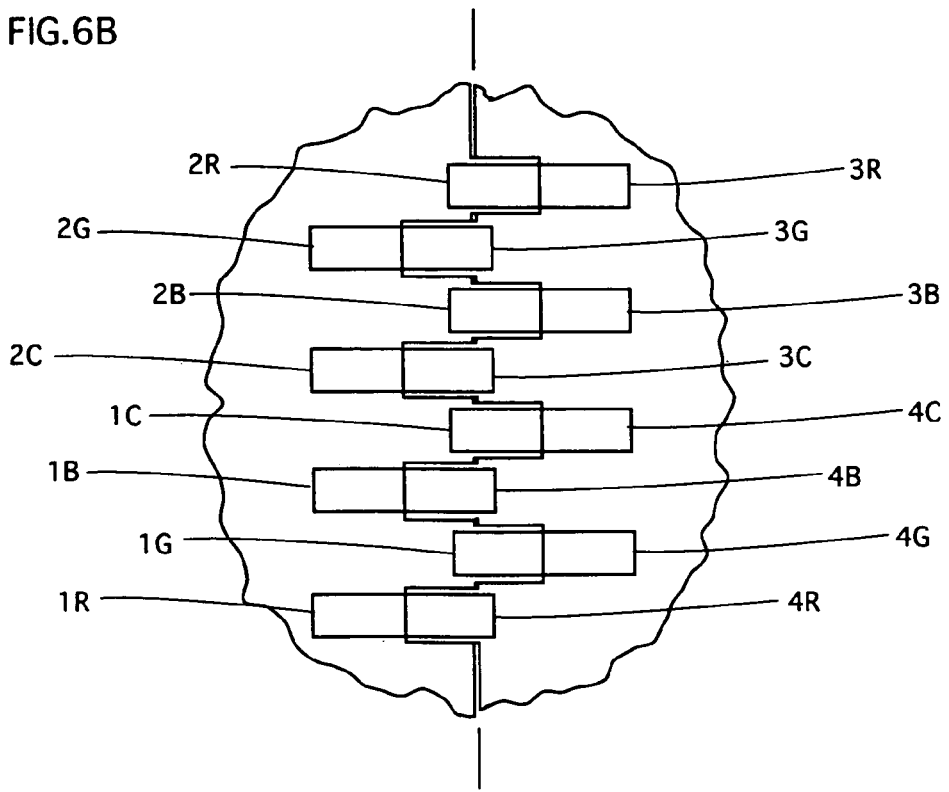
FIG. 6B is an expanded view of the connecting parts of the light-emitting units shown in FIG. 6A.

First, the projections of the multilayer substrate 200 of one light-emitting unit 100 on which feeder terminals are formed are placed over the LED mounting surface of the multilayer substrate 200 of the other light-emitting unit 100. As a result, the corresponding feeder terminals on the equal sides of the two light-emitting units 100, namely, the red terminals (1R and 4R, 2R and 3R), the green terminals (1G and 4G, 2G and 3G), the blue terminals (1B and 4B, 2B and 3B), and the common terminals (1C and 4C, 2C and 3C) partially overlap each other, as shown in FIG. 6B. This being so, the overlapping feeder terminals are bonded by soldering. This enables the two light-emitting units 100 to be connected both electrically and mechanically.

In such connected light-emitting units 100, the corresponding LED chip trains, i.e. the two red LED chip trains, the two green LED chip trains, and the two blue LED chip trains are connected in parallel. Since the feeder terminals on each side of the multilayer substrate 200 are connected to the LED chip trains in parallel as explained above, the LED chips of both light-emitting units 100 can be illuminated when power is supplied through any feeder terminal which does not relate to the connection of the two light-emitting units 100 (or even through any feeder terminal which relates to the connection of the two light-emitting units 100).

As noted above, the multilayer substrate 200 has flexibility. This allows the above connected light-emitting units 100 to be bent at the connecting parts. Accordingly, if four more light-emitting units 100 are connected to the light-emitting units 100 shown in FIG. 6A in the same way and the connecting parts of the adjacent light-emitting units 100 are bent with the LED mounting surfaces facing outward, a hexagonal pyramidal lighting apparatus 70 shown in FIG. 7 can be obtained. Here, a feeder unit 300 for supplying power to each light-emitting unit 100 is provided at the bottom face of the hexagonal pyramid. This feeder unit 300 is described in detail later.

Figure 8:
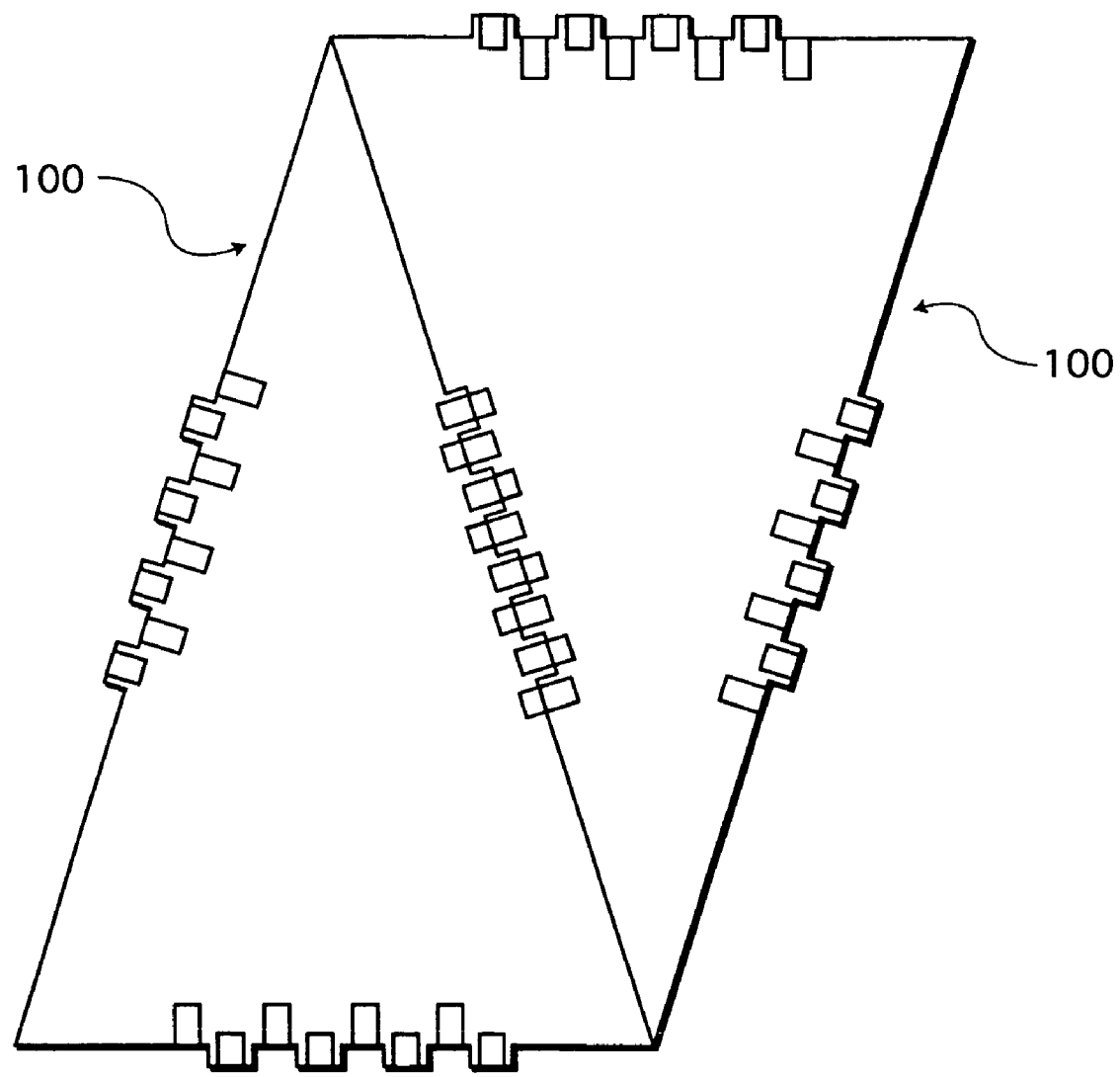
FIG. 8 shows an example combination of light-emitting units.

Also, two substantially isosceles triangular light-emitting units 100 may be connected with their vertexes pointing in the opposite directions and their equal sides being butted against each other, as shown in FIG. 8. If ten more light-emitting units 100 are connected to the light-emitting units 100 shown in FIG. 8 in the same way and the connecting parts are bent so that the LED mounting surfaces face outward, a cylindrical lighting apparatus 90 shown in FIG. 9 can be obtained. The feeder unit 300 is provided at one open end of the cylinder.

Figure 10:
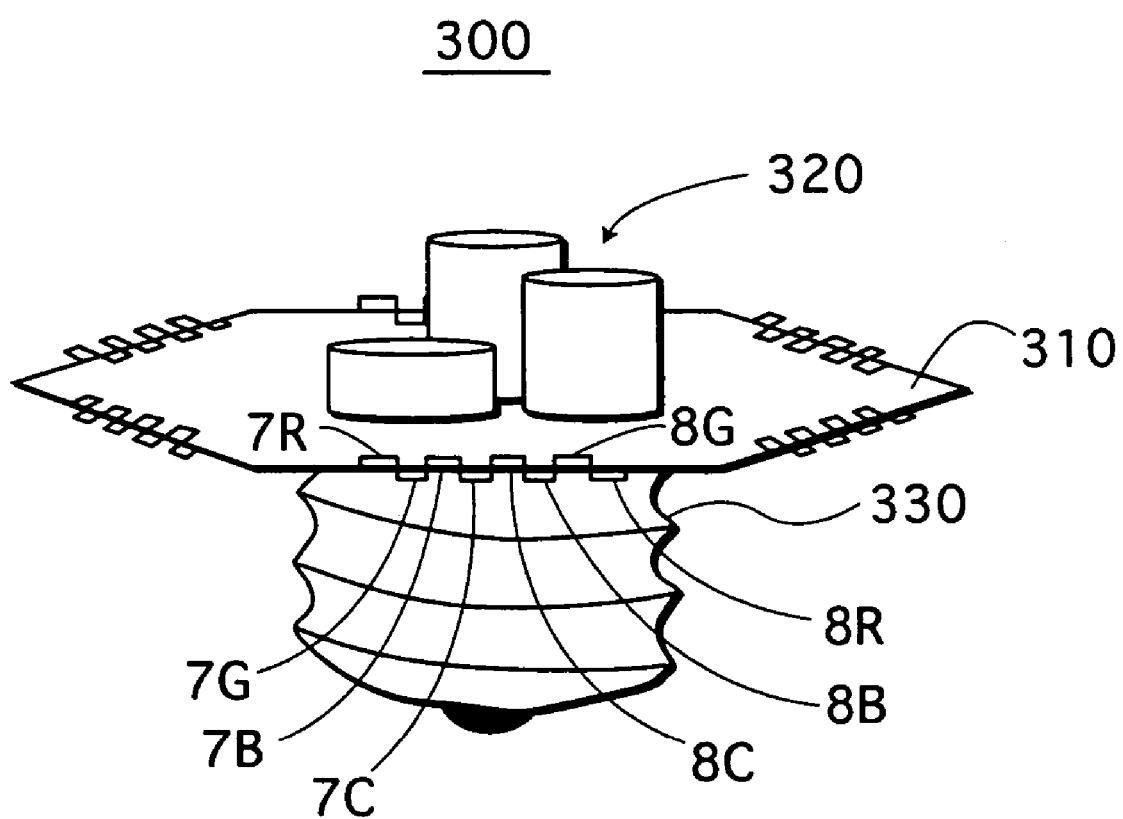
FIG. 10 is a perspective view showing an appearance of a feeder unit used for the lighting apparatuses.

FIG. 10 is a perspective view showing a rough outer construction of the feeder unit 300.

As illustrated, the feeder unit 300 is equipped with a multilayer substrate 310, a drive unit 320, and a base 330. The drive unit 320 is provided on one surface of the multilayer substrate 310. The base 330 is provided on the other surface of the multilayer substrate 310, and is similar to those used in typical illumination bulbs.

Figure 11:
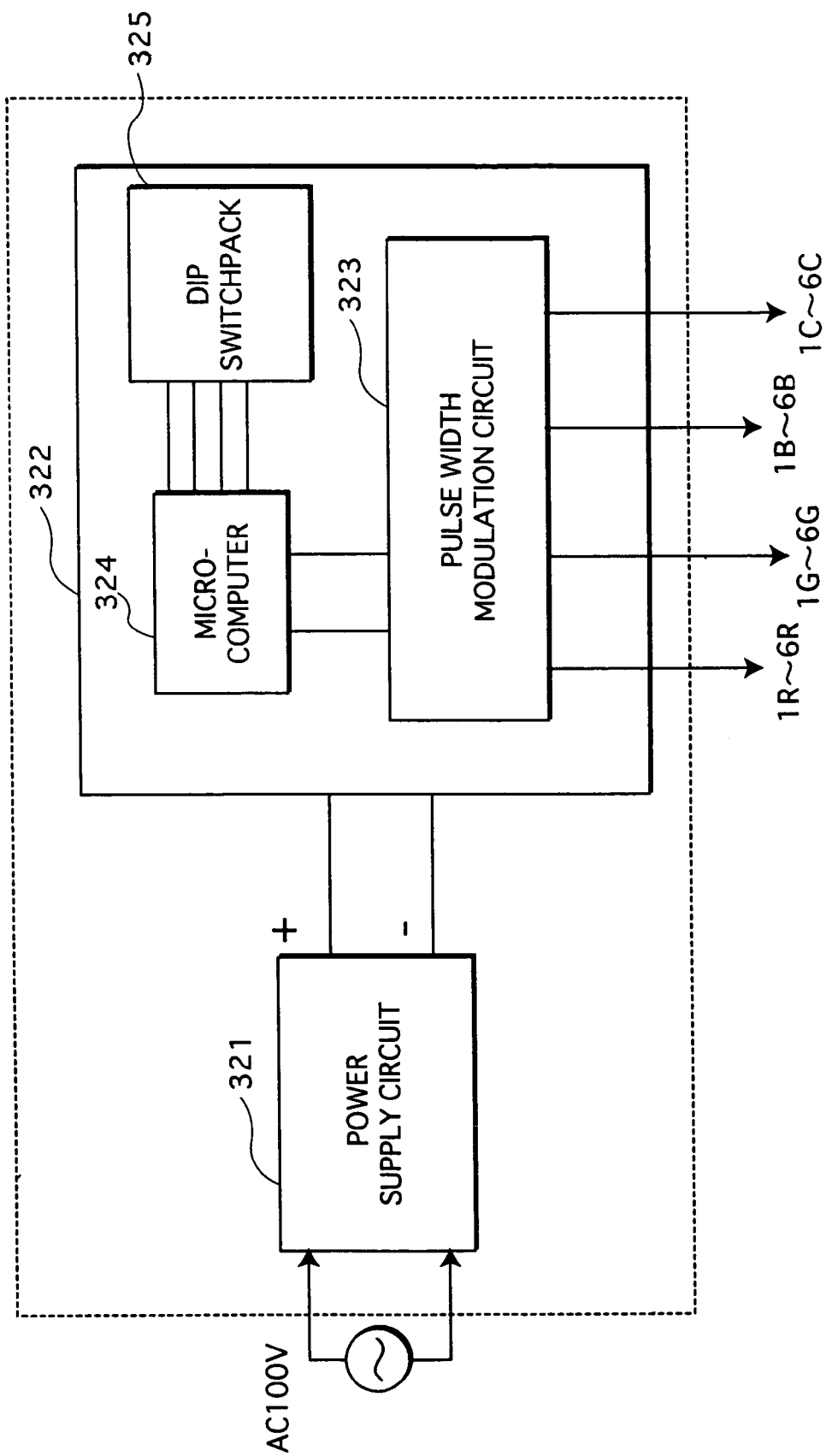
FIG. 11 is a block diagram of a drive circuit in the feeder unit shown in FIG. 10.

FIG. 11 is a circuit block diagram showing a rough construction of the drive unit 320.

As shown in the drawing, the drive unit 320 includes a power supply circuit 321 and a control circuit 322. The control circuit 322 includes a pulse width modulation circuit 323, a microcomputer 324, and a DIP switchpack 325.

Alternating current power supplied through the base 330 is full-wave rectified and smoothed in the power supply circuit 321, pulse-width modulated in the pulse width modulation circuit 323, and supplied alternately to the LED chip trains of the colors of red, green, and blue. Here, the pulse period is 45 kHz. By changing the pulse duty for each color, the color mixture of red, green, and blue can be varied. This enables light of an extensive color variation to be realized. Since the pulse period of 45 kHz is very short, it appears to the human eye that the different-colored LED chips illuminate simultaneously.

The pulse duty in the pulse width modulation circuit 323 is controlled by the microcomputer 324. The DIP switchpack 325 for changing the pulse duty is connected to the microcomputer 324. The pulse duties corresponding to the different settings of the DIP switchpack 325 have been stored in the microcomputer 324 beforehand. When the DIP switchpack 325 is switched, the microcomputer 324 controls the pulse width modulation circuit 323 to perform pulse-width modulation according to a pulse duty corresponding to the switched settings of the DIP switchpack 325.

In FIG. 10, feeder terminals 7R, 7G, 7B, 7C, 8C, 8B, 8G, 8R, . . . , which are similar to those provided on each side of the light-emitting unit 100, are provided on each side of the substantially regular hexagonal multilayer substrate 310 of the feeder unit 300 (the reference numerals are given only to one side of the multilayer substrate 310 in FIG. 10 for simplicity's sake). The multilayer substrate 310 of the feeder unit 300 basically has the same construction as the multilayer substrate 200 of the light-emitting unit 100, except for their difference in plan view. In detail, the arrangement order of the feeder terminals is the same on each side of the multilayer substrate 310. Counterclockwise, the eight feeder terminals are arranged in the order of red→green→blue→common→common→blue→green→red, with the two common terminals being positioned at the midpoint of each side. Also, the corresponding terminals (e.g. the two red feeder terminals) on the same side are connected in parallel by a circuit pattern (not illustrated) formed on the multilayer substrate 310. Red, green, blue, and common feeder terminals (not illustrated) of the pulse width modulation circuit 323 are connected respectively to the red, green, blue, and common terminals on the multilayer substrate 310.

In the above example, the feeder unit 300 which is integrally formed from the base 330, the multilayer substrate 310, and the drive unit 320 is connected to an assembly of a plurality of light-emitting units 100, but the invention should not be limited to such. For instance, the multilayer substrate 310 may be separated from the feeder unit 300, with the multilayer substrate 310 and the remaining parts of the feeder unit 300 being connected to each other by an electric wire respectively as a feeder unit plate and an external power supply. In such a case, a cord with a plug may be used instead of the base, which is to be connected to a commercial power supply. In this way, the usage range (locations) of the lighting apparatus can be widened.

A method of connecting such a feeder unit 300 with a light-emitting unit 100 is fundamentally the same as the above method of connecting a light-emitting unit 100 with another light-emitting unit 100, so that its explanation has been omitted here.

A connection construction between two light-emitting units or between a light-emitting unit and a feeder unit (including the construction of the feeder unit) is not limited to above. For example, the following constructions are possible.

Figure 12A:
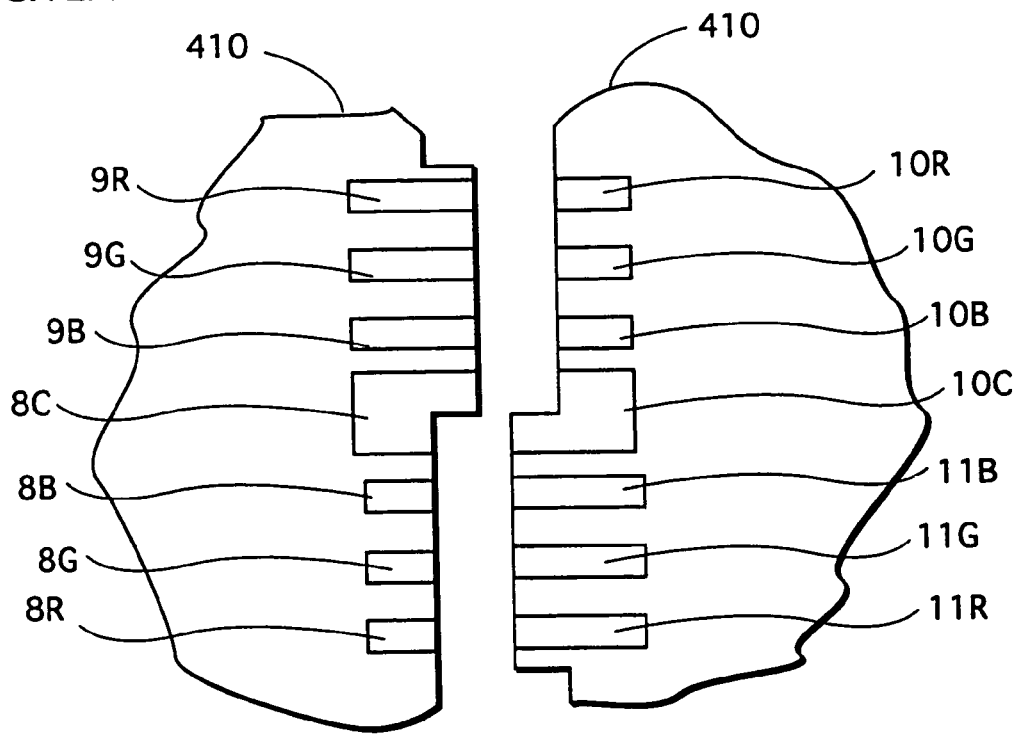
FIG. 12A shows example feeder terminals in light-emitting units and feeder unit.

(1) FIG. 12A shows the facing sides of two multilayer substrates 410. A wide projection is formed on each side. A common terminal 8C (10C) is formed across the difference in level caused by the projection, and the other feeder terminals of the three colors are symmetrically arranged with respect to the common terminal 8C (10C).

Figure 12B:
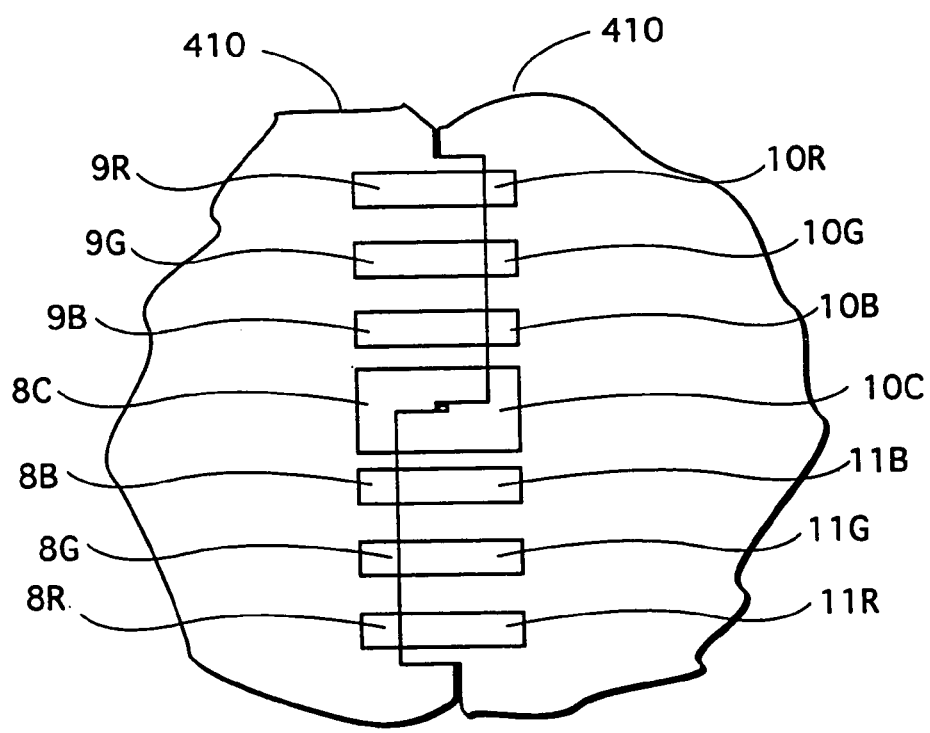
FIG. 12B shows the state where the feeder terminals shown in FIG. 12A have been combined.

As shown in FIG. 12B, the projection of one multilayer substrate 410 is placed over the other multilayer substrate 410, and the corresponding terminals are soldered to connect the two multilayer substrates 410.

Figure 13A:
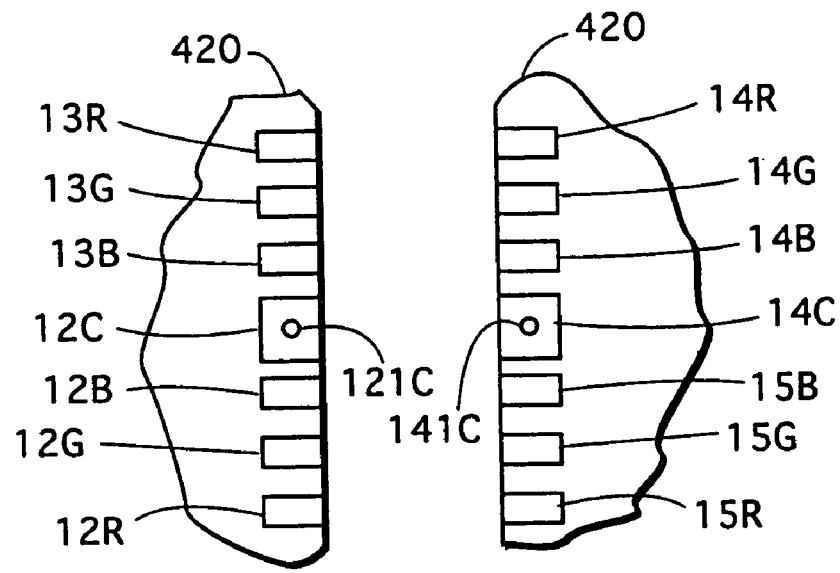
FIG. 13A shows example feeder terminals in light-emitting units and feeder unit.

(2) FIG. 13A shows the facing sides of two multilayer substrates 420. Feeder terminals 12R, 12G, 12B, 12C, 13B, 13G, and 13R (14R, 14G, 14B, 14C, 15B, 15G, and 15R) are placed on each straight side which has no projections. Here, the common terminal 12C (14C) is placed at the midpoint of the side, with the other feeder terminals of the three colors being symmetrically arranged with respect to the common terminal 12C (14C) Also, a depression 121C (141C) is formed at the center of the common terminal 12C (14C).

Figure 13B:
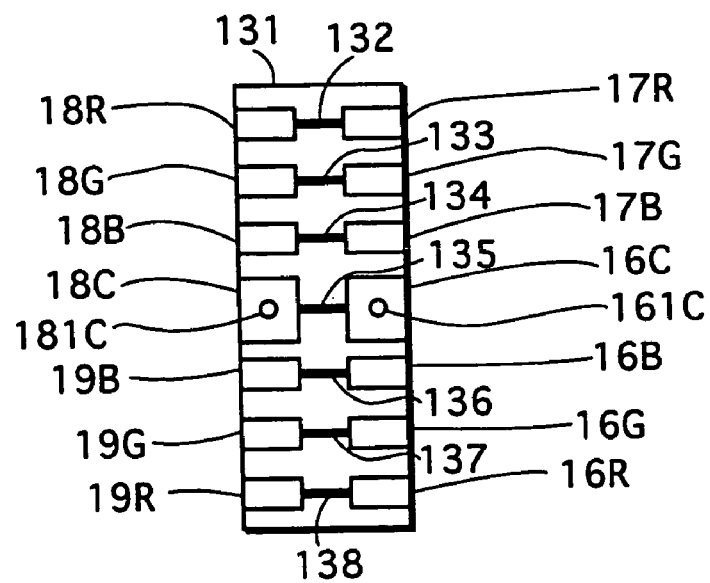
FIG. 13B shows a joint plate for connecting the feeder terminals shown in FIG. 13A.

FIG. 13B shows a joint plate 130 for connecting these multilayer substrates 420. The joint plate 130 is formed by printing a conductor pattern (described later) on one surface of an insulating flexible plate (hereafter simply referred to as a "flexible plate") 131 made of a polyimide resin, and has flexibility. The flexible plate 131 has a rectangular shape. A train of connector electrodes 16R, 16G, . . . , and 17R and a train of connector electrodes 18R, 18G, . . . , and 19R are formed along the longitudinal sides of the flexible plate 131, in the same pattern as the multilayer substrate 420. The opposite connector electrodes are connected by pattern wires 132–138. Also, projections 161C and 181C are formed respectively in the terminals 16C and 18C at the middle of the longitudinal sides.

Though not shown in FIGS. 13A and 13B, bumps are provided on the surfaces of the feeder terminals of the multilayer substrates 420 and the surfaces of the connector electrodes of the joint plate 130.

FIG. 14 shows how to connect the two multilayer substrates 420 using the joint plate 130.

Figure 14A:
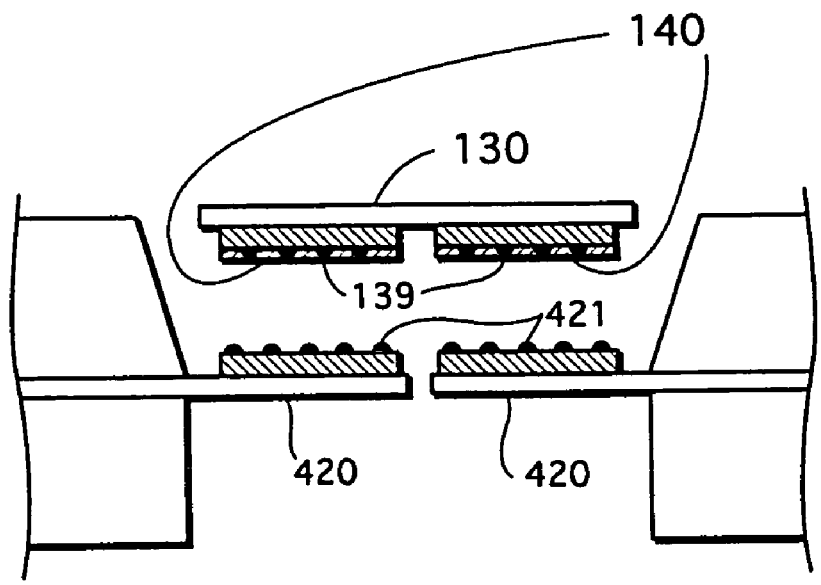
FIGS. 14A and 14B show a method of connecting the feeder terminals shown in FIG. 13A using the joint plate shown in FIG. 13B.

First, the multilayer substrates 420 are positioned so that the feeder terminals face upward and the corresponding feeder terminals oppose each other. As shown in FIG. 14A, the joint plate 130 whose connector electrodes are coated with a thermosetting adhesive 140 is placed on top of the feeder terminals with the connector electrodes facing downward. Here, the projections 161C and 181C of the connector electrodes are engaged with the depressions 121C and 141C of the feeder terminals. In this way, the joint plate 130 is kept from displacements.

Figure 14B:
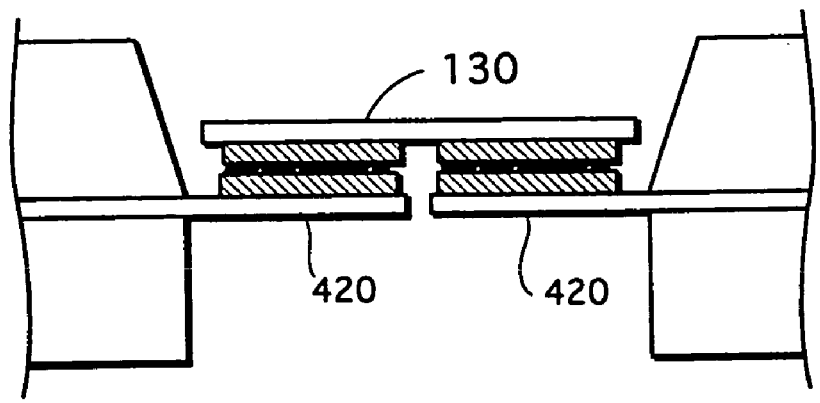

As shown in FIG. 14B, the joint plate 130 is pressed against the multilayer substrates 420 to bond them together, and the result is heated to cure the adhesive 140. As a result, the bumps 139 and 421 are crushed against each other to electrically connect the multilayer substrates 420 and the joint plate 130. The multilayer substrates 420 are also securely bonded by the adhesive 140.

(3) FIG. 15 shows an example where a joint plate 150 is used as in (2) but sheet fasteners called Multilock (Multilock is a trademark of Kuraray Co., Ltd) are used for connector electrodes 151 of the joint plate 150 and feeder terminals 152 of multilayer substrates. The patterns of the feeder terminals 152 and connector electrodes 151 are the same as those in (2). Mushroom-shaped components of the Multilock fasteners, which are formed from a synthetic resin such as a polyimide, have their surfaces plated with a high conductive metal (e.g. gold or copper).

The use of the conductive sheet fasteners for the feeder terminals 152 and the connector electrodes 151 makes it easy to disconnect the two multilayer substrates. As a result, it becomes easy, for example, to disassemble the lighting apparatus 90 shown in FIG. 9 and reassemble the light-emitting units 100 to form the lighting apparatus 70 shown in FIG. 7.

In the example shown in FIG. 15, the connector electrodes (conductive sheet fasteners) connected to one multilayer substrate and the connector electrodes connected to the other multilayer substrate are separately provided. As an alternative, longer conductive sheet fasteners may be used as connector electrodes to connect the corresponding feeder terminals of the two multilayer substrates.

(4) The above examples have a construction in which one or two common terminals are provided at the midpoint of each side and each pair of same-color feeder terminals are symmetrically provided with respect to the common terminals (so that the total number of feeder terminals is seven or eight). In the present example, the number of feeder terminals is reduced.

Figure 16A:
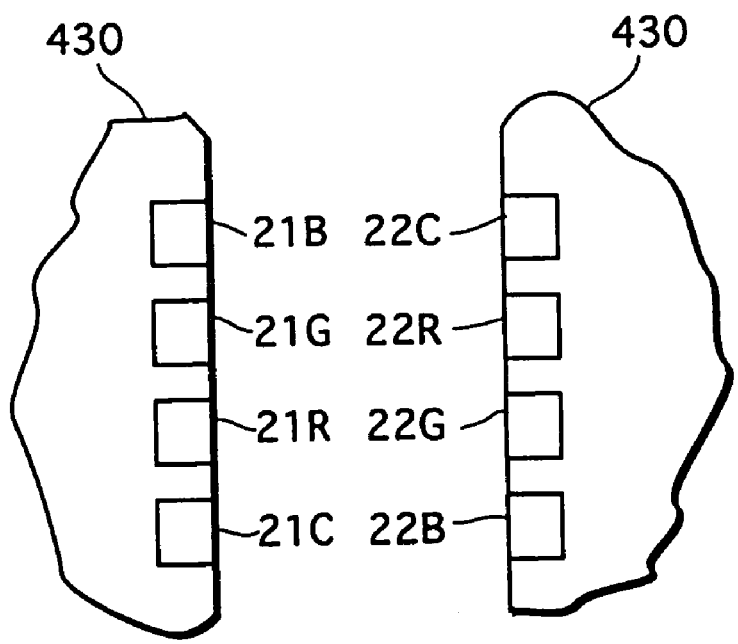
FIG. 16A shows example feeder terminals in light-emitting units and feeder unit.

FIG. 16A shows the facing sides of two multilayer substrates 430. Four feeder terminals are provided on each side, namely, a common terminal 21C (22C), a red terminal 21R (22R), a green terminal 21G (22G), and a blue terminal 21B (22B). The arrangement order of these feeder terminals is common red→green→blue, counterclockwise.

Figure 16B:
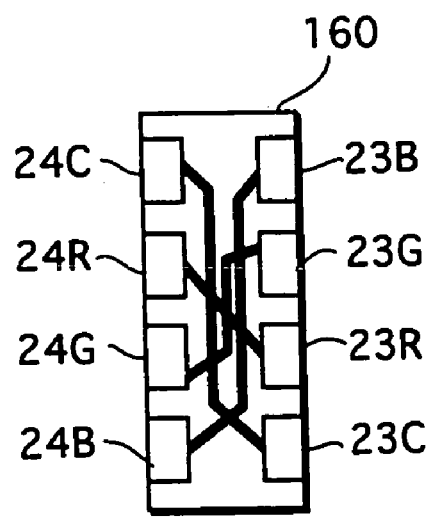
FIG. 16B shows a joint plate for connecting the feeder terminals shown in FIG. 16A.

To connect these two multilayer substrates 430, a joint plate 160 shown in FIG. 16B is used. FIG. 16B is a conceptual diagram showing a wiring pattern in the joint plate 160.

The joint plate 160 is a multilayer substrate formed from at least three insulating plates made of a polyimide resin. As illustrated, connector electrodes 23C, 23R, 23G, 23B, 24C, 24R, 24G, and 24B are formed on the top plate. These connector electrodes on the opposite sides are cross-connected by interlayer wiring or the like.

Though not illustrated, bumps are formed on the surfaces of the feeder terminals and connector electrodes.

A method of connecting the multilayer substrates 430 using the joint plate 160 is the same as that shown in FIG. 14, so that its explanation has been omitted. In this example, a projection and a depression may be provided to a feeder terminal and a connector electrode which oppose each other at the time of connection, to engage them together.

(5) FIG. 17 shows an example where four feeder terminals are provided on the facing sides of two multilayer substrates 440, as in the case of (4).

Figure 17A:
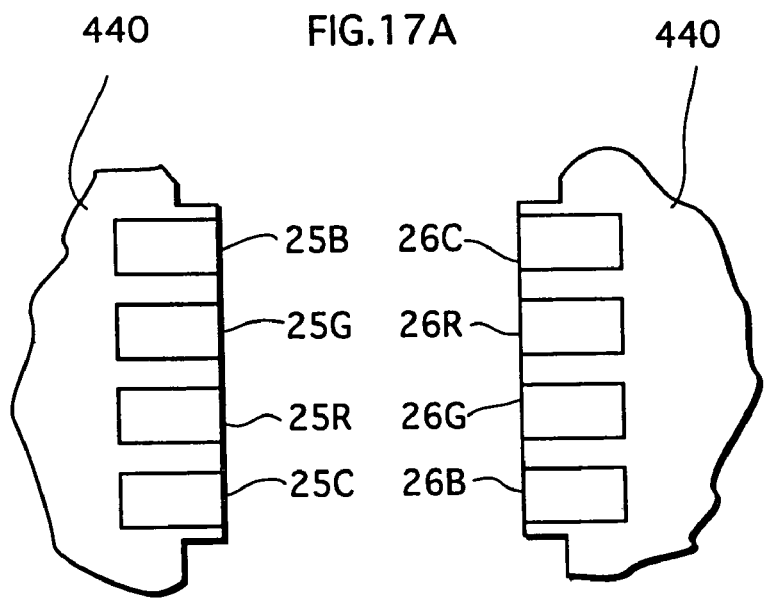
FIG. 17A shows example feeder terminals in light-emitting units and feeder unit.

FIG. 17A shows the facing sides of the two multilayer substrates 440. A wide projection is provided on each side, and feeder terminals 25C, 25R, 25G, and 25B (26C, 26R, 26G, and 26B) are formed on the projection. The arrangement order of the feeder terminals are the same as (4). The same feeder terminals are formed on the opposite surface of each multilayer substrate 440, though not shown in the drawing.

Figure 17B:
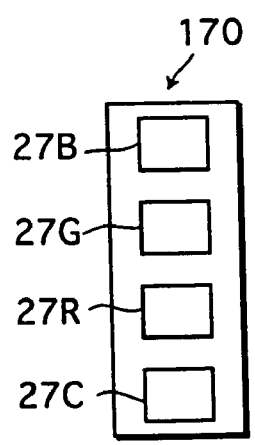
FIG. 17B is a front view of a joint plate for connecting the feeder terminals shown in FIG. 17A.
Figure 17C:
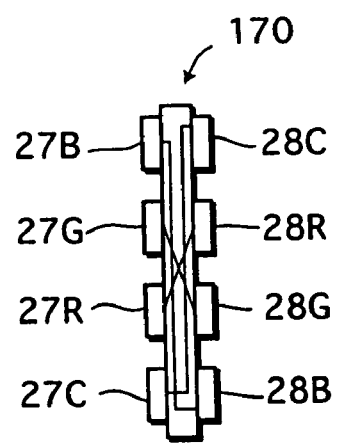
FIG. 17C is a side view of the joint plate shown in FIG. 17B.

FIG. 17B is a front view of a joint plate 170 for connecting the two multilayer substrates 440, whereas FIG. 17C is a side view (conceptual wiring diagram) of the joint plate 170. The joint plate 170 has a construction in which connector electrodes 27C, 27R, 27G, and 27B are formed on one surface of a multilayer substrate and connector electrodes 28C, 28R, 28G, and 28B are formed on the other surface of the multilayer substrate. The connector electrodes of the opposite surfaces are cross-connected by interlayer wiring, as shown in FIG. 17C.

Figure 17D:
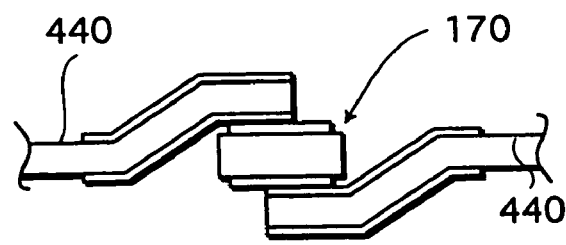
FIG. 17D shows the state where two light-emitting units have been connected using the joint plate shown in FIGS. 17B and 17C.

FIG. 17D shows how to connect the multilayer substrates 440 using the joint plate 170. The multilayer substrates 440 are bent as shown in the drawing, and the joint plate 170 is sandwiched by the bent multilayer substrates 440. In this state, the feeder terminals are soldered to the corresponding connector electrodes.

(6) FIG. 18 shows an example where four feeder terminals are provided on each side of a surface of a multilayer substrate as in the case of (4) and (5). This example, however, does not need a joint plate to connect two multilayer substrates.

Figures 18A, 18B, 18C, 18D:
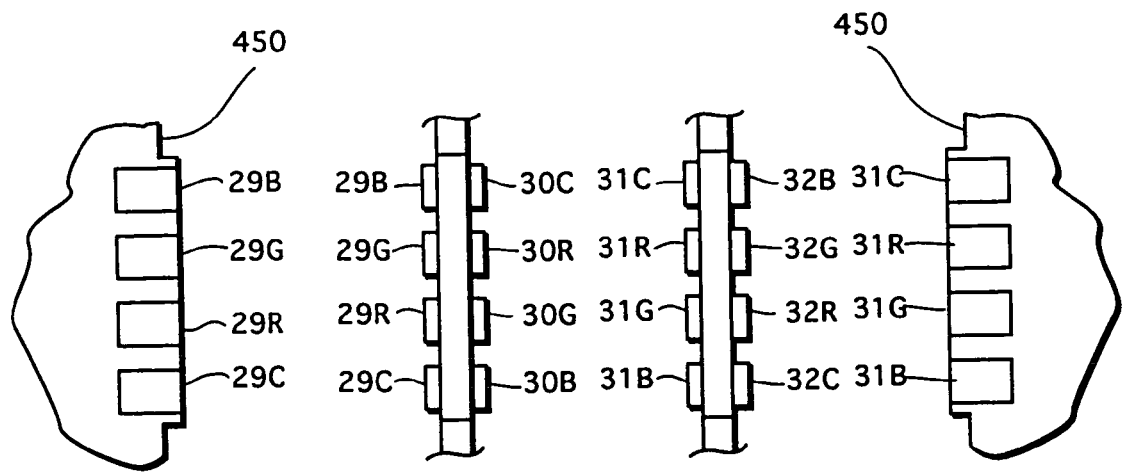
FIGS. 18A and 18B show example feeder terminals in light-emitting units and feeder unit.
FIG. 18C is a right side view of FIG. 18A.
FIG. 18D is a left side view of FIG. 18B.

FIGS. 18A and 18B show the facing sides of two multilayer substrates 450. A wide projection is provided on each side, and feeder terminals 29C, 29R, 29G, and 29B (31C, 31R, 31G, and 31B) are formed on the projection. The arrangement order of the feeder terminals is the same as (4) and (5).

FIGS. 18C and 18D are respectively a right side view of FIG. 18A and a left side view of FIG. 18B. As illustrated, feeder terminals 30B, 30G, 30R, and 30C (32B, 32G, 32R, and 32C) are formed on the opposite surface at the positions corresponding to the feeder terminals 29C, 29R, 29G, and 29B (31C, 31R, 31G, and 31B)

The feeder terminals of the opposite surfaces are cross-connected by interlayer wiring, in the same way as shown in FIG. 17C. Which is to say, the feeder terminals 29C and 30C, 29R and 30R, 29G and 30G, 29B and 30B, 31C and 32C, 31R and 32R, 31G and 32G, and 31B and 32B are connected to each other. This produces a construction in which the arrangement order of the feeder terminals provided on one surface is the reverse of the arrangement order of the feeder terminals provided on the opposite surface.

Figures 18E, 18F:
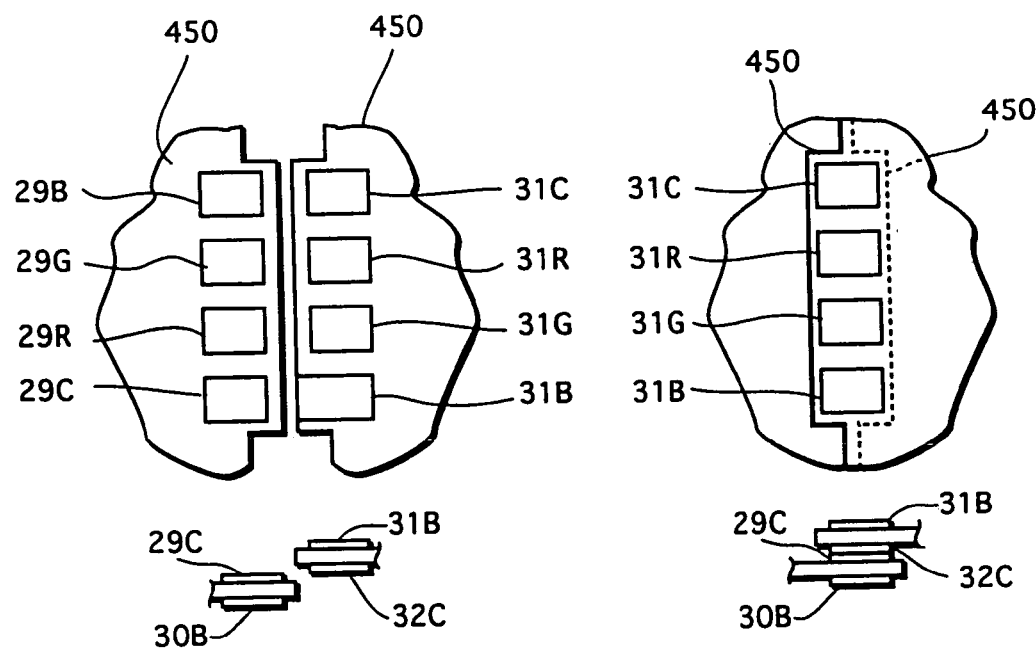
FIGS. 18E and 18F show a method of connecting the feeder terminals shown in FIGS. 18A and 18B.

FIGS. 18E and 18F show how to connect such constructed multilayer substrates 450. The feeder terminals formed on the back surface of one multilayer substrate 450 is placed on top of the feeder terminals formed on the front surface of the other multilayer substrate 450, with the corresponding feeder terminals being separately bonded using a conductive adhesive.

According to the constructions shown in (4), (5), and (6), the number of feeder terminals provided on one surface can be reduced by approximately half, with it being possible to increase the pitch of feeder terminals. This makes it easy to connect light-emitting units (i.e. feeder terminals).

Figure 7:
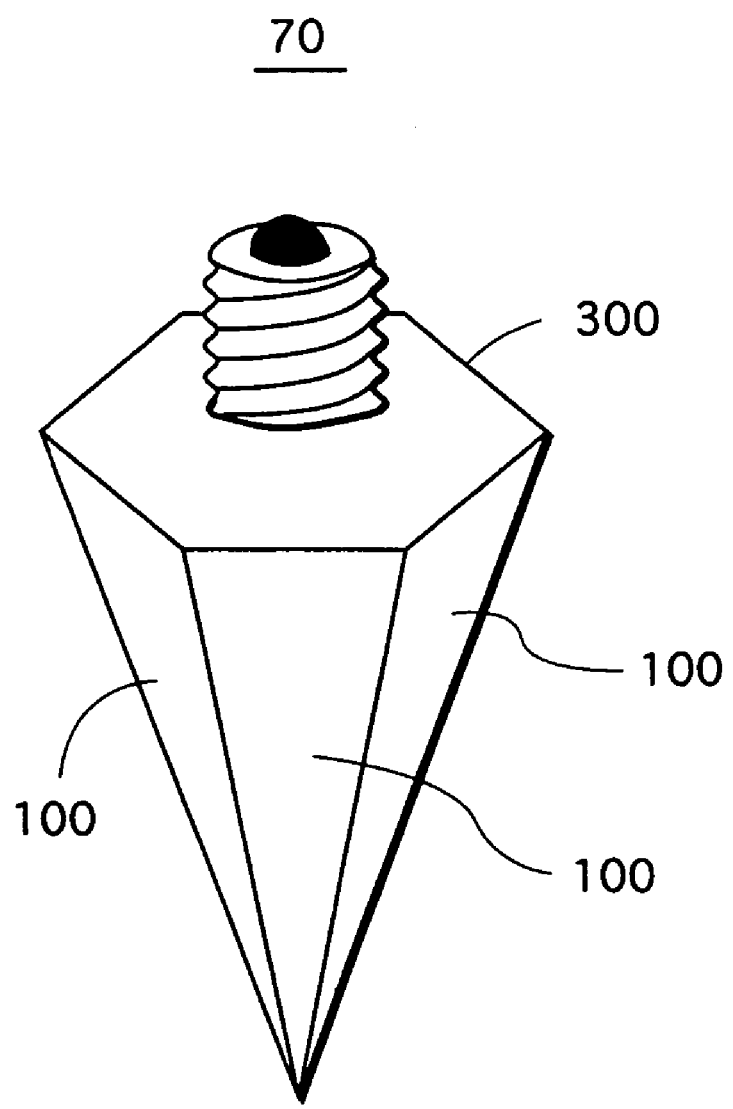
FIG. 7 shows an example of a pyramidal lighting apparatus.
Figure 9:
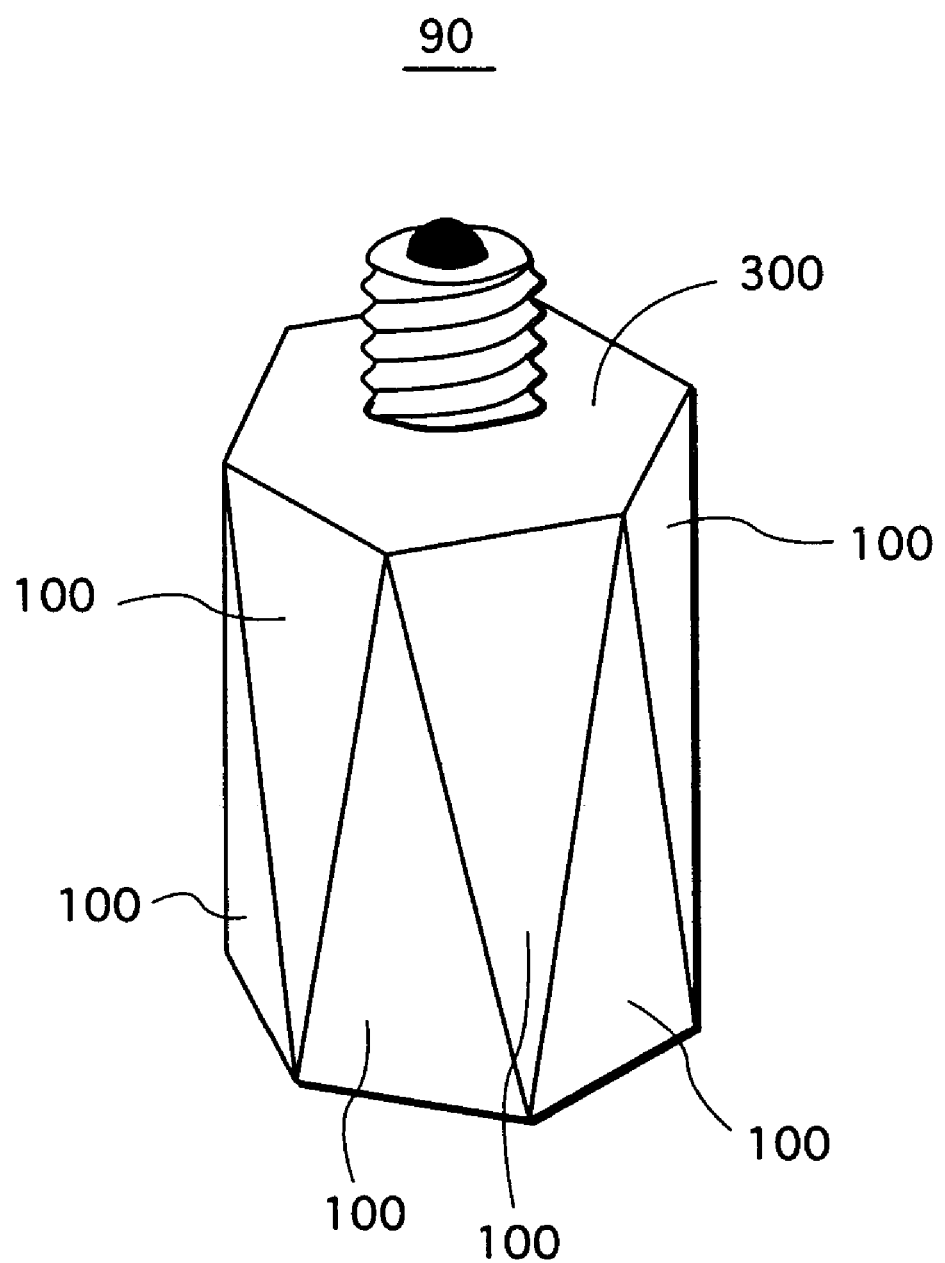
FIG. 9 shows an example of a cylindrical lighting apparatus.

The following explains a method of assembling the lighting apparatus (hereafter a "pyramidal lighting apparatus") 70 shown in FIG. 7 and a method of assembling the lighting apparatus (hereafter a "cylindrical lighting apparatus") 90 shown in FIG. 9.

FIG. 19A is a top view of a light-emitting unit positioning jig 180 used for assembling the pyramidal lighting apparatus 70. FIG. 19B is a top view of a light-emitting unit positioning jig 185 used for assembling the cylindrical lighting apparatus 90.

The two jigs 180 and 185 are obtained by developing the pyramid and the cylinder into plane figures and forming depressions 180a and 185a at the base for the corresponding isosceles triangles. Just fitting light-emitting units one by one into the depressions 180a and 185a enables the positioning of the light-emitting units in the plane figures to be determined.

FIG. 20 shows a method of automatically connecting light-emitting units using the jig 180 (185). The light-emitting units used here are fundamentally the same as those shown in FIG. 13, except that ultrasonic bonding is used instead of an adhesive.

Figure 20A:
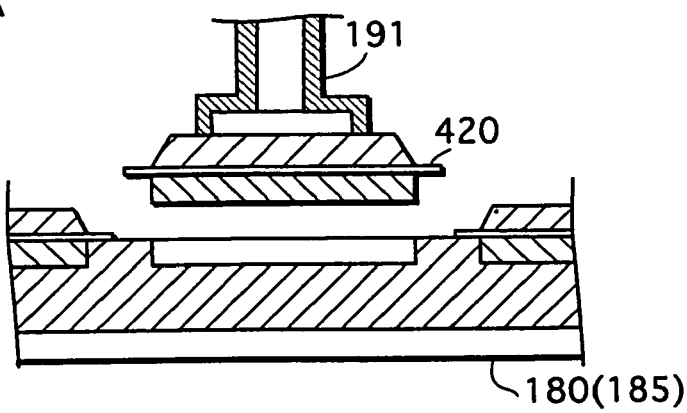
FIGS. 20A–20D show a process of connecting light-emitting units using joint plates.
Figure 20B:
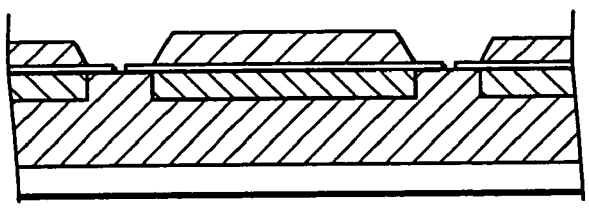

In FIG. 20A, a light-emitting unit (a Fresnel lens) is held by vacuum tweezers 191 attached to a robotic arm (not illustrated), and set in a depression of a jig. Here, a seal may be fixed to the surface of the Fresnel lens to secure the holding by the tweezers 191.

Figure 20C:
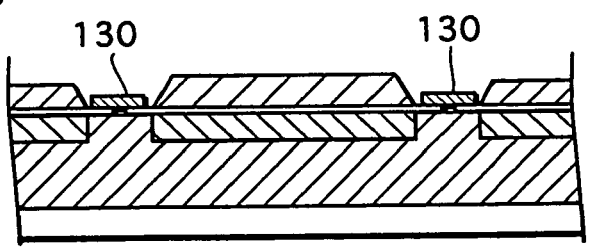

Once light-emitting units have been set in all depressions (FIG. 20B), joint plates 130 are set between the adjacent light-emitting units using the vacuum tweezers (FIG. 20C).

Figure 20D:
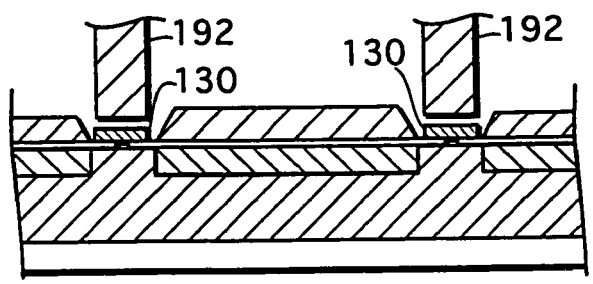

Once the joint plates 130 have been set, the joint plates 130 are pressed against the multilayer substrates 420 of the adjacent light-emitting units using the end of an ultrasonic oscillator horn 192, and ultrasonic oscillations are applied to bond the joint plates 130 and the multilayer substrates 420, as shown in FIG. 20D.

After all joint plates 130 are bonded to the multilayer substrates 420, the connected light-emitting units are extracted from the jig, and bent at the joint plates 130 to form a desired solid shape.

After the solid is formed, the connection between two light-emitting units at both ends of the solid and the connection between a feeder unit and a light-emitting unit may be performed by manual soldering or the like through the use of an appropriate joint plate.

According to the above assembly method, most assembly operations can be carried out automatically, with it being possible to save manpower.

While the present invention has been described based on the first embodiment, the invention should not be limited to such. For instance, the following modifications are possible.

(1) The first embodiment describes the case where the light-emitting unit has a substantially isosceles triangular shape with an acute vertex angle, but the light-emitting unit may have a substantially isosceles triangular shape with an obtuse vertex angle, or an isosceles right-angled triangular shape.

(2) The first embodiment uses the LED chips of the three colors of red, green, and blue, but the colors of LED chips and the number of colors are not limited to such. Also, when a plurality of colors are used, the number of LED chips need not be the same for each color. For example, while the ratio of the numbers of red, green, and blue LED chips is 1:1:1 in the above embodiment, the ratio may instead be 10:8:5.

Also, only one color of LED chips may be used. When only one color is used, the multilayer substrate can be replaced with a single-layer substrate.

(3) The first embodiment describes the case where the multilayer substrate has a four-layer structure, but the multilayer substrate may instead have a three-layer structure. In such a case, the fourth layer is omitted from the multilayer substrate. This being so, the circuit pattern for connecting the red LED chips in series is formed on the first layer, the circuit pattern for connecting the green LED chips in series is formed on the second layer, and the circuit pattern for connecting the blue LED chips in series is formed on the third layer, with the low-potential circuit pattern 240C being formed beneath the third layer. A specific example of this is given in the second embodiment.

(4) The first embodiment uses LED chips as light-emitting elements, but an electroluminescence (EL) device may instead be used.

In this case, an isosceles triangular EL device and an isosceles triangular substrate which is similar to but a size larger than the EL device are bonded to form a light-emitting unit. Feeder terminals are provided at appropriate positions along the periphery of the substrate, and both terminals of the EL device are connected to the feeder terminals by an adequate method, as in the first embodiment.

(5) A reflecting film made of aluminum or the like may be formed on the LED mounting surface of the multilayer substrate other than the LED mounting area. This has the effect of improving the brightness of the light-emitting unit.

(6) The first embodiment describes the case where the pyramidal lighting apparatus is a hexagonal pyramid, but this is not a limit for the invention. A pyramidal lighting apparatus whose base is a polygon of any number of sides can be obtained by varying the shape of isosceles triangles and varying the number of light-emitting units.

The number of light-emitting units of the cylindrical lighting apparatus can be changed too, as a cylinder is obtained by combining any even number of light-emitting units no less than six. Also, though the cylindrical lighting apparatus of the first embodiment has its LED mounting surfaces, i.e. its light-emitting faces, facing outward, the cylindrical lighting apparatus may have its light-emitting faces facing inward. As an alternative, the cylindrical lighting apparatus may have both outward-facing light-emitting faces and inward-facing light-emitting faces.

Also, the feeder unit in the first embodiment may be omitted. In this case, power is supplied from an external power supply to feeder terminals of a light-emitting unit through an electric conductor. Here, the pyramidal lighting apparatus may have its light-emitting faces facing inward. In this way, the lighting apparatus can be used as an umbrella-type lighting apparatus that can be hung from the ceiling.

(7) The first embodiment describes the case where the feeder terminals are provided on each side of the light-emitting unit (multilayer substrate). However, the feeder terminals do not need to be provided on every side, so that feeder terminals which will not be used once the lighting apparatus is assembled may be omitted. In such a case, projections corresponding to such unnecessary feeder terminals do not need to be formed, either.

(8) The first embodiment describes the lighting apparatus of solid appearance, but light-emitting units may be connected flatly (such as in the state of being set in a jig), with the connected object being held by an adequate supporter so as to be used as a flat lighting apparatus. Such a lighting apparatus can be used as a wall light. Various shapes may be achieved through different combinations of light-emitting units. Examples of such shapes include a parallelogram, a trapezium, a fan, a polygon, a meandering form (which can be formed by combining a plurality of fans or the like), an isosceles triangle larger than a single light-emitting unit, and combinations of these shapes.

(9) A translucent protective cover made of plastic may be used instead of the Fresnel lens. With this construction, it still appears to the human eye that the entire surface emits light, since the LED chips are closely positioned on the multilayer substrate.

Second Embodiment

The second embodiment is fundamentally the same as the first embodiment, except that the shape of the light-emitting unit and the construction of the multilayer substrate are different. Accordingly, the parts which are the same as those in the first embodiment are either only briefly explained or their explanation is omitted, so that the following explanation focuses on the differences with the first embodiment.

In the second embodiment, reference numerals used in the drawings are expressed in five digits. The upper two digits of each reference numeral are equal to the number of the drawing in which the construction element designated by the reference numeral first appears.

Also, if the construction element designated by the reference numeral corresponds to a construction element shown in the first embodiment, the lower three digits of that reference numeral are equal to a reference numeral that is used in the first embodiment to designate the corresponding construction element. The same applies to reference numerals which include alphabets.

Figure 21:
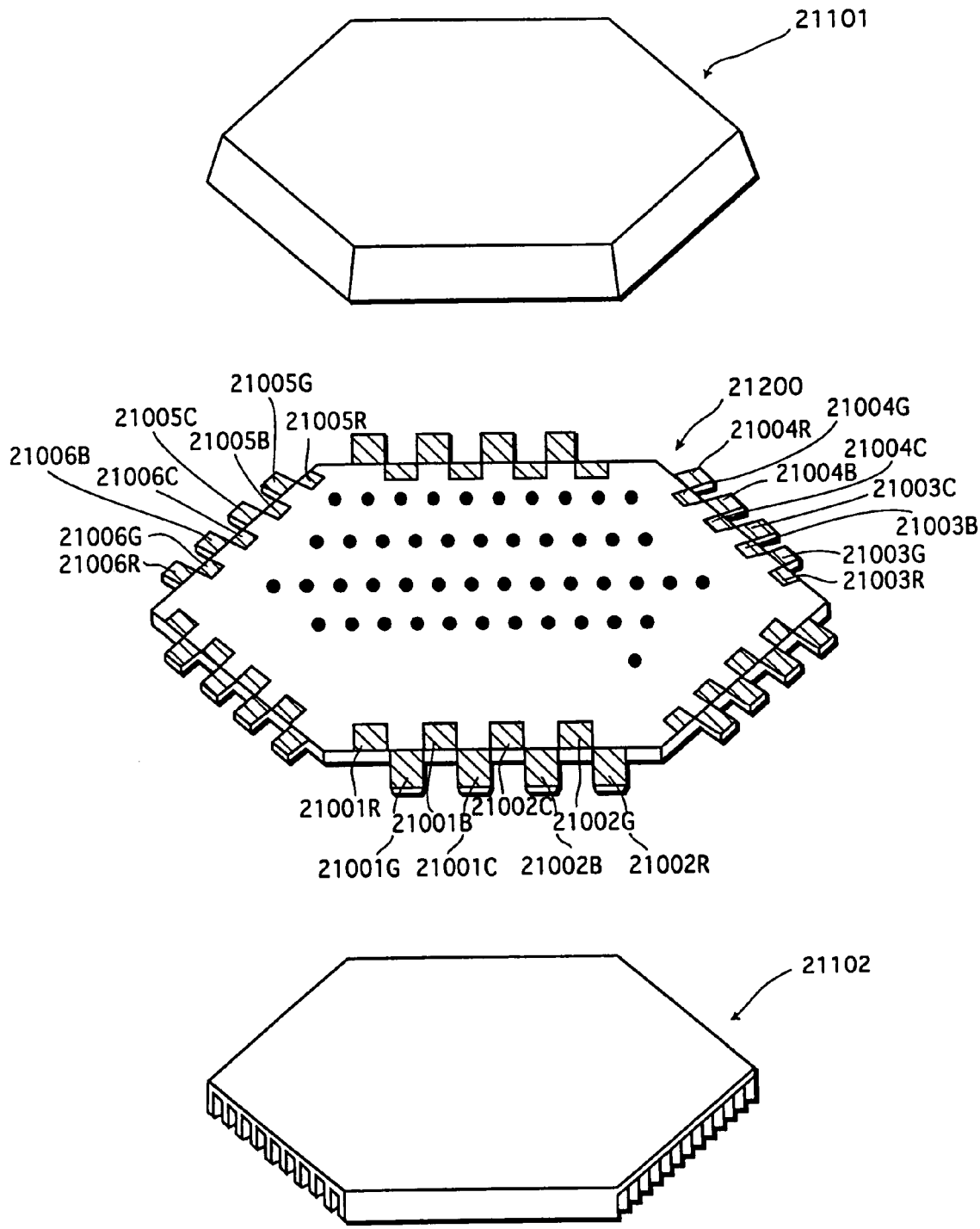
FIG. 21 is an exploded perspective view of a light-emitting unit to which the second embodiment of the invention relates.

FIG. 21 is an exploded perspective view of a light-emitting unit 21100 to which the second embodiment of the invention relates. The drawing corresponds to FIG. 2 in the first embodiment.

Like the light-emitting unit 100 of the first embodiment, the light-emitting unit 21100 has a Fresnel lens 21101, a multilayer substrate 21200, and a radiating plate 21102 which are laminated in this order. A plurality of LED chips R1, G1, . . . , and B1, . . . are mounted on the multilayer substrate 21200. This light-emitting unit 21100 is shaped like a regular hexagon, while the light-emitting unit 100 is shaped like an isosceles triangle. In FIG. 21, the Fresnel lens 21101 and the LED chips are greatly simplified. Also, though the same feeder terminals as those in the first embodiment are provided on each side of the multilayer substrate 21200, reference numerals are given only to feeder terminals of three sides for simplicity's sake.

Figure 22:
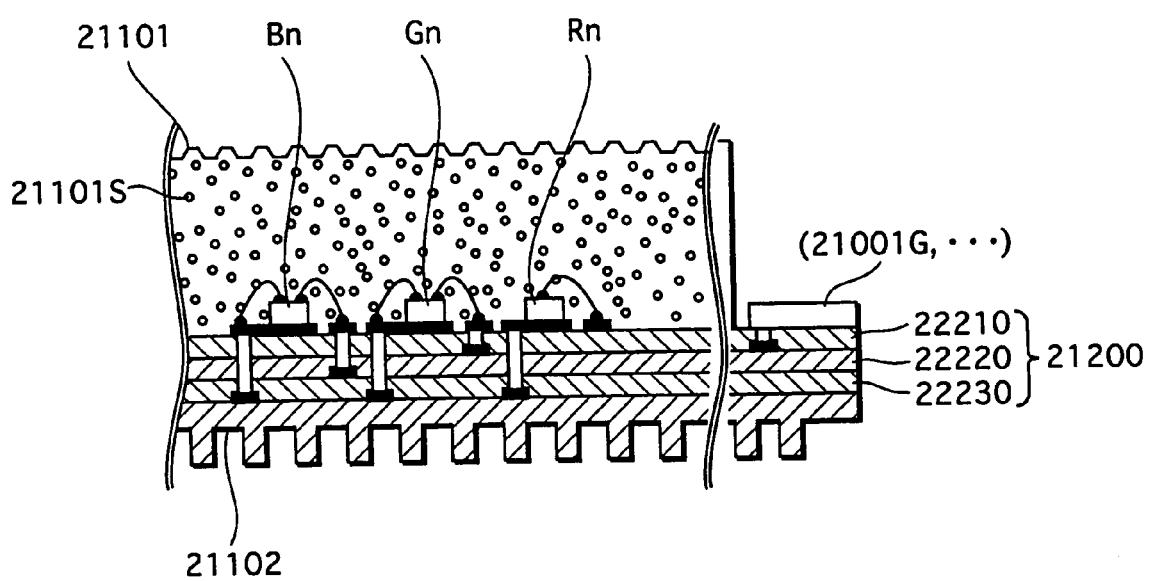
FIG. 22 is a partial sectional view of the light-emitting unit shown in FIG. 21.
Figure 23:
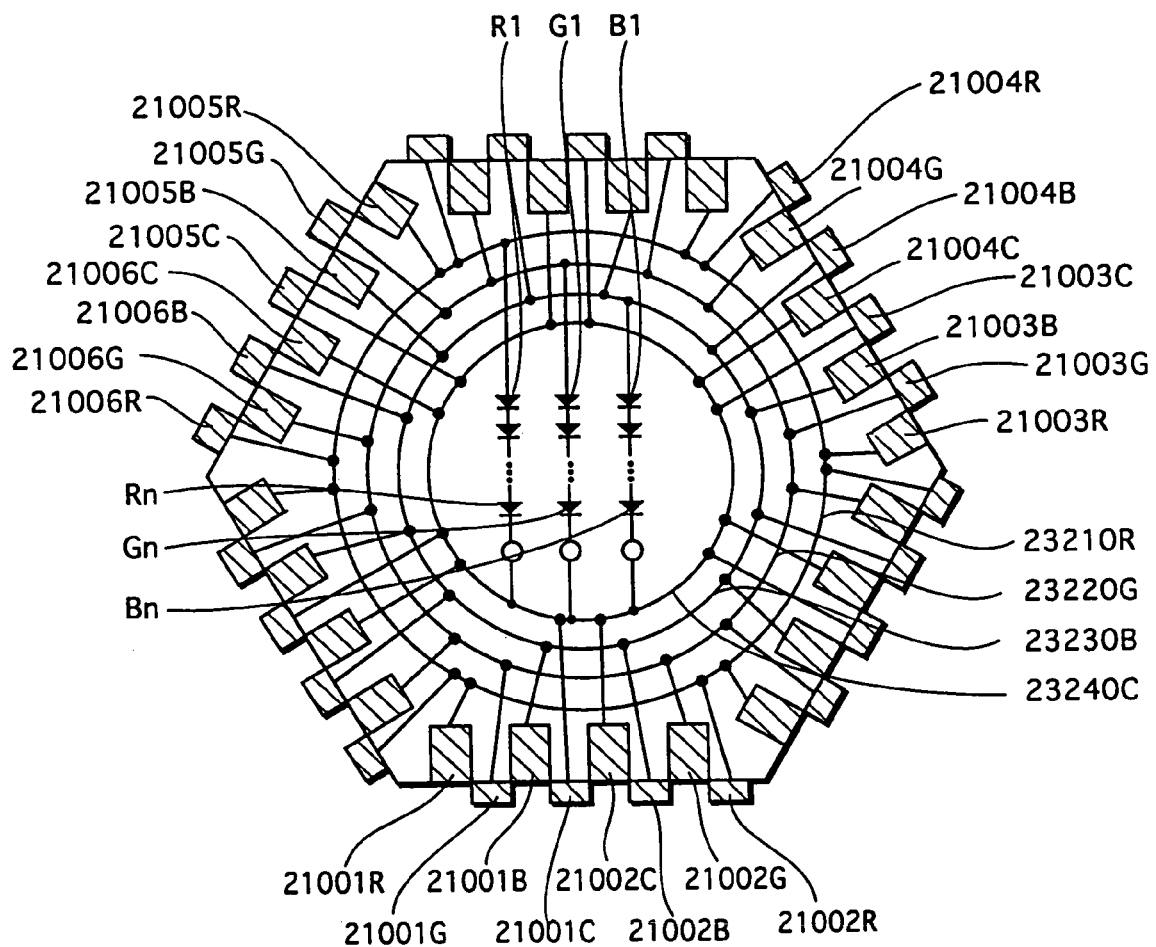
FIG. 23 is a conceptual wiring diagram showing connections between different-colored LEDs and feeder terminals in the light-emitting unit shown in FIG. 21.

FIG. 22 is a partial sectional view of the light-emitting unit 21100, and partially corresponds to FIG. 4 (the multilayer substrate). FIG. 23 is a conceptual diagram showing a wiring pattern of the multilayer substrate 21200, and corresponds to FIG. 5A. Only the low-potential LED chips (Rn, Gn, Bn) of the three colors are shown in FIG. 22. The LED chips of each color are the same as those shown in FIGS. 3A and 3B in the first embodiment, so that their explanation has been omitted. Also, the number of LED chips may be the same or different for each color, as explained in the first embodiment.

As shown in FIG. 22, the multilayer substrate 21200 has a three-layer construction, while the multilayer substrate 200 has a four-layer construction. As noted in the first embodiment, in the second embodiment the circuit pattern for connecting the red LED chips in series is formed on a first layer 22210, the circuit pattern for connecting the green LED chips in series is formed on a second layer 22220, and the circuit pattern for connecting the blue LED chips in series is formed on a third layer 22230, with a low-potential circuit pattern 23240C (see FIG. 23) being formed beneath the third layer 22230. Also, a red high-potential circuit pattern 23210R is formed on the first layer 22210, a green high-potential circuit pattern 23220G on the second layer 22220, and a blue high-potential circuit pattern 23230B on the third layer 22230. Note that an alumina powder 21101S, which is not shown in the first embodiment, is shown in FIG. 22.

Thus, the light-emitting unit 21100 of the second embodiment differs with the first embodiment only in the shape of the light-emitting unit and the construction of the multilayer substrate. Therefore, its further explanation has been omitted here.

Figure 24A:
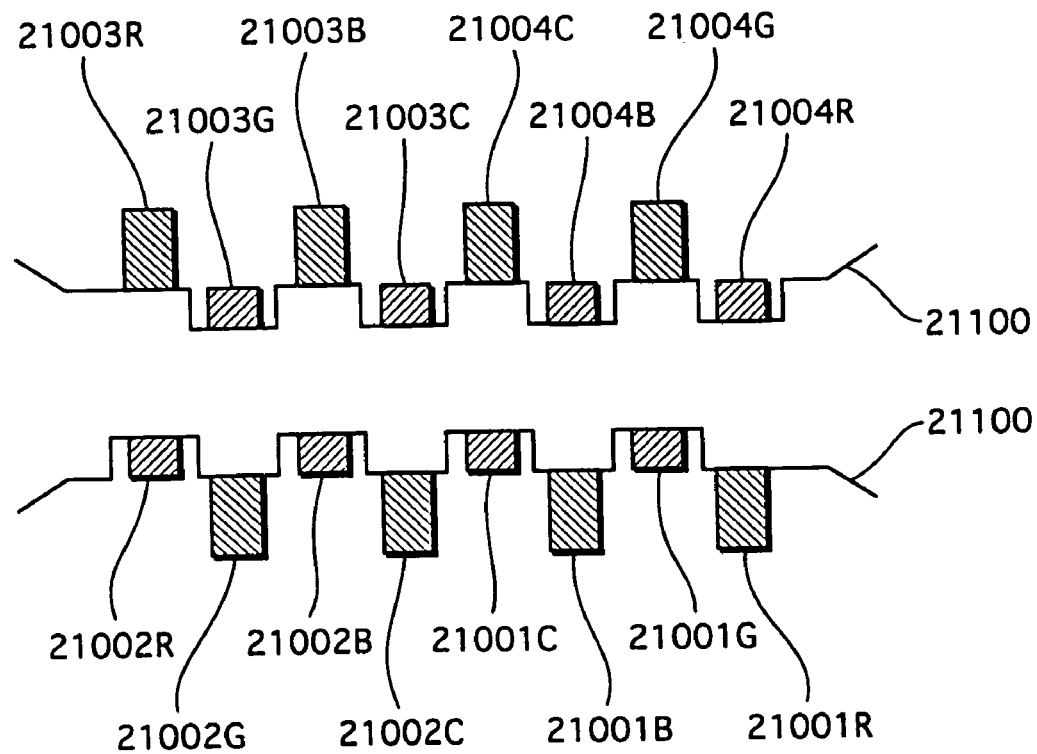
FIG. 24A shows example feeder terminals in light-emitting units and feeder unit.
Figure 24B:
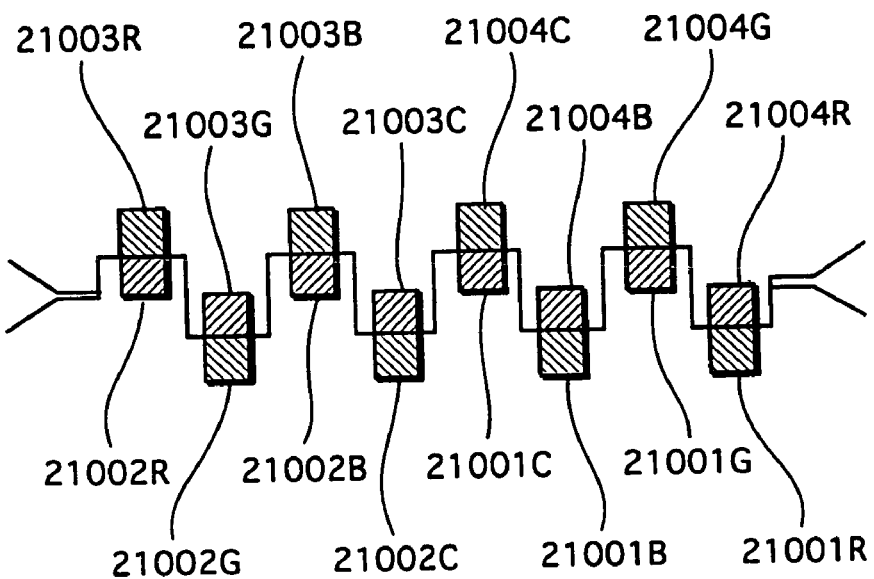
FIG. 24B shows the state where the feeder terminals shown in FIG. 24A have been combined.

A method of connecting light-emitting units 21100 of the above construction is the same as that shown in FIGS. 6A and 6B. Which is to say, projections on one side of a light-emitting unit 21100 on which feeder terminals have been formed are placed on top of one side of another light-emitting unit 21100 on which feeder terminals have been formed, and the corresponding feeder terminals are soldered, as shown in FIGS. 24A and 24B.

The following explains other connection constructions of light-emitting units (including constructions of feeder terminals), though most of them are the same as those shown in the first embodiment. For those which are the same as the first embodiment, the corresponding drawings of the first embodiment are indicated and their detailed explanation is omitted.

Figure 25A:
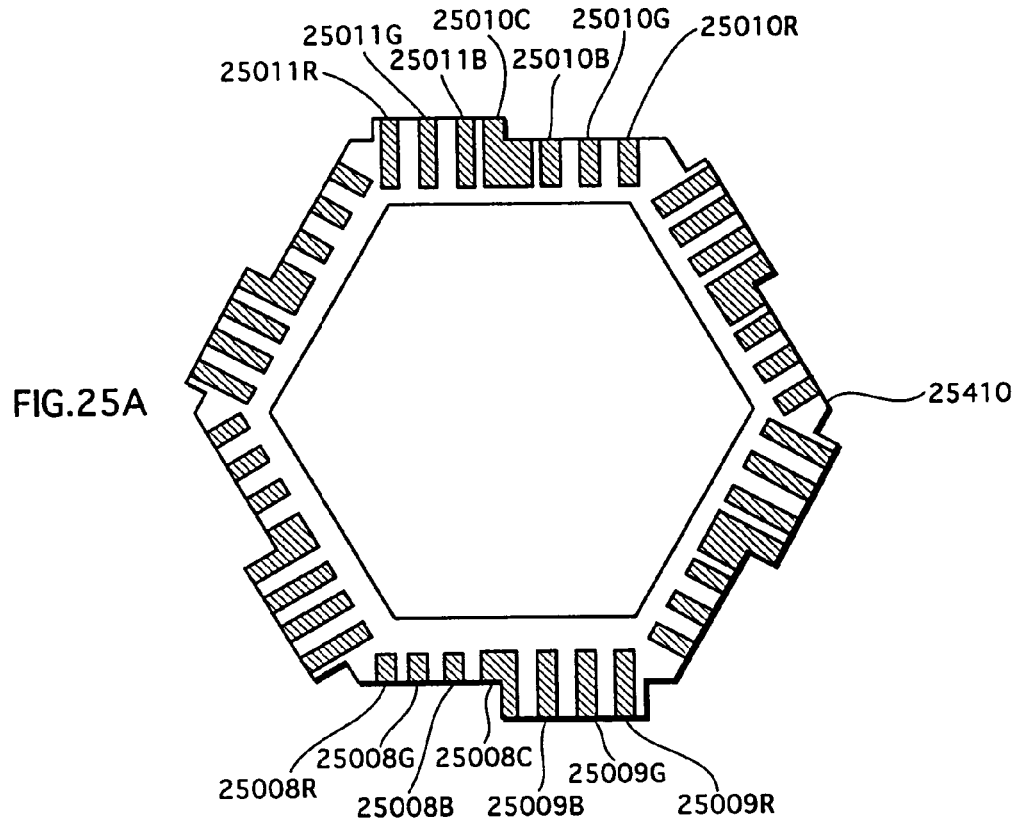
FIG. 25A shows example feeder terminals in light-emitting units and feeder unit.
Figure 25B:
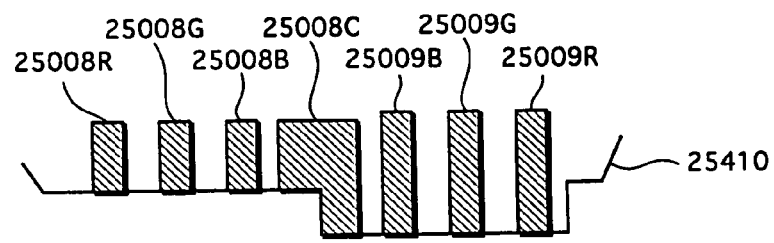
FIG. 25B is an expanded view of the feeder terminals shown in FIG. 25A.
Figure 25C:
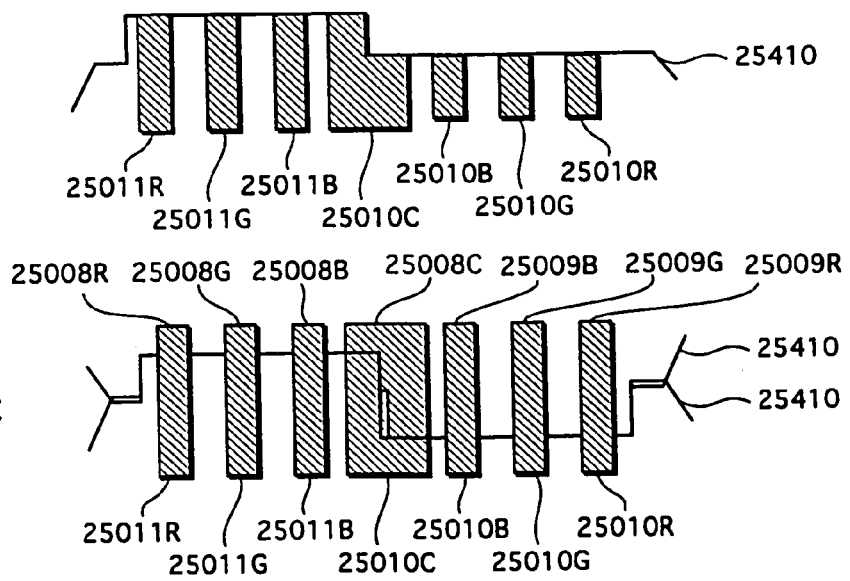
FIG. 25C shows the state where the feeder terminals shown in FIG. 25B have been combined.

A connection construction shown in FIGS. 25A–25C is the same as that shown in FIGS. 12A and 12B.

Figure 26A:
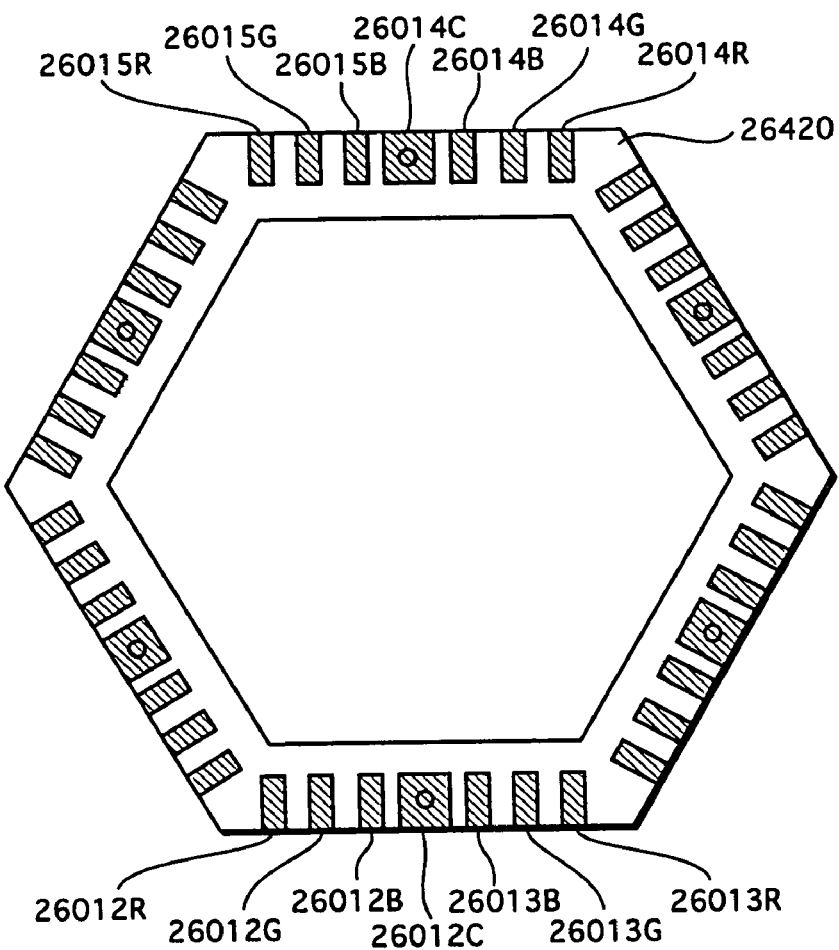
FIG. 26A shows example feeder terminals in light-emitting units and feeder unit.
Figure 26B:
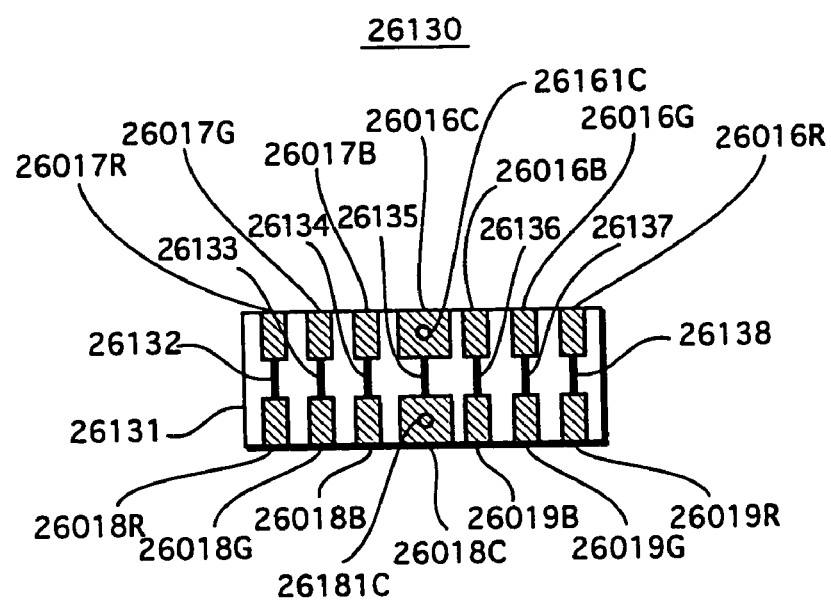
FIG. 26B shows a joint plate for connecting the feeder terminals shown in FIG. 26A.

A connection construction shown in FIGS. 26A and 26B is the same as that shown in FIGS. 13A and 13B.

Figure 27A:
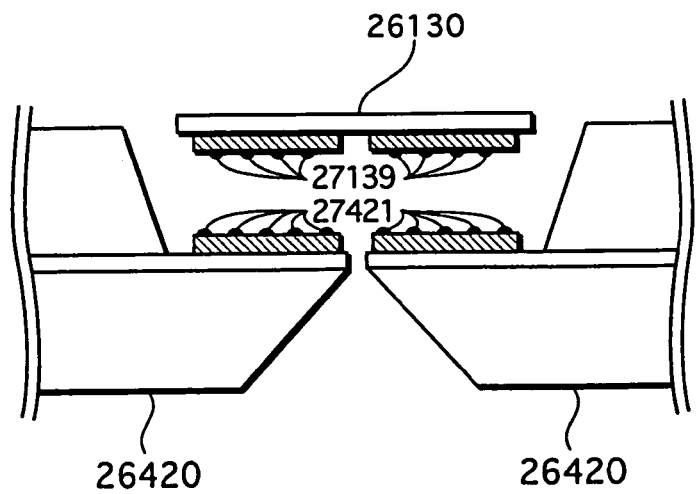
FIGS. 27A–27C show a method of connecting the feeder terminals shown in FIG. 26A using the joint plate shown in FIG. 26B.
Figure 27B:
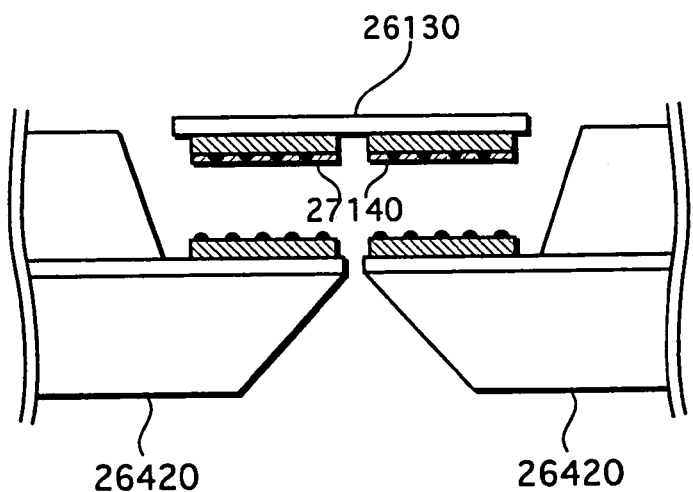
Figure 27C:
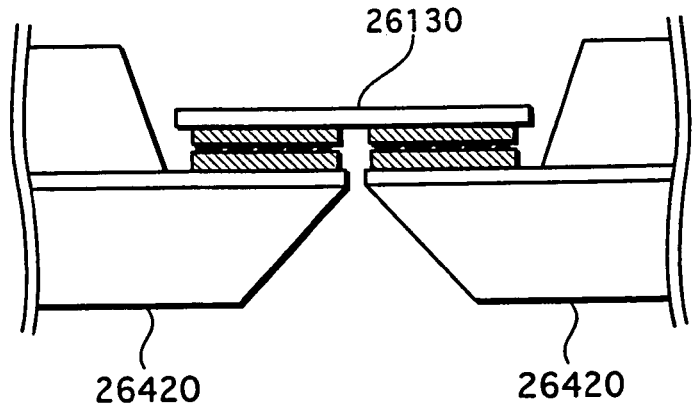

A connection construction shown in FIGS. 27A–27C is the same as that shown in FIG. 14.

Figure 15A:
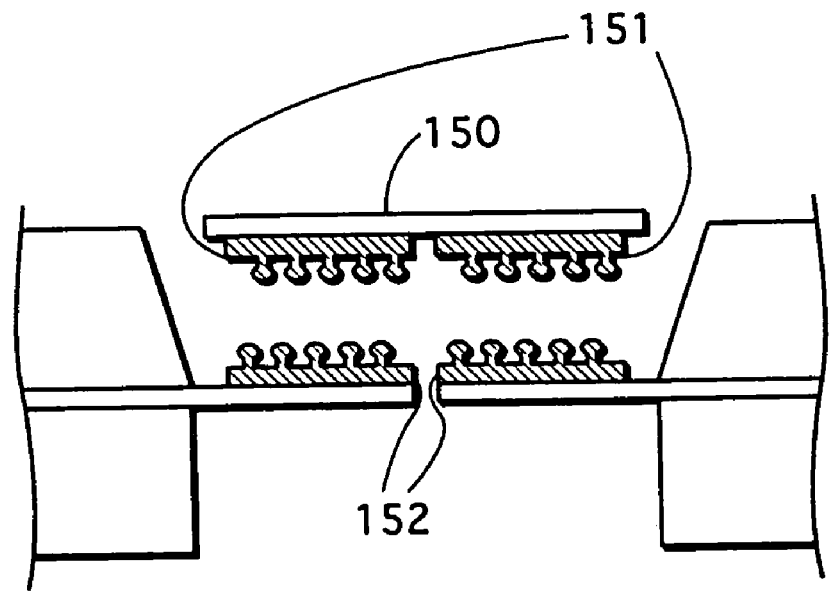
FIGS. 15A and 15B show an example that uses flat fasteners for feeder terminals.
Figure 15B:
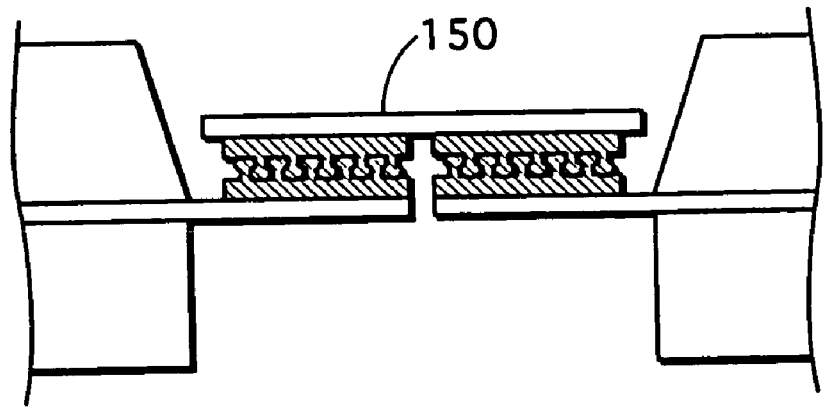
Figure 28A:
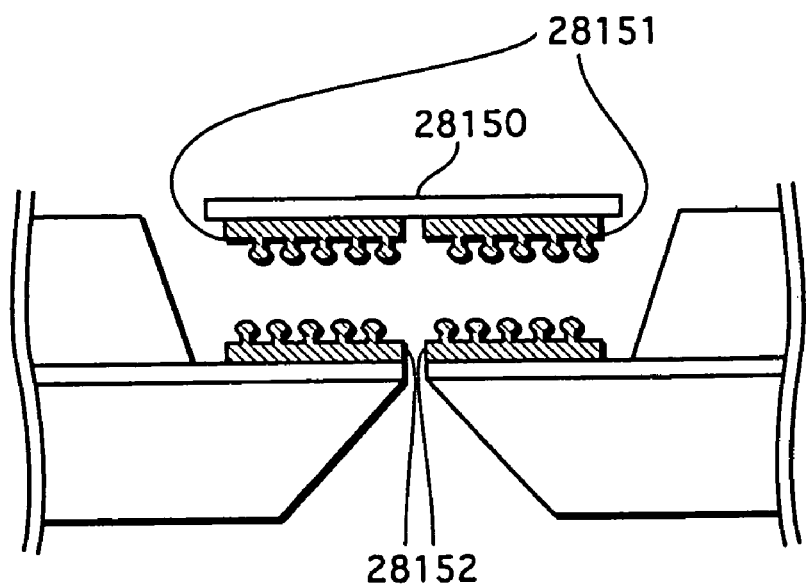
FIGS. 28A and 28B show an example of using flat fasteners for feeder terminals.
Figure 28B:
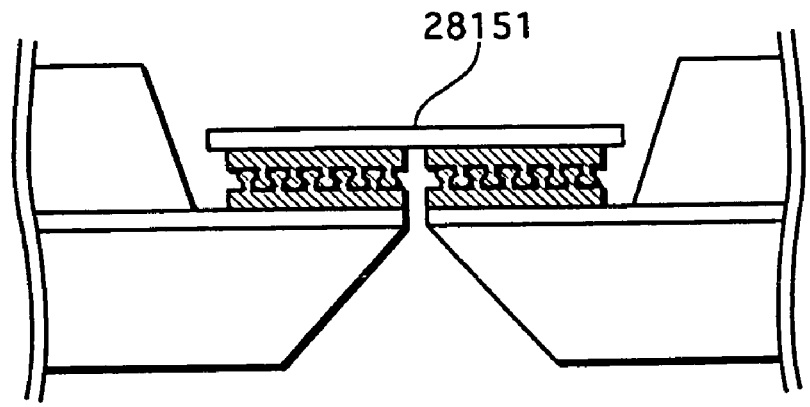

A connection construction shown in FIGS. 28A and 28B, which uses conductive sheet fasteners for connector terminals of a joint plate 28150 and feeder terminals of light-emitting units, is the same as that shown in FIGS. 15A and 15B.

A connection construction shown in FIGS. 29A–29C is the same as that shown in FIGS. 16A and 16B.

A connection construction shown in FIGS. 30A–30D is the same as that shown in FIGS. 18A–18F.

A connection construction shown in FIGS. 31A–31C is a little different from that shown in FIGS. 17A–17D.

While feeder terminals are provided on both surfaces of the multilayer substrate in the first embodiment, they are provided on only one surface of the multilayer substrate in the second embodiment.

Meanwhile, a joint plate is the same as that used in the first embodiment.

As shown in FIG. 31C, two sides which need to be connected are bent in the form of the letter L, and the corresponding feeder terminals are set facing each other. In this state, the corresponding feeder terminals are connected using the joint plate. Though soldering is used to connect the corresponding feeder terminals in the first embodiment, instead a conductive adhesive may be used in the second embodiment.

According to the above described connection methods, a polyhedral lighting apparatus can be obtained by connecting a plurality of light-emitting units and bending the connecting parts, as in the first embodiment.

Figure 32:
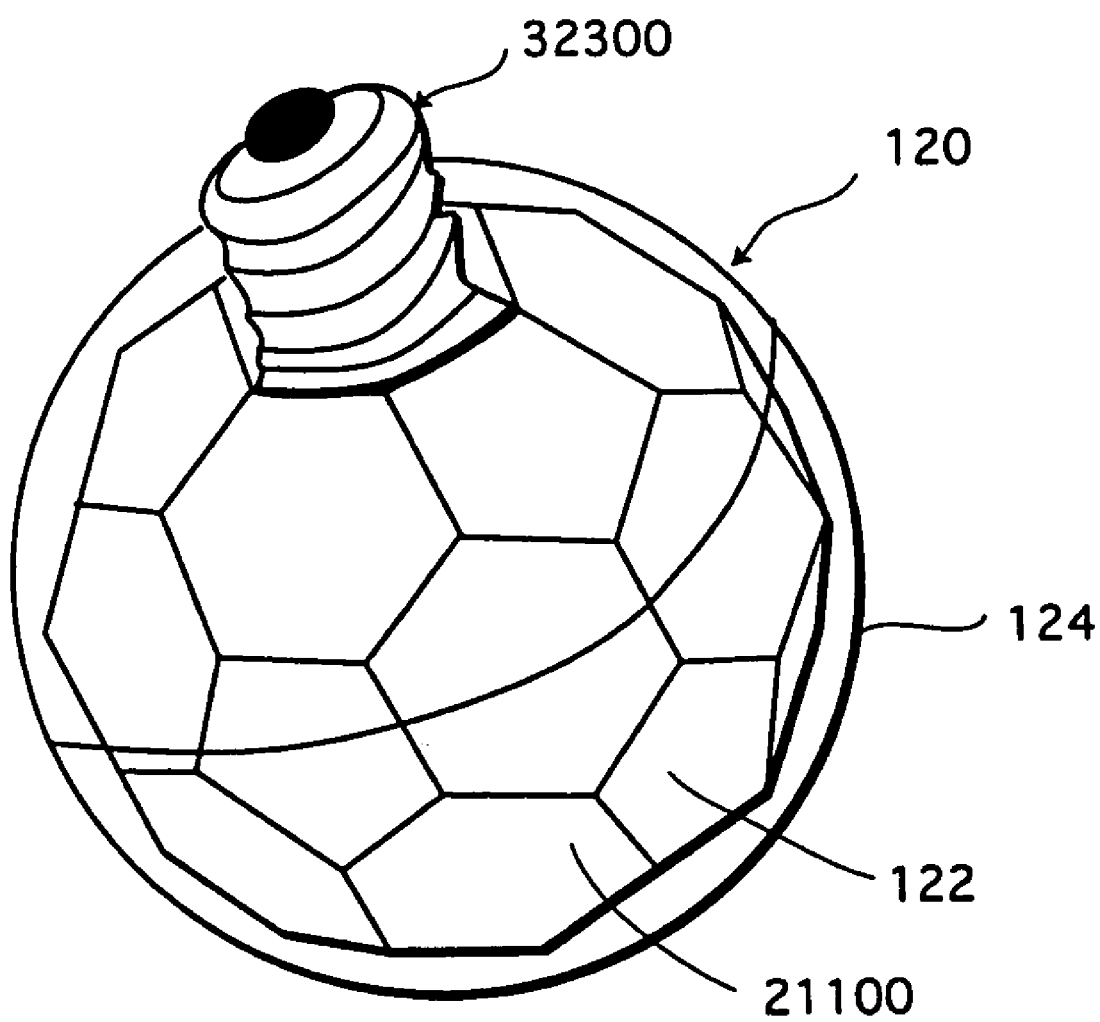
FIG. 32 is a perspective view showing an example of a truncated icosahedral lighting apparatus.

FIG. 32 shows a truncated icosahedral lighting apparatus 120 which is made up of nineteen light-emitting units 21100, twelve light-emitting units 122, and one feeder unit 32300. The light-emitting units 122 have a regular pentagonal shape. The light-emitting units 122 have the same construction as the light-emitting units 21100, except that they have five sides instead of six sides and accordingly have five sets of feeder terminals instead of six sets of feeder terminals. Therefore, the explanation on the light-emitting units 122 is omitted here. The feeder unit 32300 has the same construction as the feeder unit 300 in the first embodiment, and so its explanation is omitted too.

The lighting apparatus 120 is covered with a spherical cover 124 made of a transparent plastic.

It should be obvious that this lighting apparatus may be formed using light-emitting units that employ other connection constructions, instead of the light-emitting units 21100 (such as those shown in FIGS. 25–31).

The following is an explanation of a method of assembling the above truncated icosahedral lighting apparatus using light-emitting units 26420 shown in FIG. 26A and regular pentagonal light-emitting units (not illustrated) of the same type as the light-emitting units 26420.

Figure 33:
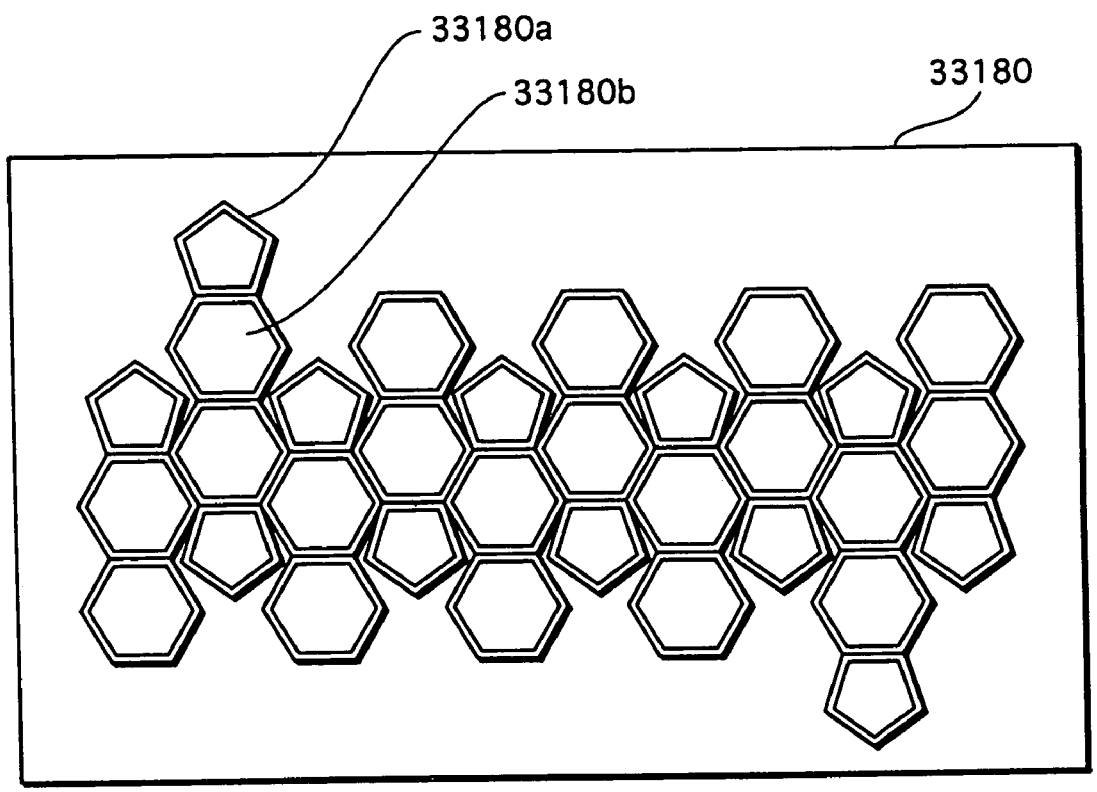
FIG. 33 is a top view of a jig used for assembling the lighting apparatus shown in FIG. 32.

FIG. 33 is a top view of a light-emitting unit positioning jig 33180 used for assembling the lighting apparatus.

The positioning jig 33180 is similar to the positioning jigs 180 and 185 (shown in FIGS. 19A and 19B) in the first embodiment.

In detail, the positioning jig 33180 is obtained by developing the truncated icosahedron into a plane figure and providing depressions 33180a and depressions 33280b on the base respectively for pentagons and hexagons. Accordingly, just fitting light-emitting units one by one into the depressions 33180a and 33180b of the positioning jig 33180 enables the positioning of the light-emitting units in the plane figure to be determined.

A method of automatically connecting the light-emitting units using the positioning jig 33180 is the same as that shown in FIG. 20, so that its explanation has been omitted.

Figure 34:
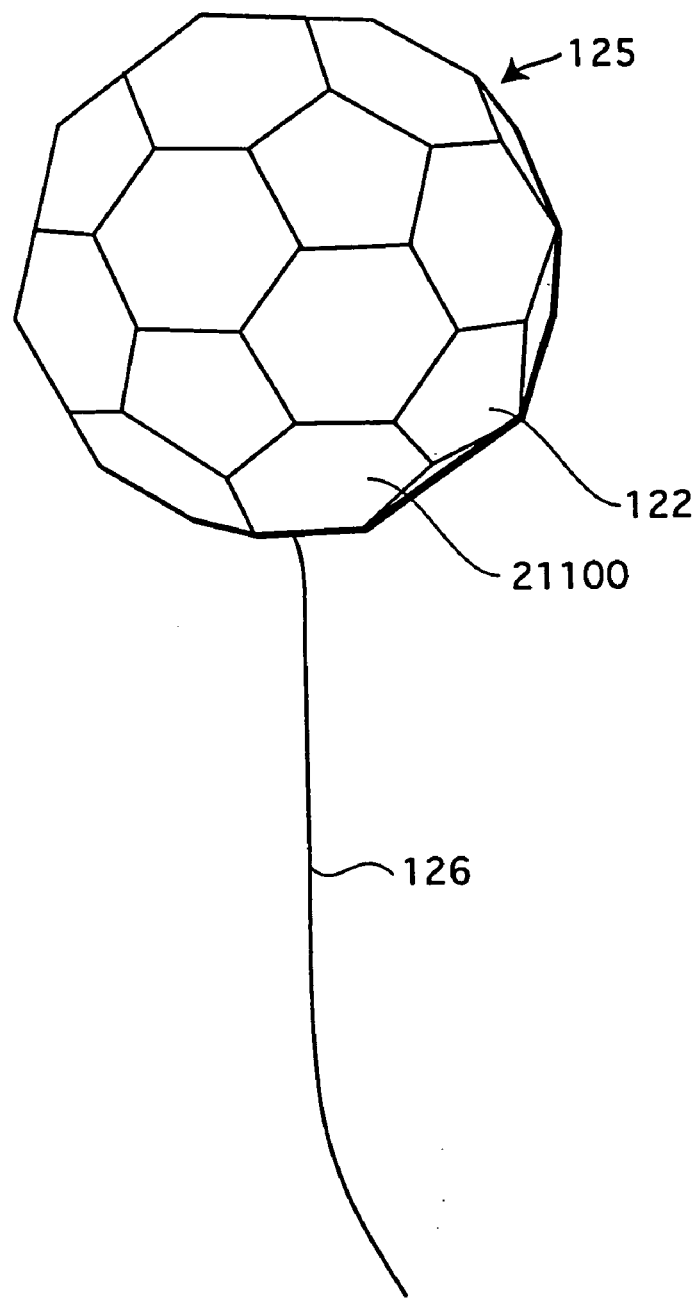

FIG. 34 shows a lighting apparatus 125 that is obtained by replacing the feeder unit 32300 of the lighting apparatus 120 in FIG. 32 with a light-emitting unit 21100 and removing the spherical cover 124.

An electric conductor 126 for supplying power to the lighting apparatus 125 is connected to feeder terminals of one of the light-emitting units 21100 and 122. Also, a balloon is provided inside the lighting apparatus 125. Apart from these differences, the lighting apparatus 125 has the same construction as the lighting apparatus 120 in FIG. 32, so that an explanation on their common parts has been omitted.

A device equipped with the aforementioned drive unit 320 is provided between the electric conductor 126 and an external power supply. The electric conductor 126 is a stranded conductor made up of four wires. Each wire is soldered to a different one of common, red, green, and blue terminals of the light-emitting unit.

The balloon inside the lighting apparatus 125 is filled with a light gas such as helium, and allows the lighting apparatus 125 to float in the air.

Here, a solar panel may be used instead of the external power supply to supply power, with it being possible to lift limitations on the usage location of the lighting apparatus 125.

Moreover, the solar panel may be directly connected to the lighting apparatus 125 without using the electric conductor 126. For example, a unit which has its front surface equipped with a solar panel and its back surface equipped with a charger may be provided in each regular pentagonal light-emitting unit 122 of the truncated icosahedral lighting apparatus 125. If the solar panel is charged during the day, the lighting apparatus 125 can be illuminated during the night.

Although the present invention has been described based on the second embodiment, the invention should not be limited to such. It should be obvious that various modifications can be made without departing from the technical scope of the invention. The following are representative examples of such modifications.

(1) The second embodiment describes the case where the light-emitting unit has a regular hexagonal shape, but the light-emitting unit may instead have an equilateral triangular shape or a square shape, with there being no limitations on the number of sides. Also, the shape of the light-emitting unit is not limited to a regular polygon, but may be an in equilateral polygon such as a rectangle.

(2) The second embodiment uses LED chips as light-emitting elements, but an EL device may instead be used. In this case, the EL device is shaped like a regular polygon, and bonded to a substrate which has electrodes on its periphery. Hence a single EL device can be substituted for a plurality of LEDs.

(3) The second embodiment describes the case where the joint plate connects two light-emitting units whose sides have the same length. However, the joint plate may be shaped in a trapezoid, so as to connect light-emitting units whose sides have different lengths.

(4) The second embodiment describes the case where a lighting apparatus of a solid appearance is assembled using a plurality of light-emitting units, but this can be modified as follows. A plurality of light-emitting units are arranged flatly and the facing sides are connected to each other, thereby assembling a flat lighting apparatus.

(5) The second embodiment describes the case where a truncated icosahedral lighting apparatus is formed using a plurality of regular hexagonal light-emitting units and a plurality of regular pentagonal light-emitting units. However, this is not a limit for the invention, which can be realized in other shapes such as a vase using combinations of light-emitting units of other polygons or light-emitting units of different-sized polygons.

(6) The second embodiment uses LED chips of the three colors of red, green, and blue, but the colors of LED chips and the number of colors are not limited to such. For example, only the color of white may be used, or multiple colors may be used. If only one color is used, a multilayer substrate can be replaced with a single-layer substrate.

(7) In the examples shown in FIGS. 23, 25A, 26A, 29A, and 31A, the feeder terminals are located at the periphery of the multilayer substrate, but the feeder terminals may be located a predetermined distance inside the periphery of the multilayer substrate (i.e. in the vicinity of each side of the multilayer substrate), as shown in FIG. 30A.

Third Embodiment

The third embodiment is similar to the second embodiment in that the light-emitting unit is hexagonal, but differs with the second embodiment in that feeder terminals are provided only on three alternate sides. Also, while the first and second embodiments mainly describe the case where LEDs of the three colors are used, the third embodiment describes the case where LEDs of a single color are used.

Though the third embodiment has a number of similarities to the first and second embodiments, its construction is described in detail without omitting those similarities.

(1. Overall Construction)

Figure 35:
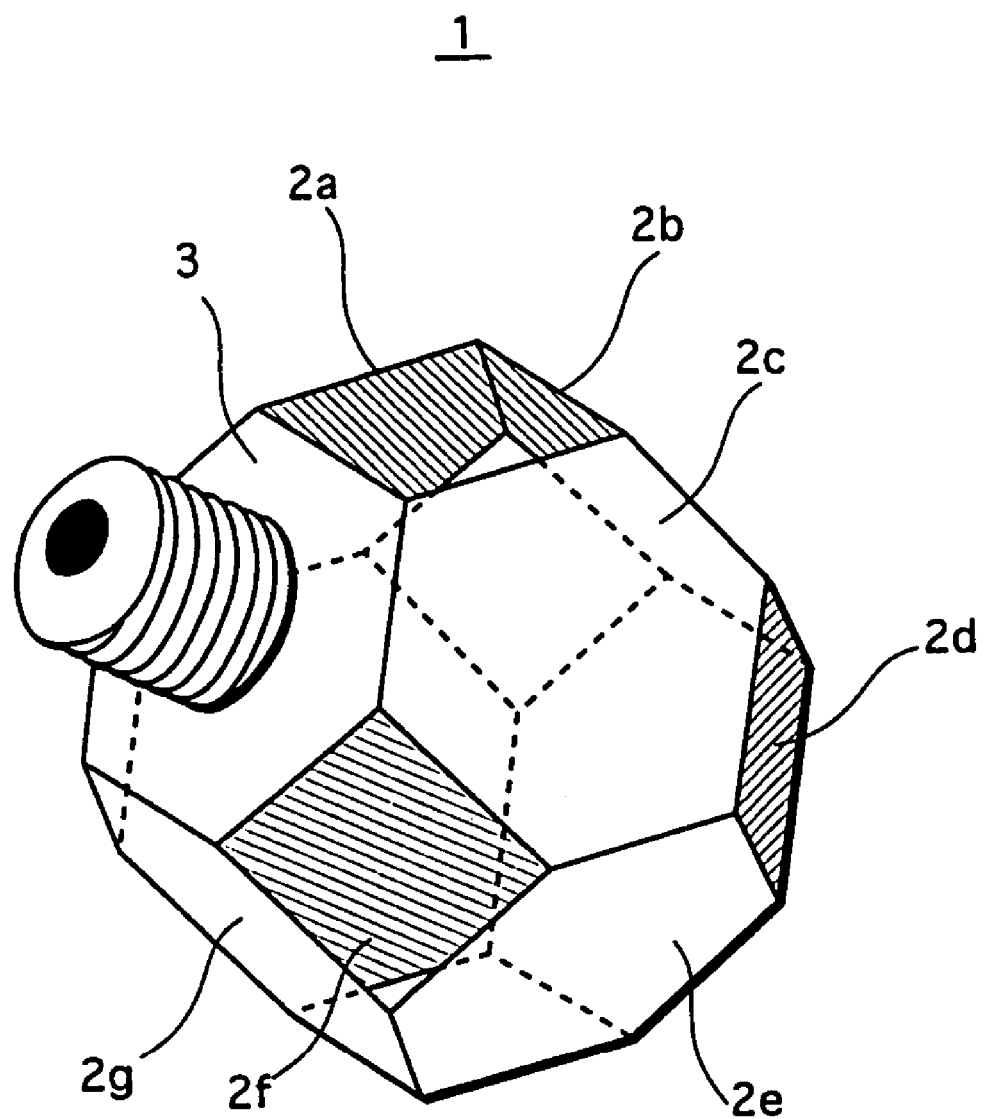
FIG. 35 is a perspective view of an appearance of a lighting apparatus to which the third embodiment of the invention relates.

FIG. 35 is a perspective view showing an appearance of a lighting apparatus to which the third embodiment of the invention relates. In the drawing, a lighting apparatus 1 has seven light-emitting units 2a–2g and a base unit 30000. The light-emitting unit 2a–2g and the base unit 30000 are substantially regular hexagonal flat (sheet) units. The base unit 30000 has an E26 base (a screw-in base having a diameter of 26 mm).

The light-emitting units 2a–2g and the base unit 30000 are positioned at regular hexagons of a truncated octahedron. Squares of the truncated octahedron, which are designated by the diagonally shaded areas, are openings. These openings allow passage of the air, thereby helping the light-emitting units 2a–2g dissipate heat.

The lighting apparatus 1 is, for example, attached to a ceiling or rosette fixed on the ceiling or wall, through an E26 base adapter. The E26 base adapter is a socket into which a bulb equipped with an E26 base can be inserted. The base of the base unit 30000 is screwed into the E26 base adapter, which supports the lighting apparatus 1. The light-emitting units 2a–2g have the same construction. Hereafter the light-emitting units 2a–2g are collectively called "light-emitting units 2".

(2. Construction of a Light-Emitting Unit 2)

Figure 36:
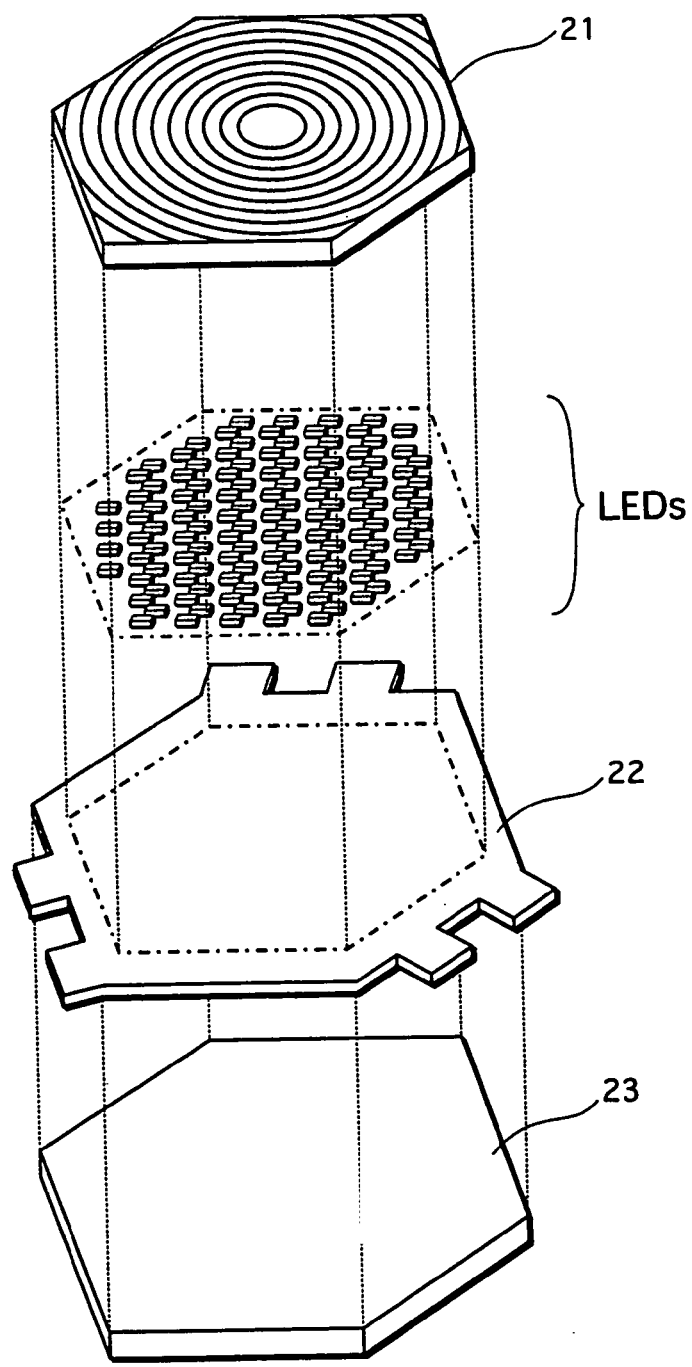
FIG. 36 is an exploded perspective view showing a construction of a light-emitting unit in the lighting apparatus shown in FIG. 35.

FIG. 36 is an exploded perspective view of a construction of a light-emitting unit 2. The light-emitting unit 2 is roughly made up of a light diffusion layer 21, a flexible substrate 22, and a radiating plate 23. LEDs are mounted on the flexible substrate 22. The light diffusion layer 21 has a substantially regular hexagonal shape, and is made of a transparent resin.

A Fresnel lens is formed on a surface of the light diffusion layer 21. Also, a light scattering material (such as an alumina powder) is mixed in the light diffusion layer 21. The light diffusion layer 21 serves to protect the LEDs on the flexible substrate 22 from external forces and the like.

Figure 37:
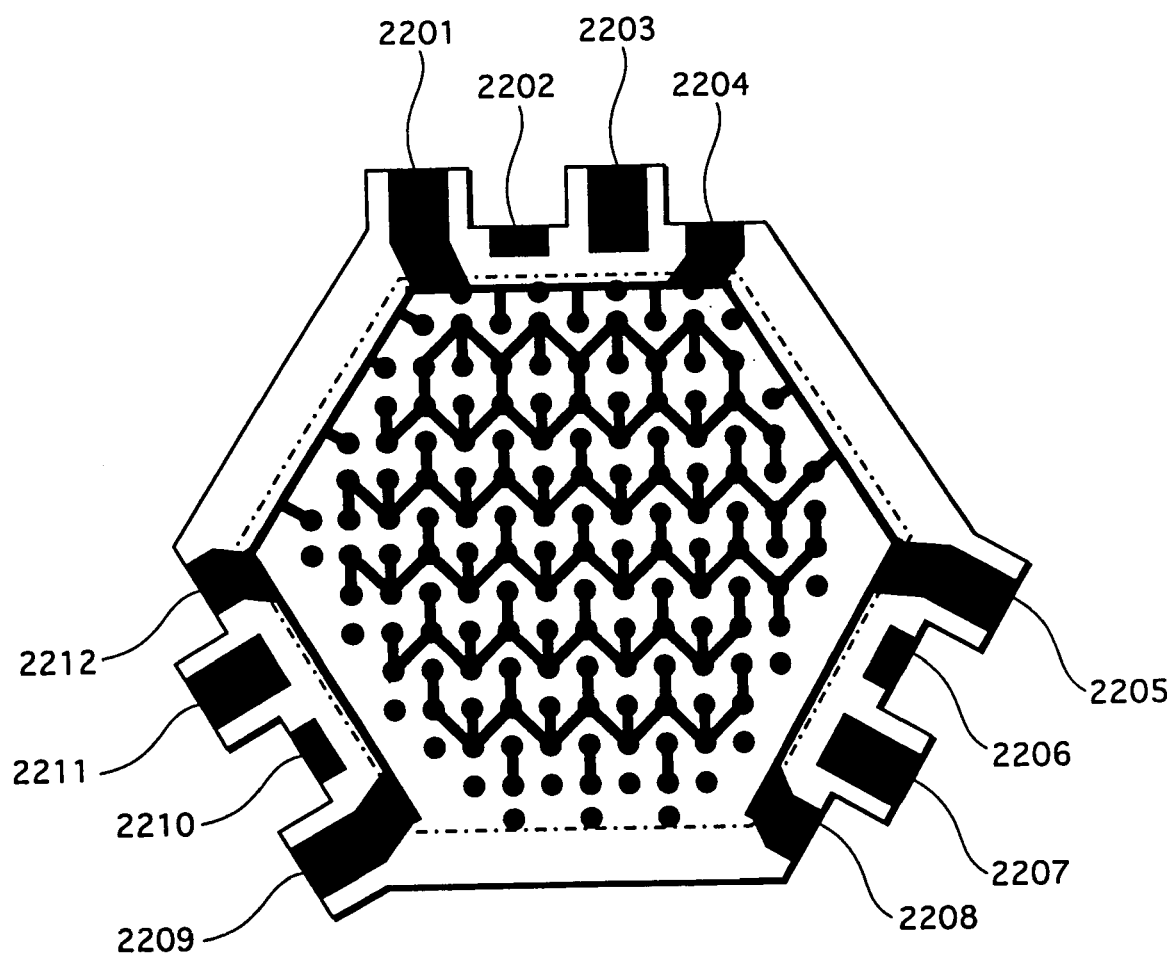
FIG. 37 is a pattern diagram showing example Cu patterns formed on the LED mounting surface of a flexible substrate in the light-emitting unit shown in FIG. 36.

The flexible substrate 22 is made of a polyimide. Cu patterns are formed on both surfaces of the flexible substrate 22 by etching. Also, SMD (surface mounted device) LEDs are mounted on one of the surfaces of the flexible substrate 22. FIG. 37 shows example Cu patterns formed on the surface of the flexible substrate 22 on which the LEDs have been arranged.

In the drawing, the Cu patterns are formed so as to coincide with the positioning of the LEDs. Also, electrode terminals 2201–2212 for electrically connecting with other light-emitting units are formed on three sides of a regular hexagon, as Cu patterns. Note that the area enclosed by a chain line is covered with the light diffusion layer 21, with the LEDs being formed within this area.

The electrode terminals 2202, 2203, 2206, 2207, 2210, and 2211 are earth electrode terminals which are electrically connected to Cu patterns formed on the other surface of the flexible substrate 22. On the other hand, the electrode terminals 2201, 2204, 2205, 2208, 2209, and 2212 are feeder electrode terminals for receiving power from outside.

When the electrode terminals are symmetrically arranged on one side in this way, corresponding electrode terminals of light-emitting units can be connected without restraint. Here, the shape of each side that has electrode terminals is not limited to the above example. The shape of electrode terminals having the above property and the connection between such electrode terminals are described in detail later.

Figure 38:
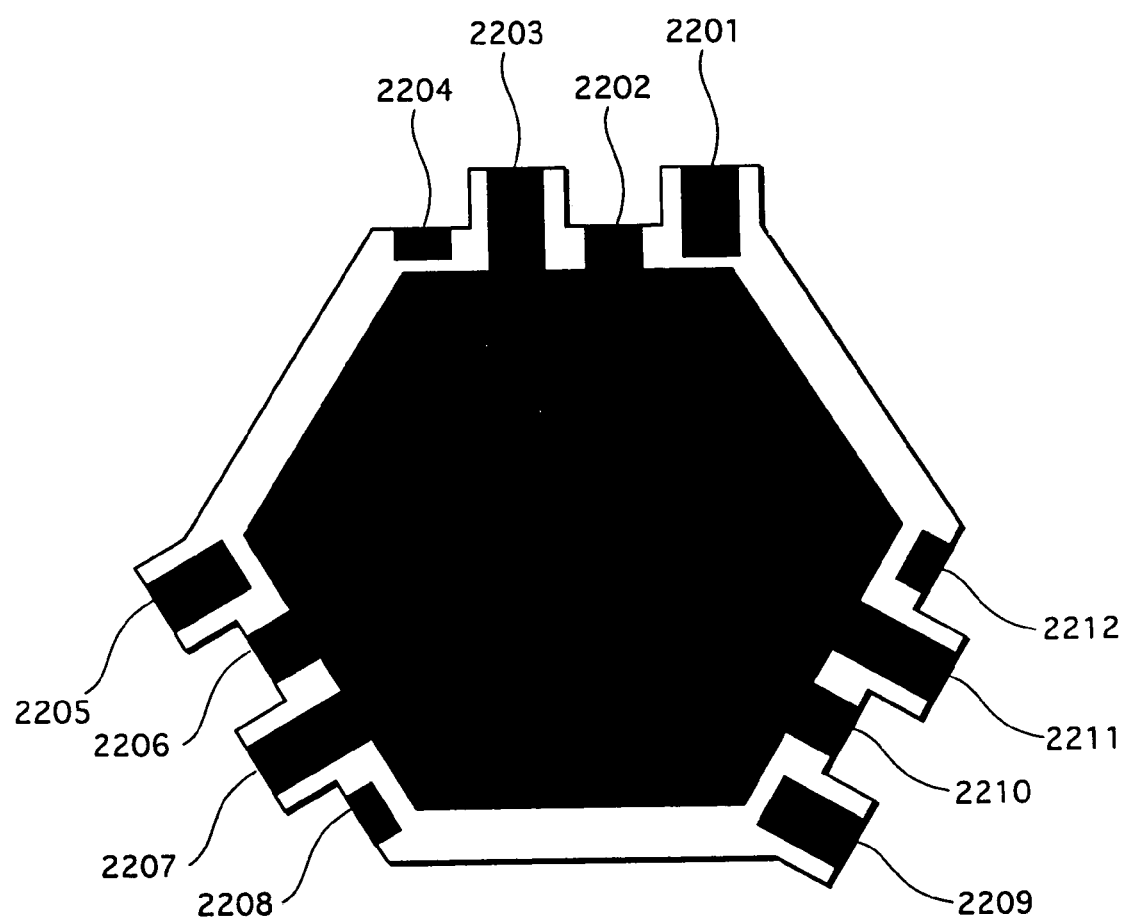
FIG. 38 is a pattern diagram showing example Cu patterns formed on the surface of the flexible substrate opposite to the LED mounting surface.

FIG. 38 shows example Cu patterns formed on the surface of the flexible substrate 22 which is opposite to the LED mounting surface. In the drawing, the Cu patterns are formed on the entire area which corresponds to the area covered with the light diffusion layer 21, to connect the cathodes of the LEDs to the earth electrode terminals. In addition, feeder electrode terminals are formed on the back surface.

The radiating plate 23 serves to efficiently dissipate heat generated by the LEDs mounted on the flexible substrate 22. One surface of the radiating plate 23 is bonded to the flexible substrate 22 using a thermosetting adhesive or the like. Projections and depressions (e.g. a fin structure) are formed on the other surface, to increase the surface area and thereby improve the heat releasing efficiency.

The radiating plate 23 is preferably made of a material having high thermal conductivity. A representative example of such a material is Duralumin. When a conductive material is used for the radiating plate 23, the radiating plate 23 and the flexible substrate 22 need to be isolated from each other by, for example, adhering the radiating plate 23 to the flexible substrate 22 using an insulating adhesive. In this way, a short circuit can be avoided.

Figure 39:
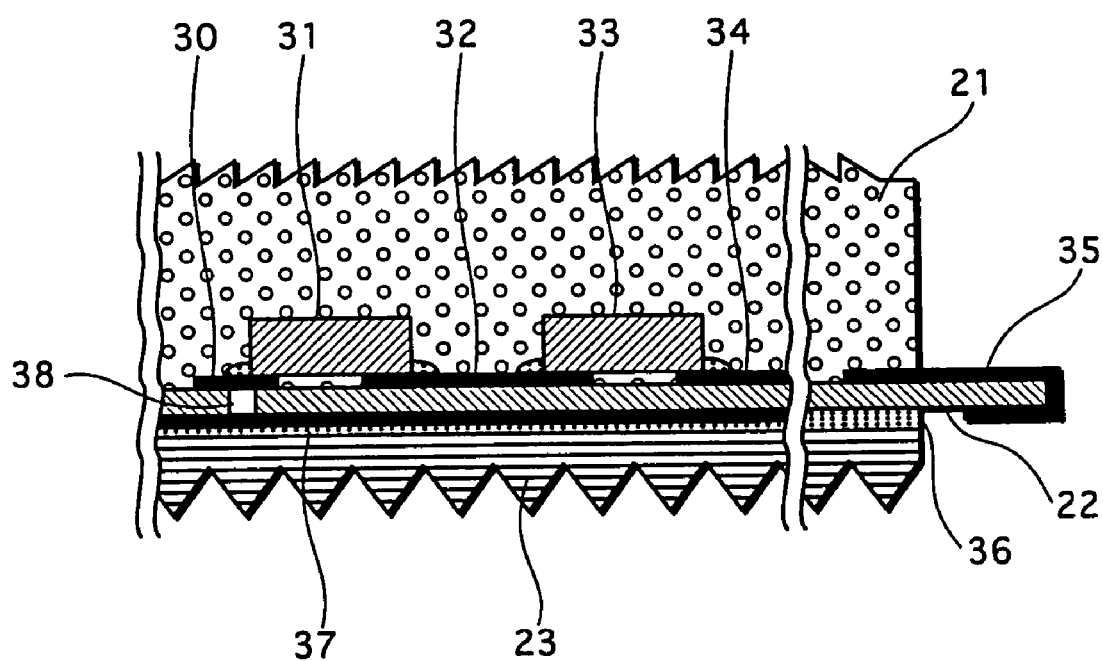
FIG. 39 is a partial sectional view of the light-emitting unit shown in FIG. 36, including LEDs and electrode terminals.

FIG. 39 is a sectional view of a part of the light-emitting unit 2 that includes LEDs and electrode terminals. In the drawing, an LED 31 has its cathode soldered onto a Cu pattern 30, and its anode soldered onto a Cu pattern 32. Likewise, an LED 33 is soldered onto Cu patterns 32 and 34.

The LED 31 is an LED at the low-potential end of a series-connected LED train. The Cu pattern 30 to which the cathode of the LED 31 is soldered is interlayer-connected to a Cu pattern 37 formed on the other surface of the flexible substrate 22 through a via 38. The flexible substrate 22 and the Cu pattern 37 are adhered to the radiating plate 23 by an insulating adhesive layer 36.

As shown in FIG. 38, the Cu pattern 37 is electrically connected to the earth electrode terminals 2202, 2203, 2206, 2207, 2210, and 2211. Meanwhile, the Cu patterns 30, 32, and 34 are electrically connected to the feeder electrode terminals 2201, 2204, 2205, 2208, 2209, and 2212 via Cu patterns and LEDs.

Figure 40:
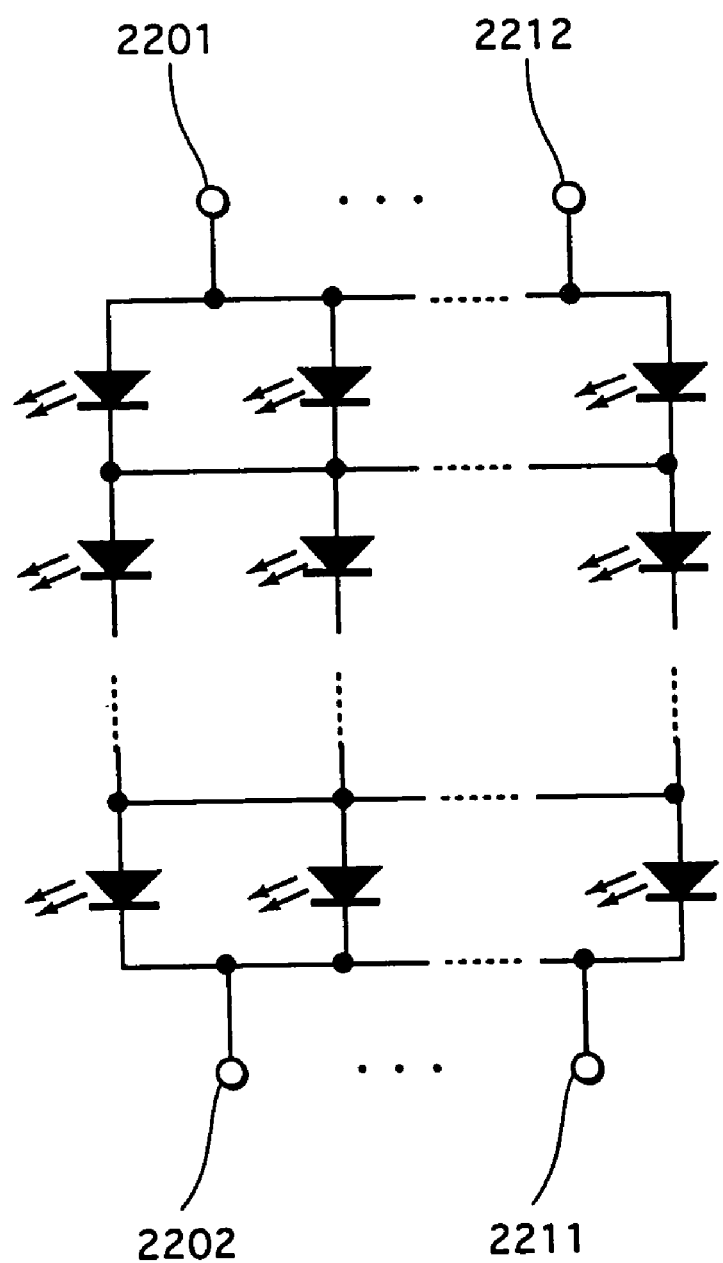
FIG. 40 shows a circuit construction of the light-emitting unit shown in FIG. 36.

FIG. 40 is a circuit diagram showing a circuit construction of the light-emitting unit 2. In the drawing, an electronic circuit 4 has a construction that connects LEDs in the form of mesh. One end of the mesh circuit is equipped with the six feeder electrode terminals 2201, 2204, 2205, 2208, 2209, and 2212, whereas the other end is equipped with the six earth electrode terminals 2202, 2203, 2206, 2207, 2210, and 2211.

The construction of connecting the LEDs in the form of mesh has the following effects. Even when part of the mesh circuit is broken, only one LED fails to illuminate and the other LEDs are not affected at all. Also, even when one LED is broken, the other LEDs are not affected at all. Thus, constructing the electronic circuit 4 in the form of mesh improves the availability of the light-emitting unit 2.

(3. Construction of the Base Unit 30000)

Figure 41:
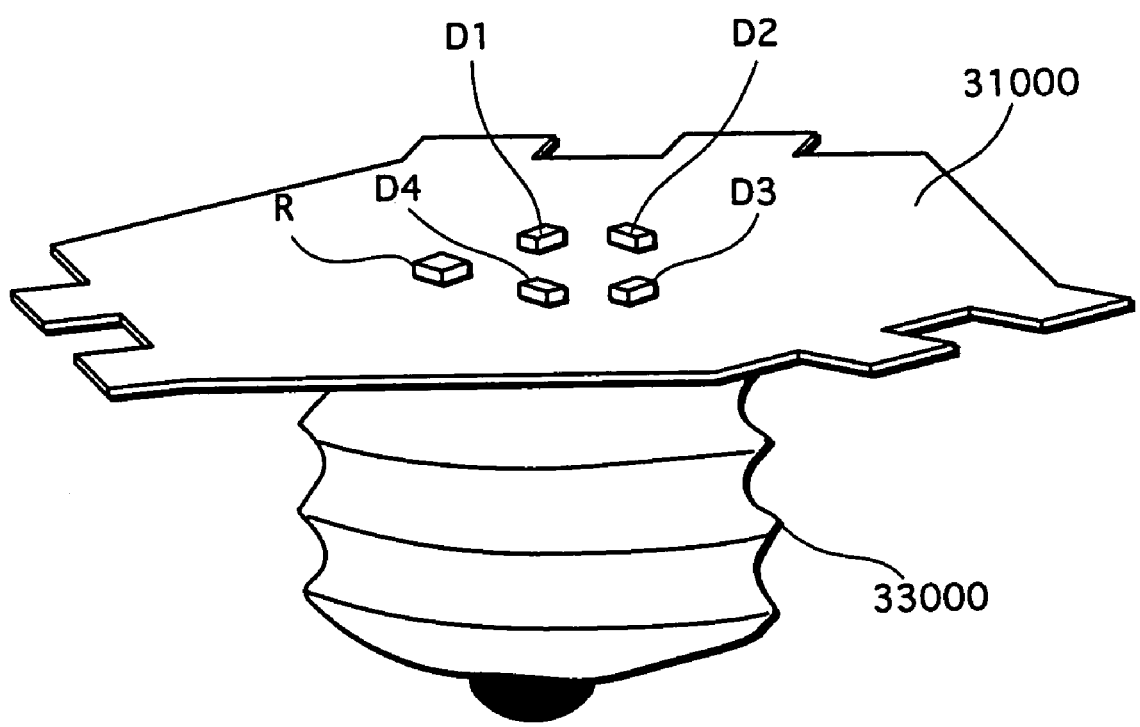
FIG. 41 is a perspective view showing an appearance of a base unit in the lighting apparatus shown in FIG. 35.

FIG. 41 is a perspective view showing an appearance of the base unit 30000. The base unit 30000 has a construction in which the E26 base is attached to a circuit substrate 31000. Diodes D1–D4 and a resistor R are mounted on the circuit substrate 31000. Also, six feeder electrode terminals and six earth electrode terminals are provided on the circuit substrate 31000, like the flexible substrate 22 of the light-emitting unit 2.

Note here that while the feeder electrode terminals of the flexible substrate 22 are electrode terminals for receiving power required to illuminate the LEDs, the feeder electrode terminals of the base unit 30000 are electrode terminals for supplying power to the flexible substrate 22. The base unit 30000 supplies direct current power, using a rectifier circuit composed of the diodes D1–D4 and the like.

Figure 42:
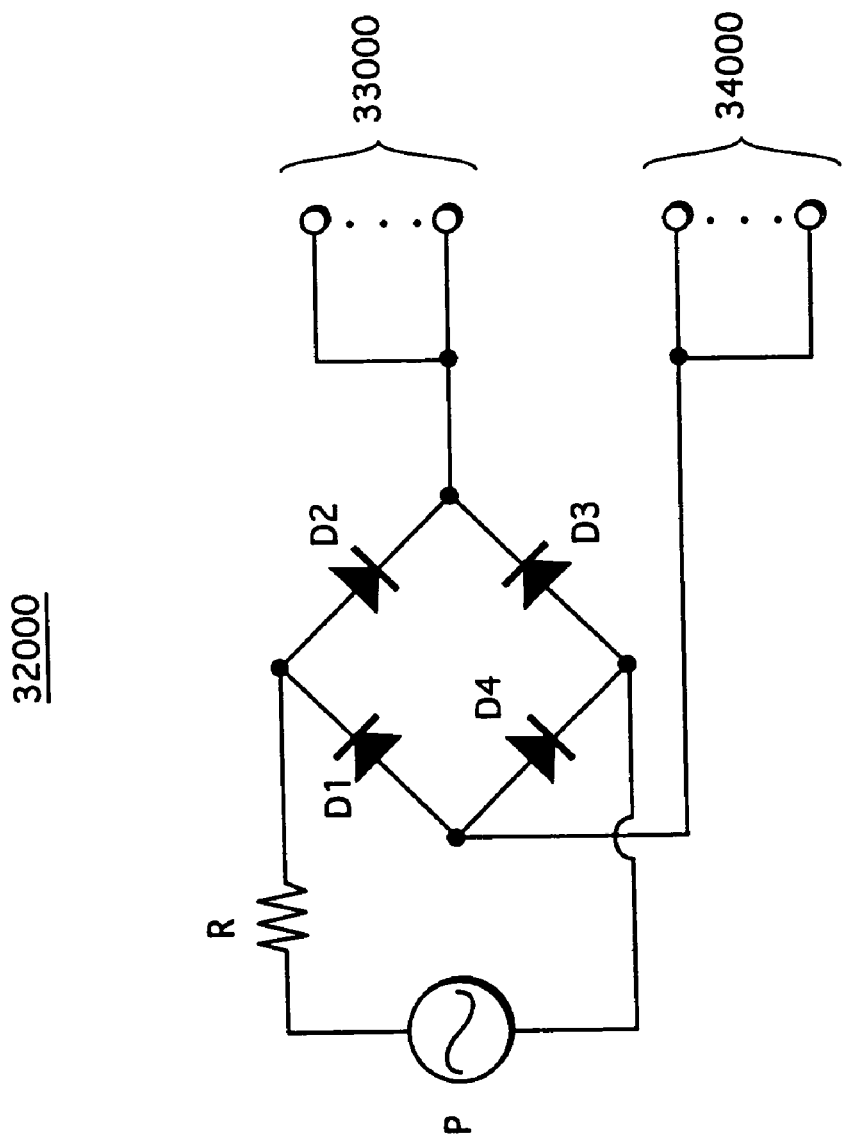
FIG. 42 shows a circuit construction of a rectifier circuit equipped in the base unit shown in FIG. 41.

FIG. 42 shows a circuit construction of the rectifier circuit equipped in the base unit 30000. In the drawing, a rectifier circuit 32000 is a bridge rectifier-circuit in which the diodes D1–D4 are bridge-connected. The bridge-connected diodes D1–D4 rectify alternating current to direct current and supply it to the flexible substrate 22.

It should be obvious that a commercial power supply P (alternating current) shown in FIG. 42 is an external power supply which is independent of the lighting apparatus 1. The lighting apparatus 1 receives power from the alternating current power supply P via the base 33000, and emits light. The resistor R modifies the voltage of the power supplied to the flexible substrate 22. A resistance has been set in the resistor R to achieve a proper voltage level.

(4. Manufacturing Method for the Lighting Apparatus 1)

Figure 43:
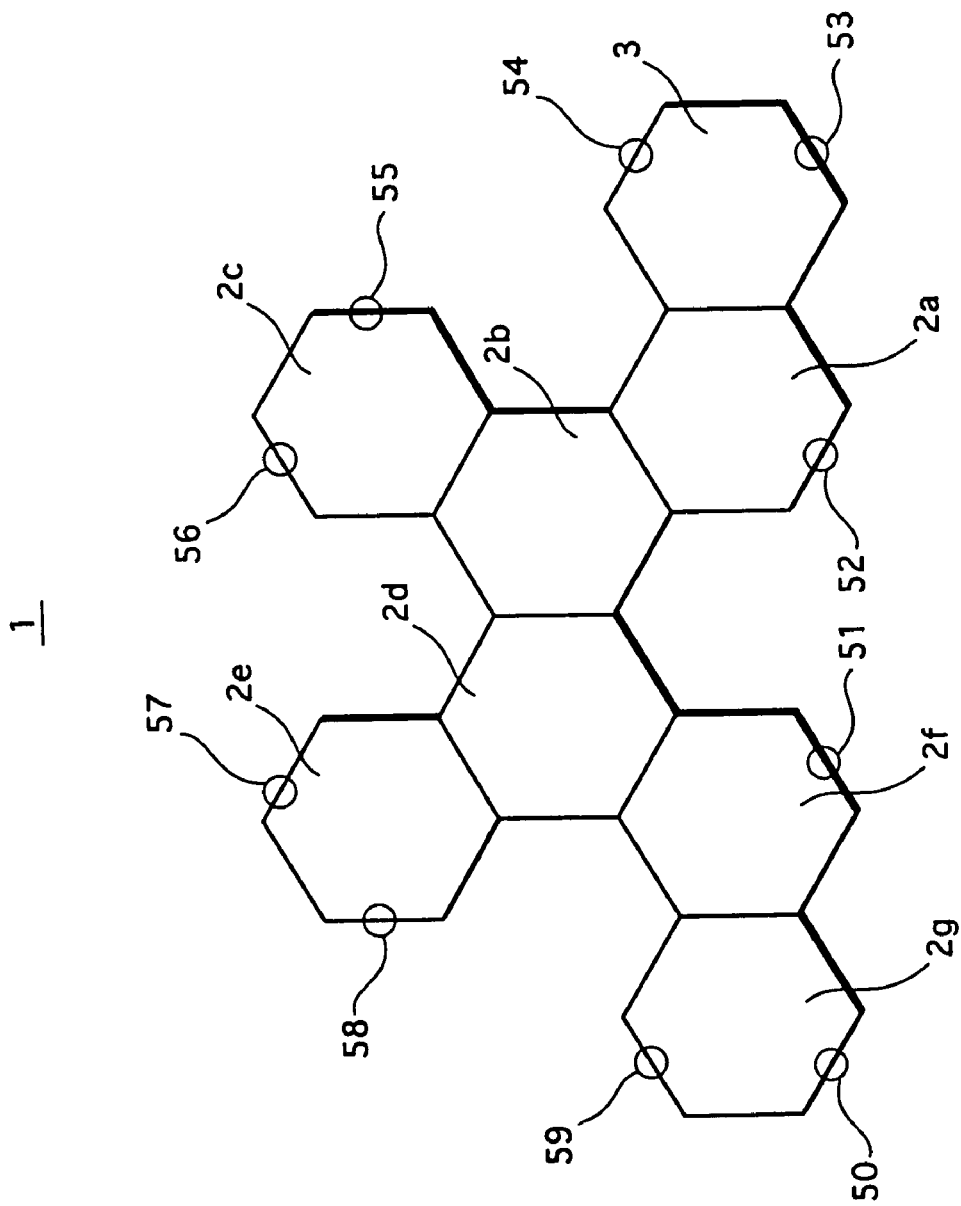
FIG. 43 is a developed plan view of the lighting apparatus shown in FIG. 35.

FIG. 43 is a developed plan view of the lighting apparatus 1. As illustrated, the corresponding sides of the light-emitting units 2a–2g and base unit 30000 are connected using a method which is described later. In addition, a side 50 of the light-emitting unit 2g and a side 53 of the base unit 30000 are connected as an example.

Furthermore, a side 51 of the light-emitting unit 2f and a side 52 of the light-emitting unit 2a, a side 54 of the base unit 30000 and a side 55 of the light-emitting unit 2c, a side 56 of the light-emitting unit 2c and a side 57 of the light-emitting unit 2e, and a side 58 of the light-emitting unit 2e and a side 59 of the light-emitting unit 2g are connected to form a truncated octahedron.

When the lighting apparatus 1 is developed into a plane figure, the LED mounting surfaces of the light-emitting units 2a–2g face in the same direction. Also, the surface of the base unit 30000 on which the base 30 is mounted faces in the same direction as the LED mounting surfaces of the light-emitting units 2a–2g. In other words, the radiating plates 23 of the light-emitting units 2a–2g and the surface of the base unit 30000 on which the diodes D1–D4 are mounted face in the opposite direction.

The light-emitting units 2a–2g and the base unit 30000 are electrically and mechanically connected using soldering. The electrode terminals are formed on the flexible substrate 22 of each of the light-emitting units 2 and base unit 30000, and the flexible substrate 22 has flexibility. Which is to say, a solid shape (a truncated octahedron in this embodiment) can be obtained by bending these units in predetermined directions.

The parts of the flexible substrate 22 other than the electrode terminals are reinforced by the radiating plate 23. Accordingly, those parts of the flexible substrate 22 will not bend after the solid shape is obtained. This prevents problems caused by the bending of the flexible substrate 22. The problems include the Cu patterns peeling away from the flexible substrate 22, the LEDs being detached from the flexible substrate 22, and the light diffusion layer 21 peeling away from the flexible substrate 22.

Figure 44:
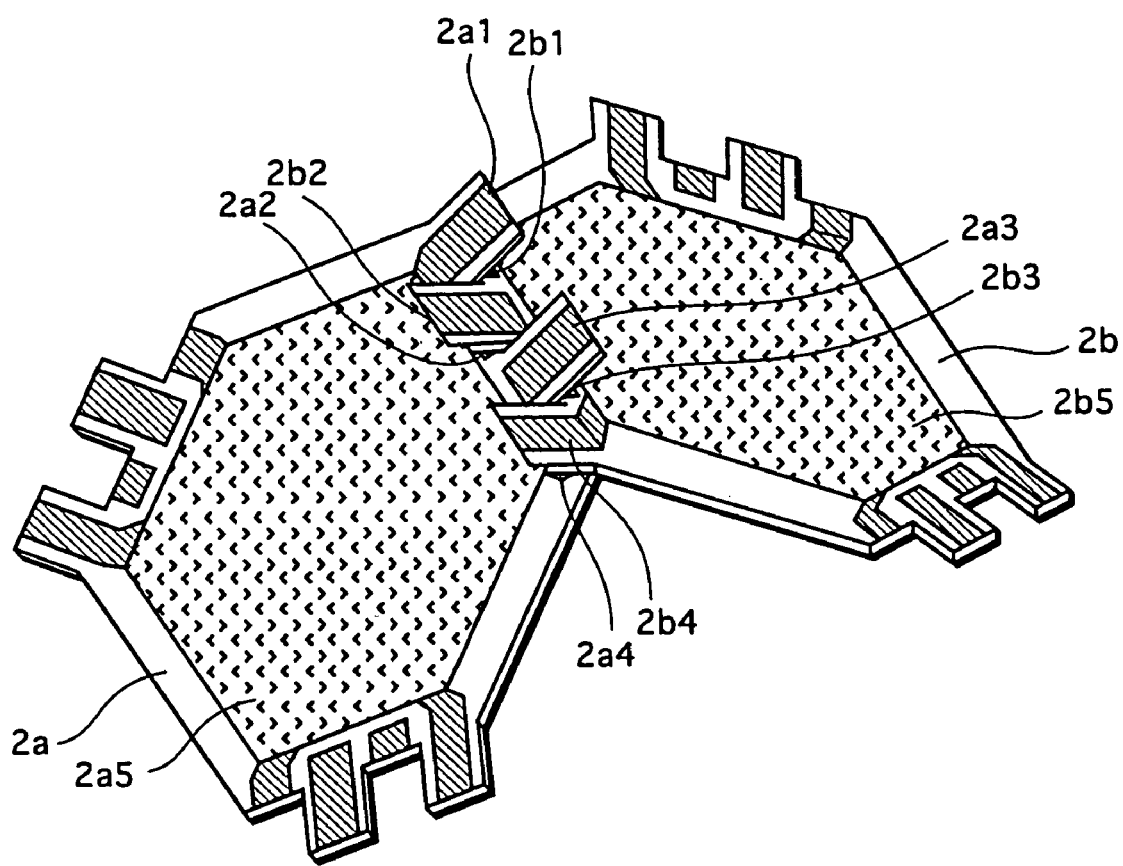
FIG. 44 is a perspective view showing how to connect one light-emitting unit with another, to assemble the lighting apparatus shown in FIG. 35.

Two light-emitting units 2 or a light-emitting unit 2 and the base unit 30000 are connected to each other by soldering their electrode terminals. FIG. 44 is a perspective view showing how to connect the light-emitting units 2a and 2b, as an example connection. In the drawing, the light-emitting units 2a and 2b are combined so that the electrode terminals of the facing sides engage with each other.

This being so, the angle formed by the light-emitting units 2a and 2b is gradually changed so that eventually their corresponding electrode terminals are placed one on top of the other. In more detail, the light-emitting units 2a and 2b are combined so that an electrode terminal 2a1 is placed on top of an electrode terminal 2b1, an electrode terminal 2b2 on top of an electrode terminal 2a2, an electrode terminal 2a3 on top of an electrode terminal 2b3, and an electrode terminal 2b4 on top of an electrode terminal 2a4.

Once the electrode terminals are placed in this way, the corresponding electrode terminals are soldered to each other. Here, a light diffusion layer 2a5 of the light-emitting unit 2a and a light diffusion layer 2b5 of the light-emitting unit 2b are on the same side. By soldering the four pairs of corresponding electrode terminals to each other, the light-emitting units 2a and 2b are connected flexibly due to the flexibility of the electrode terminals 2a1, 2a3, 2b2, and 2b4.

Figure 45:
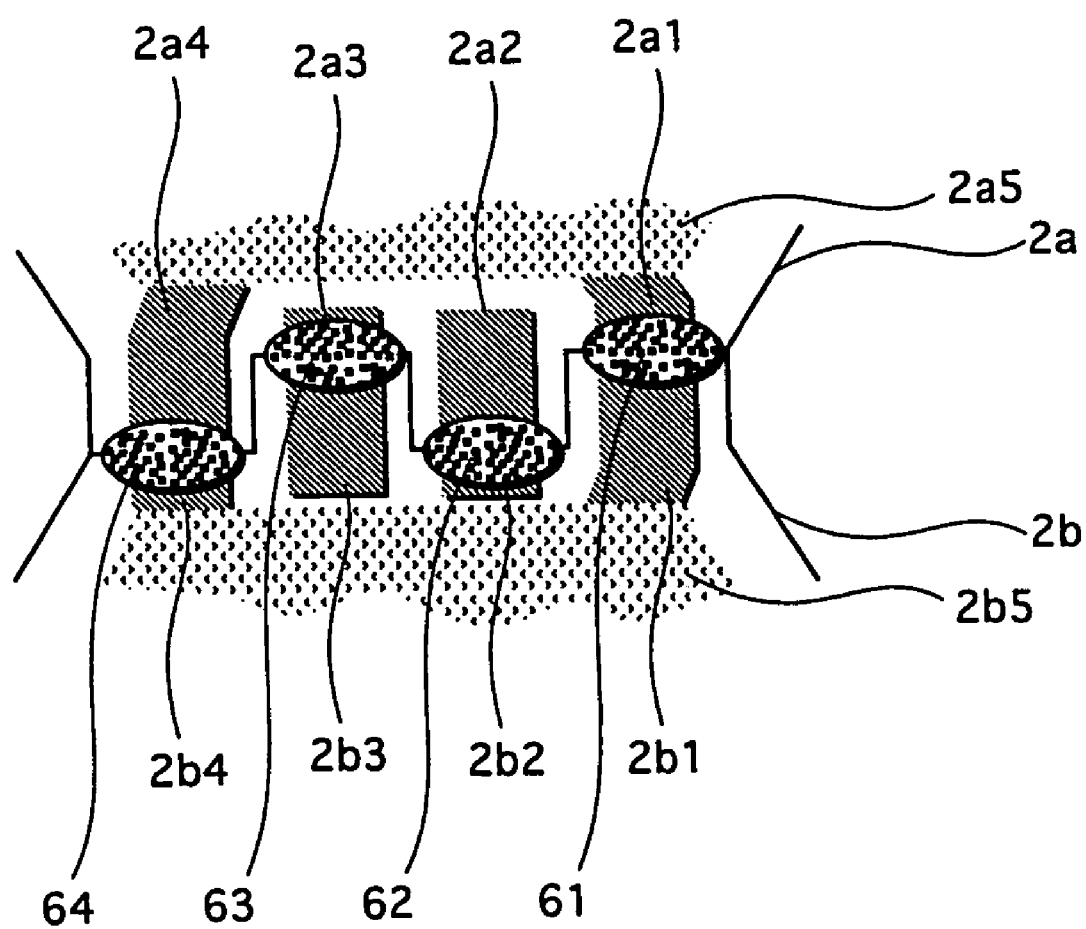
FIG. 45 shows the connecting parts of the two light-emitting units around electrode terminals.

FIG. 45 shows the connection between the light-emitting units 2a and 2b. As can be seen from the drawing, the electrode terminals 2a1 and 2b1 are soldered by solder 61. In the same manner, the electrode terminals 2a2 and 2b2 are soldered by solder 62, the electrode terminals 2a3 and 2b3 by solder 63, and the electrode terminals 2a4 and 2b4 by solder 64.

To protect the light diffusion layers 2a5 and 2b5 and not to block passage of light emitted from the LEDs, the solder 61–64 is applied so as not to be in contact with the light diffusion layers 2a5 and 2b5. Also, the solder 61–64 is kept from coming into contact with each other, to prevent a short circuit. Once the light-emitting units 2a–2g and the base unit 30000 have been connected at their corresponding sides in this manner, the lighting apparatus 1 is complete.

Though the above embodiment takes an example of a truncated octahedral lighting apparatus, lighting apparatuses of various shapes of flat and solid appearances can be assembled from the above described light-emitting units. Also, since each light-emitting unit has electrode terminals only on the sides which are necessary to assemble the lighting apparatus, the wiring is simplified and wiring failures are greatly reduced.

In more detail, each regular hexagon of the truncated octahedron is connected to other regular hexagons only on three sides. Accordingly, electrode terminals are provided only on the three sides of each regular hexagon. In this way, unnecessary electrode terminals are omitted and wiring failures are reduced, when compared with the case where electrode terminals are provided on all sides.

Moreover, by providing the electrode terminals which project outward, the light-emitting units can be easily positioned when connecting them together. As a result, soldering failures can be avoided. In other words, by engaging the corresponding electrode terminals with each other in the aforementioned fashion, the electrode terminals are securely placed one on top of the other, as a result of which a failure of soldering a wrong pair of electrode terminals can be avoided.

Also, the polyhedral lighting apparatus is constructed in which some faces are formed from light-emitting units and the remaining faces are used as openings. This allows passage of the air through the polyhedron. Hence the heat generated from the LEDs can be efficiently released to the outside.

Although the present invention has been described based on the third embodiment, the invention should not be limited to such. For example, the following modifications are possible.

(Modifications)

(1) The third embodiment describes the case where the electronic circuit including the LEDs mounted on the light-emitting unit is formed in mesh, but the following circuit construction may instead be used to deliver light of desired colors using different-colored LEDs.

Figure 46:
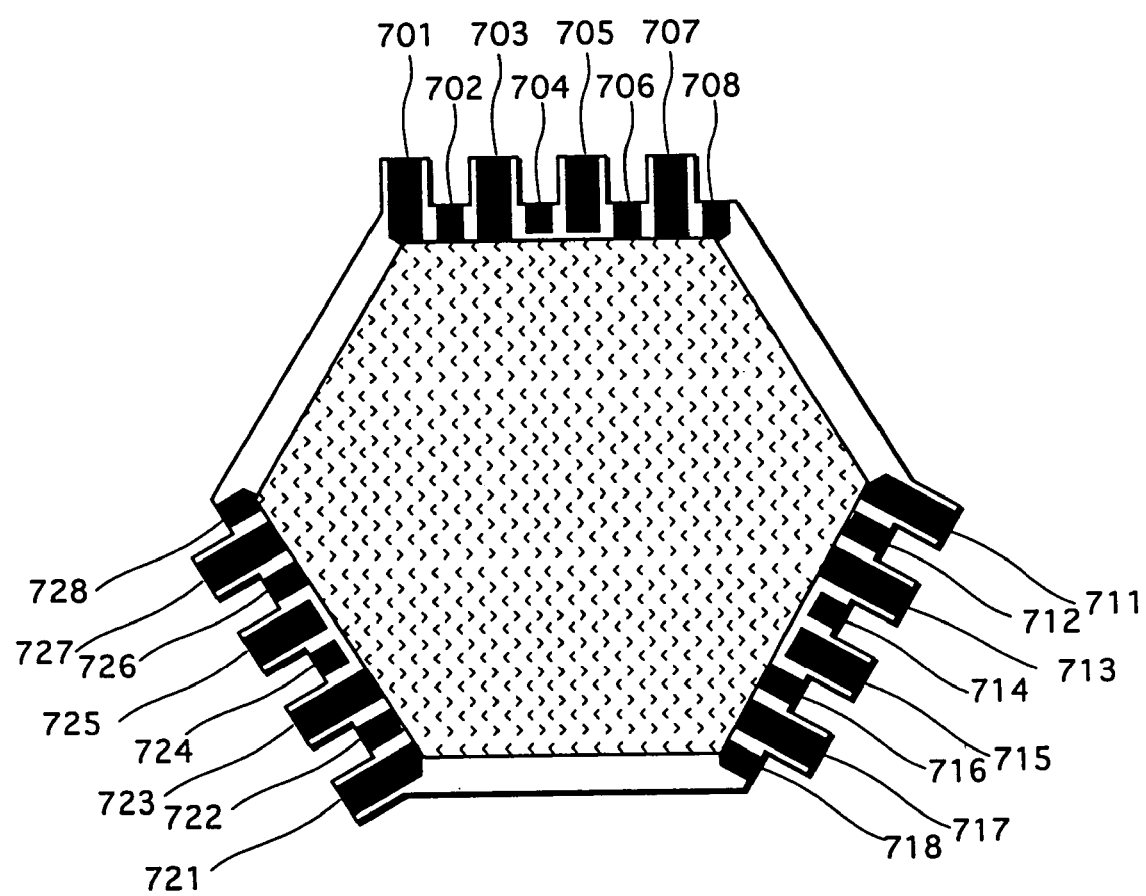
FIG. 46 is a plan view of a light-emitting unit to which the modification (1) of the third embodiment relates, looked at from the light diffusion layer side.

For example, to form a truncated octahedral lighting apparatus by mounting LEDs of the three colors of red, green, and blue on each regular hexagonal light-emitting unit as in the above embodiment, three circuits corresponding to the three colors are provided. FIG. 46 is a plan view of a light-emitting unit 70 to which this modification relates, looked at from the light diffusion layer side. The light-emitting unit 70 has eight electrode terminals on each of the three alternate sides, the eight electrode terminals being made up of four pairs of electrode terminals that are a pair of red feeder electrode terminals, a pair of green feeder electrode terminals, a pair of blue feeder electrode terminals, and a pair of earth electrode terminals.

The arrangement order of the eight electrode terminals is, from both ends of the side, the red feeder electrode terminal→the green feeder electrode terminal→the blue feeder electrode terminal→the earth electrode terminal. In FIG. 46, electrode terminals 701, 708, 711, 718, 721, and 728 are red feeder electrode terminals, electrode terminals 702, 707, 712, 717, 722, and 727 are green feeder electrode terminals, electrode terminals 703, 706, 713, 716, 723, and 726 are blue feeder electrode terminals, and electrode terminals 704, 705, 714, 715, 724, and 725 are earth electrode terminals.

Figure 47:
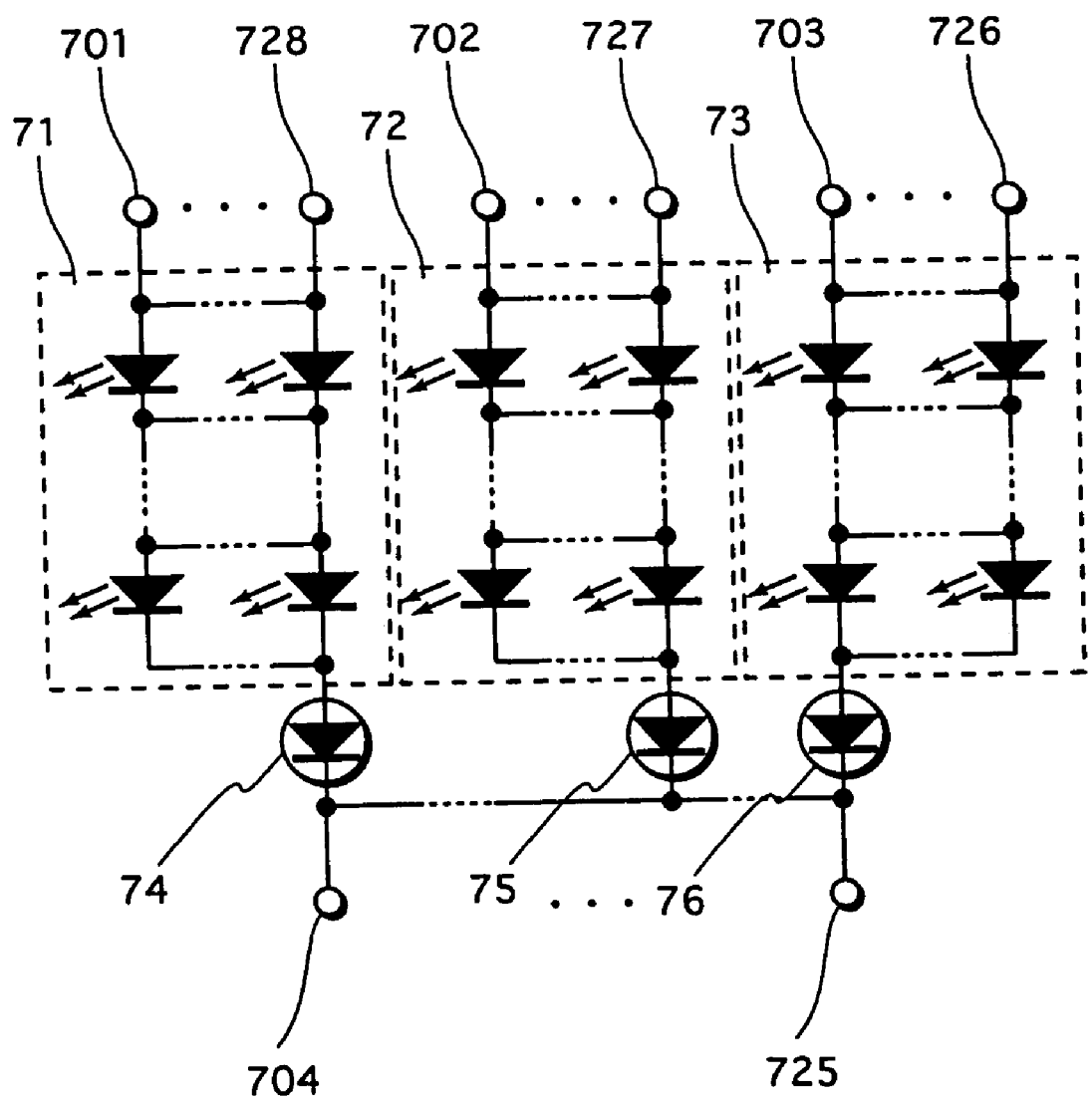
FIG. 47 shows an electronic circuit made up of different-colored LEDs and electrode terminals in the light-emitting unit shown in FIG. 46.

FIG. 47 shows an electronic circuit made up of different-colored LEDs and electrode terminals. In the drawing, the LEDs form mesh circuits 71 (red), 72 (green), and 73 (blue) for the three colors. Electrode terminals of a corresponding color among the electrode terminals 701–726 are connected to each mesh circuit. Furthermore, diodes 74, 75, and 76 for circuit protection are connected to the mesh circuits.

The circuit protection diode 74–76 are connected in accordance with the rated amounts of current of the three colors, to prevent the LEDs from being broken due to overcurrent. The circuit protection diodes 74–76 are eventually connected to the earth electrode terminals 704, 705, 714, 715, 724, and 725.

Through the use of such light-emitting units, a lighting apparatus that generates light of desired colors can be obtained by combining various LEDs. Here, different-colored LEDs should preferably be evenly scattered in each light-emitting unit. For example, when using LEDs of four colors, the LEDs are positioned on lattice points so that four LEDs on any four adjacent lattice points differ in color.

Also, when using LEDs of three colors, the LEDs are positioned so that every hexagon of a hexagonal lattice has on its lattice points six LEDs made up of three pairs of same-colored LEDs. In this way, the colors of light emitted from the LEDs can be mixed efficiently.

The effects of the invention can be achieved using other constructions. Also, the arrangement order of electrode terminals is not limited to the above order. Moreover, colors other than the aforementioned colors may be used.

(2) The third embodiment describes the case where alternating electrode terminals are projected to form a comblike shape, to securely place the corresponding electrode terminals one on top of the other. As alternatives, the following constructions may be used.

Figure 48:
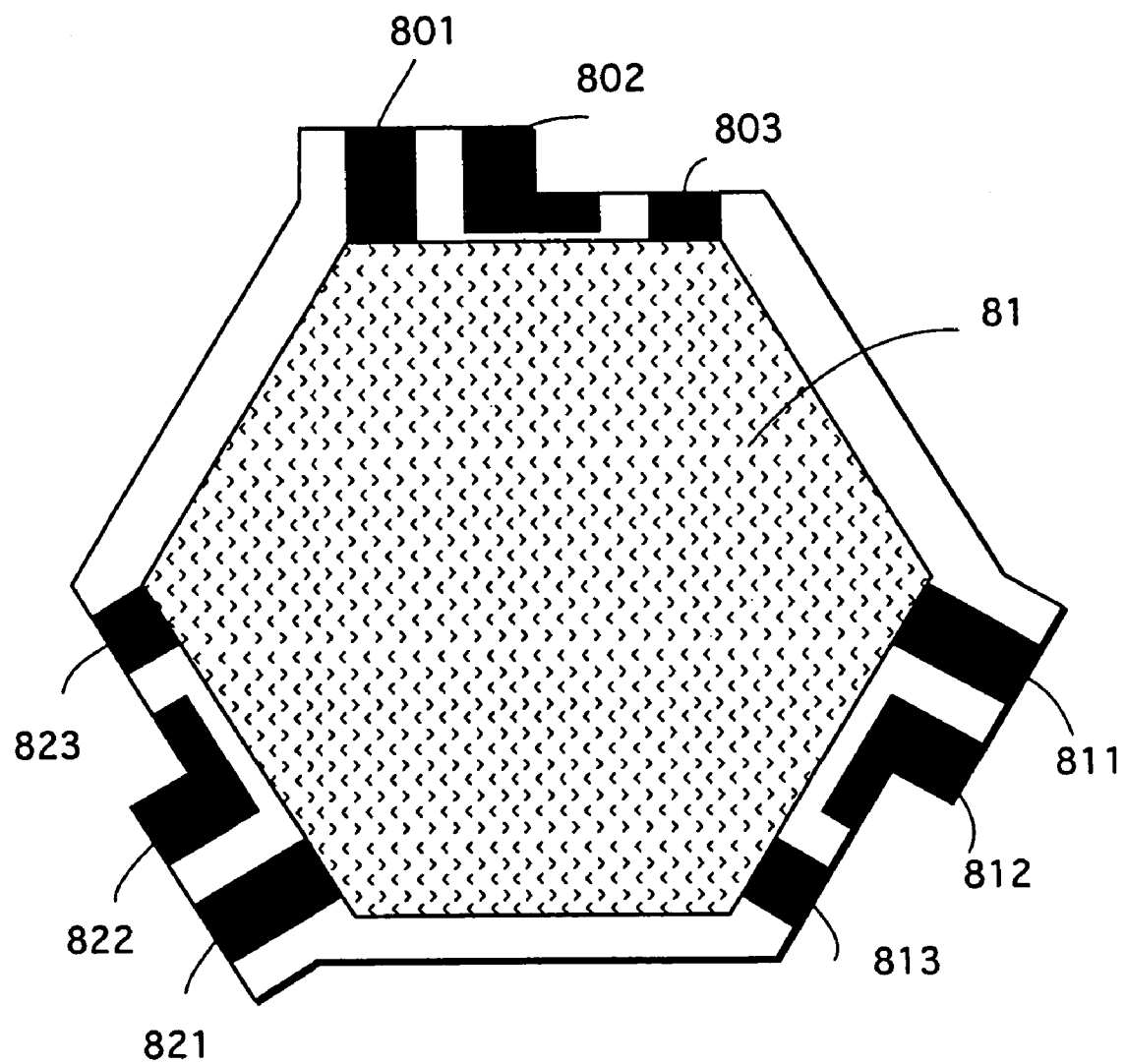
FIG. 48 is a plan view of a light-emitting unit to which the modification (2a) of the third embodiment relates, looked at from the light diffusion layer side.

(2a) FIG. 48 is a plan view of a light-emitting unit 800 to which this modification relates, looked at from the side of a light diffusion layer 81. The light-emitting unit 800 has a pair of projection and depression on each of the three sides on which electrode terminals are formed. Which is to say, on the side where feeder electrode terminals 801 and 803 and an earth electrode terminal 802 are provided, the electrode terminal 801 and the half of the electrode terminal 802 are projected outward.

Likewise, on the side where feeder electrode terminals 811 and 813 and an earth electrode terminal 812 are provided, the electrode terminal 811 and the half of the electrode terminal 812 are projected outward. On the side where feeder electrode terminals 821 and 823 and an earth electrode terminal 822 are provided, the electrode terminal 821 and the half of the electrode terminal 822 are projected outward.

With this construction, the electrode terminals can be engaged with each other more easily and quickly and so they can be positioned and soldered properly, when compared with the above embodiment. Here, the soldering should be performed such that the solder will not be in contact with a light diffusion layer 81, to protect the light diffusion layer 81 and not to block passage of emitted light.

(2b) In the above example, projection(s) and depression(s) are formed on each predetermined side of a light-emitting unit and are engaged with projection(s) and depression(s) formed on a side of another light-emitting unit, thereby connecting the two light-emitting units. Instead of forming projection(s) and depression(s), however, two light-emitting units may be connected using a flexible joint plate.

FIGS. 49A and 49B are plan views showing a light-emitting unit and a flexible joint plate. FIG. 49A is a plan view of a light-emitting unit 900 looked at from the side of a light diffusion layer 91. The light-emitting unit 900 is equipped with two feeder electrode terminals and one earth electrode terminal on each of the three alternate sides.

In detail, electrode terminals 901, 903, 911, 913, 921, and 923 are feeder electrode terminals, whereas electrode terminals 902, 912, and 922 are earth electrode terminals. Fitting depressions 904, 914, and 924 are provided at the center of the electrode terminals 902, 912, and 922, and are used to fix joint plates.

FIG. 49B is a plan view of a joint plate 930 looked at from the side of a surface on which Cu patterns have been formed. The other surface of the joint plate 930 (not illustrated) is coated with a paint of an appropriate color that matches the design of the lighting apparatus. The joint plate 930 is a flexible substrate made of a polyimide or the like, and has flexibility.

The joint plate 930 has three Cu patterns 931, 932, and 933, in correspondence with two feeder electrode terminals and one earth electrode terminal formed on one side of a light-emitting unit. Two projections 934 and 935 are provided on the Cu pattern 932, which are to be fitted into any of the fitting depressions 904, 914, and 924 to connect the joint plate 930 and the two light-emitting units 900.

Once the joint plate 930 has been connected to the two light-emitting units 900, the corresponding electrode terminals of the two light-emitting units 900 are electrically connected by the Cu patterns 931–933.

(2c) When the two light-emitting units are connected to each other using the flexible joint plate in the above way, the following connection method may be employed.

Figure 50A:
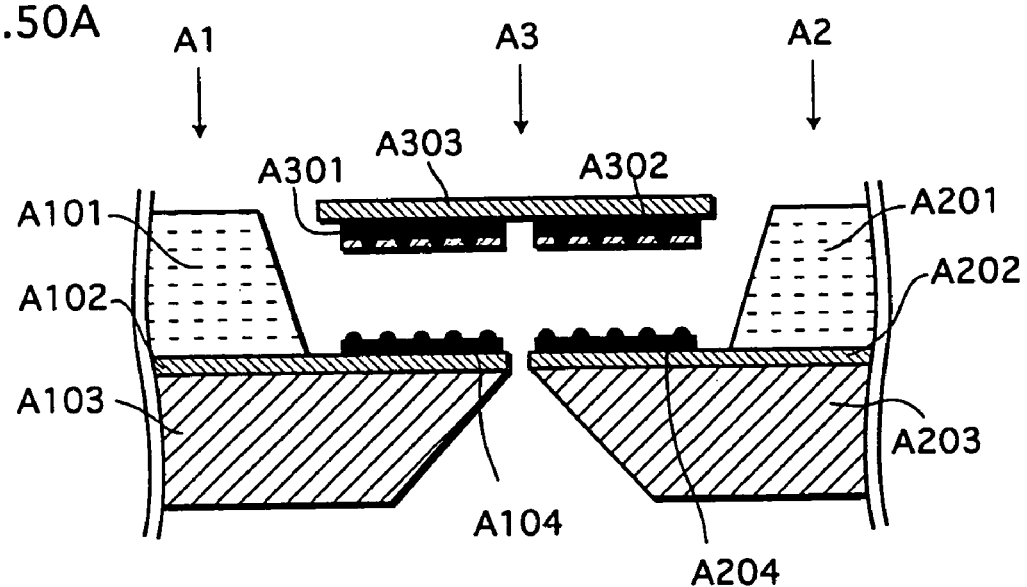
FIGS. 50A and 50B show a joint plate to which the modification (2c) of the third embodiment relates and light-emitting units which are connected by the joint plate.
Figure 50B:
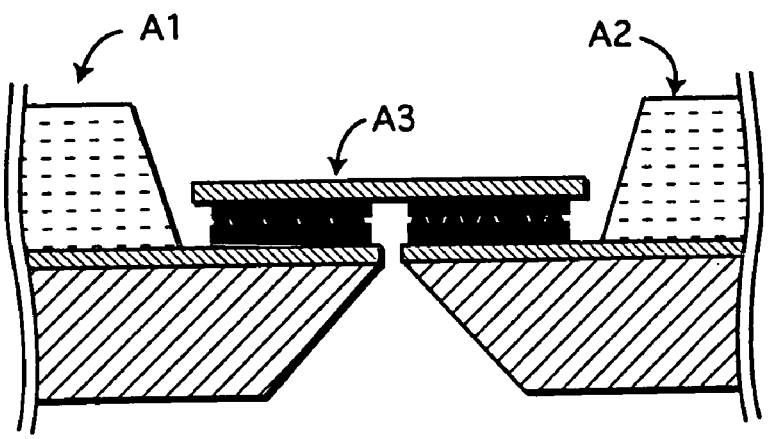

FIGS. 50A and 50B each show two light-emitting units and one joint plate. FIG. 50A shows the two light-emitting units and the joint plate before connection, whereas FIG. 50B shows the two light-emitting units and the joint plate after connection. These drawings mainly show cross-sections of electrode terminal parts of the two light-emitting units and the like, for purposes of illustration.

In FIG. 50A, light-emitting units A1 and A2 are about to be connected using a joint plate A3. The light-emitting units A1 and A2 are roughly made up of light diffusion layers A101 and A201, flexible substrates A102 and A202, and radiating plates A103 and A203, respectively. The light-emitting units A1 and A2 are also equipped with electrode terminals A104 and A204 respectively.

The joint plate A3 is equipped with electrode terminals A301 and A302 and a flexible substrate A303. A number of bumps are formed on the surfaces of the electrode terminals A104, A204, A301, and A302. The electrode terminals A301 and A302 of the joint plate A3 are coated with an adhesive of epoxy, polyimide, or similar, and pressed onto the electrode terminals A104 and A204.

FIG. 50B shows the state where the electrode terminal A301 of the joint plate A3 has been pressed onto the electrode terminal A104 of the light-emitting unit A1 and the electrode terminal A302 of the joint plate A3 has been pressed onto the electrode terminal A204 of the light-emitting unit A2. The bumps formed on the electrode terminals are crushed by pressing, as a result of which the electrode terminals are securely connected to each other.

By using the joint plate in this way, the labor of connecting the electrode terminals is reduced when compared with the case where soldering is used. Also, by tilting the outer edges of the radiating plates A103 and A203 as shown in FIGS. 50A and 50B, it is possible to avoid a problem in which the edges of the radiating plates of adjacent light-emitting units collide with each other and as a result the connecting parts of the adjacent light-emitting units become unable to be bent, when manufacturing a lighting apparatus of a solid appearance. Hence the design freedom of the solid lighting apparatus can be ensured.

Figure 51A:
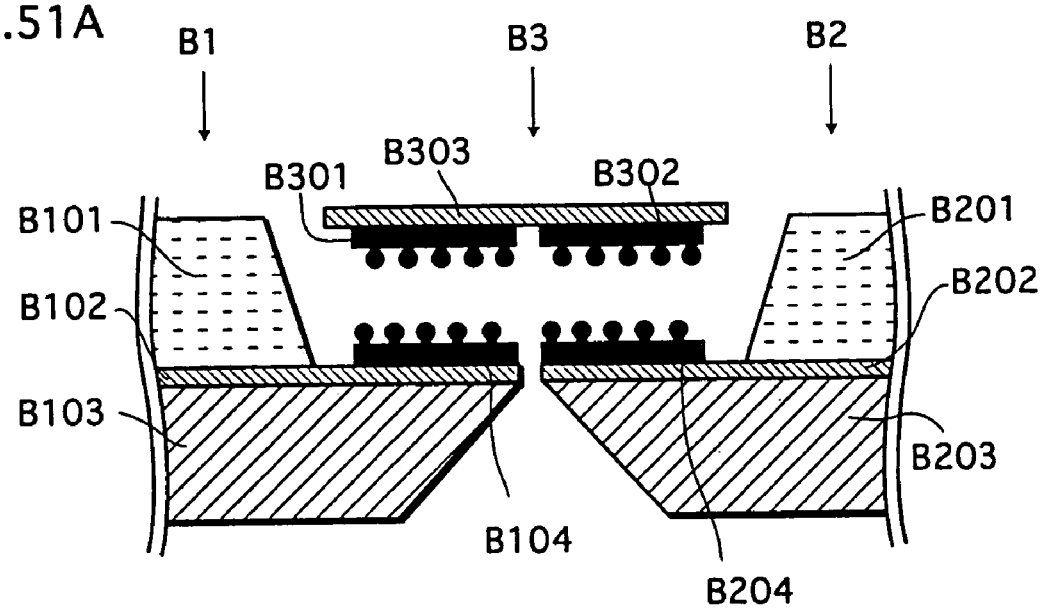
FIGS. 51A and 51B show a joint plate to which the modification (2d) of the third embodiment relates and light-emitting units which are connected by the joint plate.
Figure 51B:
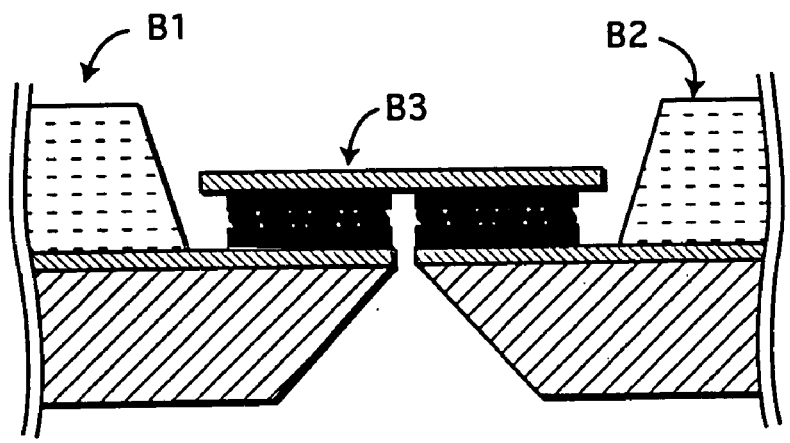

(2d) To further reduce the labor of connecting the electrode terminals, the following connection method may be employed. FIGS. 51A and 51B each show two light-emitting units and one joint plate. FIG. 51A shows the two light-emitting units and the joint plate before connection, whereas FIG. 51B shows the two light-emitting units and the joint plate after connection. FIGS. 51A and 51B show cross-sections of the light-emitting units and the like, as in FIGS. 50A and 50B.

In FIG. 51A, light-emitting units B1 and B2 are equipped with light diffusion layers B101 and B201, flexible substrates B102 and B202, radiating plates B103 and B203, and electrode terminals B104 and B204, respectively. A joint plate B3 is equipped with electrode terminals B301 and B302 and a flexible substrate B303.

The surfaces of the electrode terminals B104, B204, B301, and B302 are sheet fasteners such as Multilock (a trademark of Kuraray Co., Ltd). These sheet fasteners have conductivity. As one example, many mushroom-shaped projections made of a resin such as a polyimide are formed on the surfaces of the electrode terminals B104, B204, B301, and B302, and the electrode terminal surfaces including these projections are plated using a highly-conductive metal (e.g. gold or copper).

When the electrode terminals are formed in this way, the electrode terminals can be easily connected by engaging the projections of the electrode terminals with each other, so that an adhesive need not be used. Also, since the electrode terminals are removably connected, if one of the light-emitting units that compose the lighting apparatus is broken, that light-emitting unit can be removed and replaced with a new light-emitting unit.

As an alternative, the electrode terminals of the light-emitting units may be formed from conductive sheet fasteners, so that the light-emitting units can be connected together without using a joint plate.

Figure 52A:
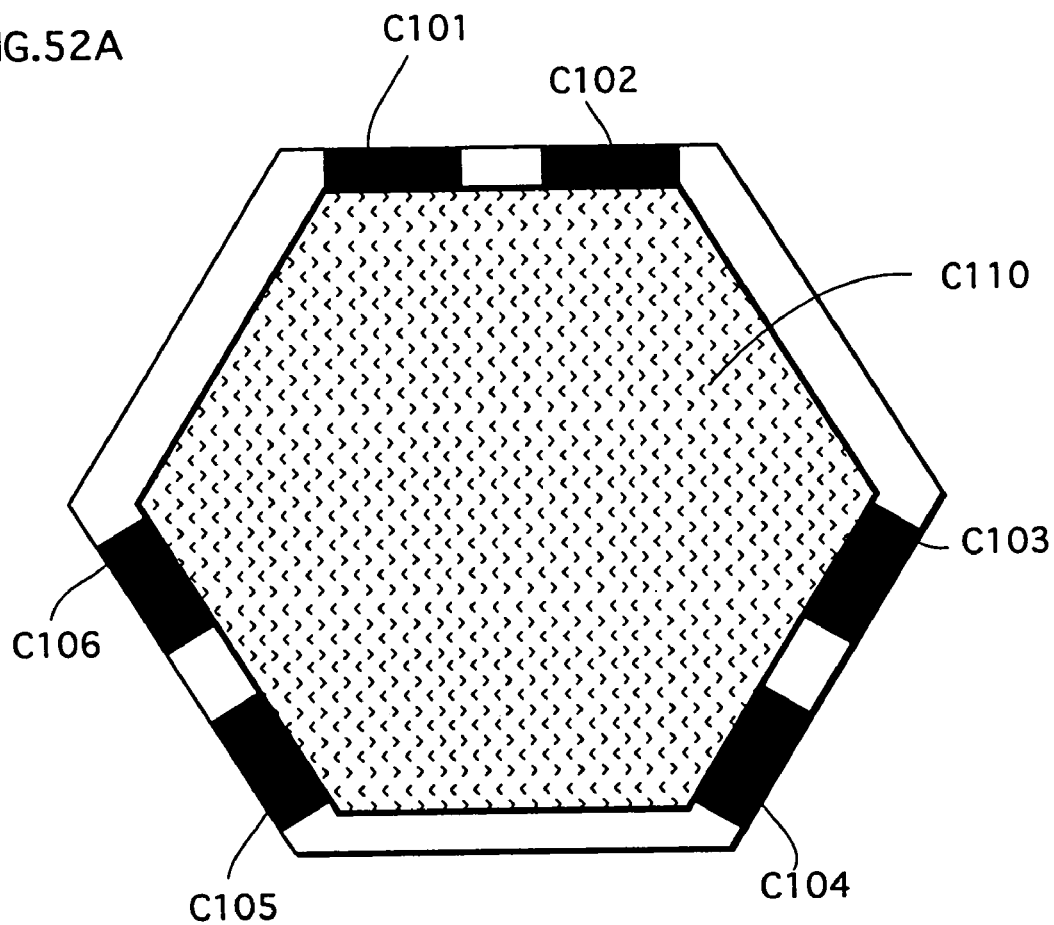
FIG. 52A shows a light-emitting unit to which the modification (3) of the third embodiment relates.
Figure 52B:
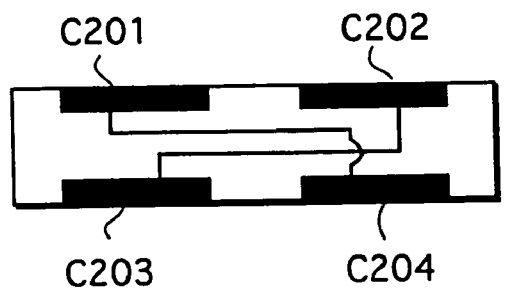
FIG. 52B shows a joint plate for connecting the light-emitting unit shown in FIG. 52A with another light-emitting unit of the same type.

(3) The above embodiment and modifications describe the case where electrode terminals are symmetrically arranged on each predetermined side of a light-emitting unit, but this can be modified as follows. FIGS. 52A and 52B are plan views showing a light-emitting unit and joint plate to which this modification relates.

FIG. 52A is a plan view of a light-emitting unit C1 looked at from the side of a light diffusion layer C110. Electrode terminals are formed on three sides of the hexagonal light-emitting unit C1. Electrode terminals C101, C103, and C105 are earth electrode terminals, whereas electrode terminals C102, C104, and C106 are feeder electrode terminals. The earth and feeder electrode terminals are arranged with the same positional relationship on each side.

FIG. 52B shows a joint plate C2 for connecting two light emitting units C1, looked at from the electrode terminal side. In the drawing, the joint plate C2 has four electrode terminals C201–C204. The electrode terminals C201 and C204 and the electrode terminals C202 and C203 are connected to each other so that the same types of electrode terminals are connected between the two light-emitting units C1.

Note here that the connection relationship between the electrode terminals C201–C204 is only schematically shown in FIG. 52B. To connect the electrode terminals C201–C204 in the joint plate C2, Cu patterns for connecting the electrode terminals C201–C204 may be provided on the surface of the joint plate C2 which is opposite to the electrode terminals C201–C204. To connect the electrode terminals of the light-emitting units C1 to the electrode terminals of the joint plate C2, the aforementioned connection methods such as soldering may be used.

By doing so, the number of electrode terminals formed on each predetermined side of a light-emitting unit can be reduced, with it being possible to miniaturize the light-emitting unit itself. This widens the design possibility of the lighting apparatus. Also, the adoption of such a simple construction reduces the occurrence of defective items and improve the quality in mass production.

Figure 53A:
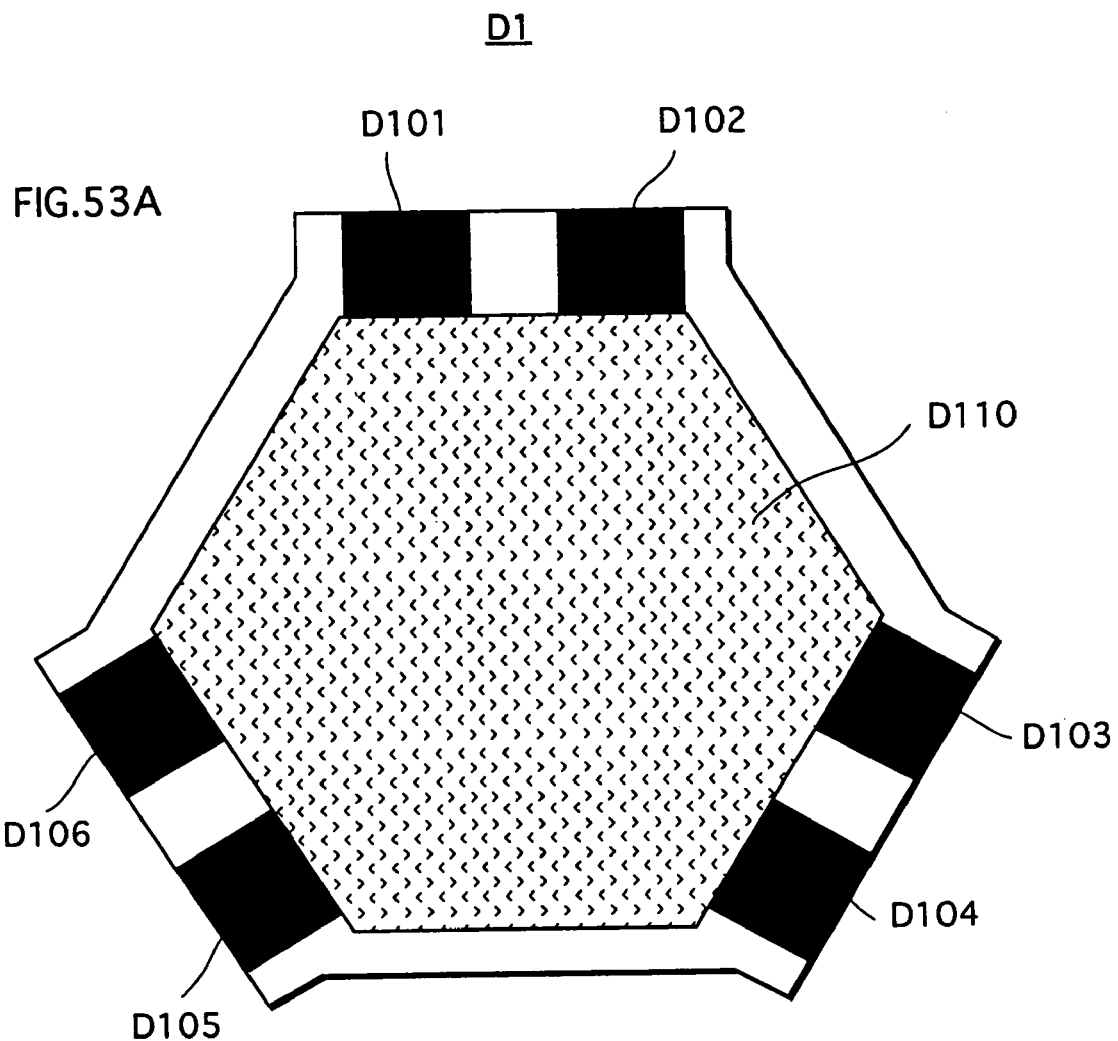
FIG. 53A shows a light-emitting unit to which the modification (4) of the third embodiment relates.
Figure 53B:
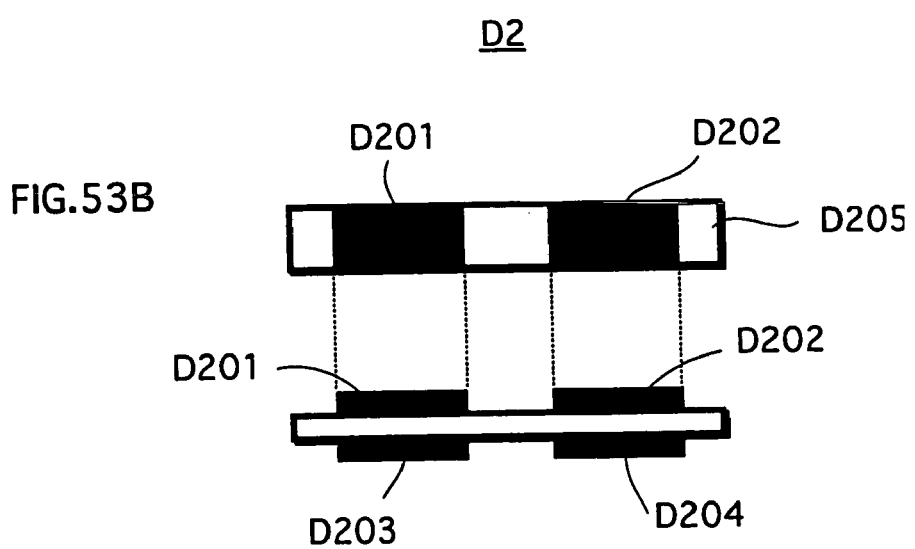
FIG. 53B shows a joint plate for connecting the light-emitting unit shown in FIG. 53A with another light-emitting unit of the same type.

(4) The above modifications describe the case where the joint plate has flexibility, but this maybe modified as follows. FIGS. 53A and 53B show a light-emitting unit D1 and a joint plate D2 to which this modification relates. FIG. 53A is a plan view of the light-emitting unit D1 looked at from the side of a light diffusion layer D110, whereas FIG. 53B is a plan view and top view of the joint plate D2 in correspondence.

In FIG. 53A, each predetermined side of the light-emitting unit D1 is projected in the direction of another light-emitting unit to which the light-emitting unit D1 should be connected. Electrode terminals are formed on the projections. Electrode terminals D101, D103, and D105 are earth electrode terminals, while electrode terminals D102, D104, and D106 are feeder electrode terminals. The projections have a construction where Cu patterns are formed on a flexible substrate, and have flexibility.

In FIG. 53B, electrode terminals D201 and D202 are formed on a surface of the joint plate D2 in correspondence with the shapes of the electrode terminals of the light-emitting unit D1. Also, as can be seen from the front view, electrode terminals D203 and D204 are formed on the other surface of the joint plate D2 in correspondence with the shapes of the electrode terminals of the light-emitting unit D1.

The joint plate D2 is a multilayer substrate, where the electrode terminals D201 and D204 and the electrode terminals D202 and D203 are electrically interlayer-connected through vias or Cu patterns (not illustrated) Hence the same effects as the modification (3) can be achieved.

Figure 54:
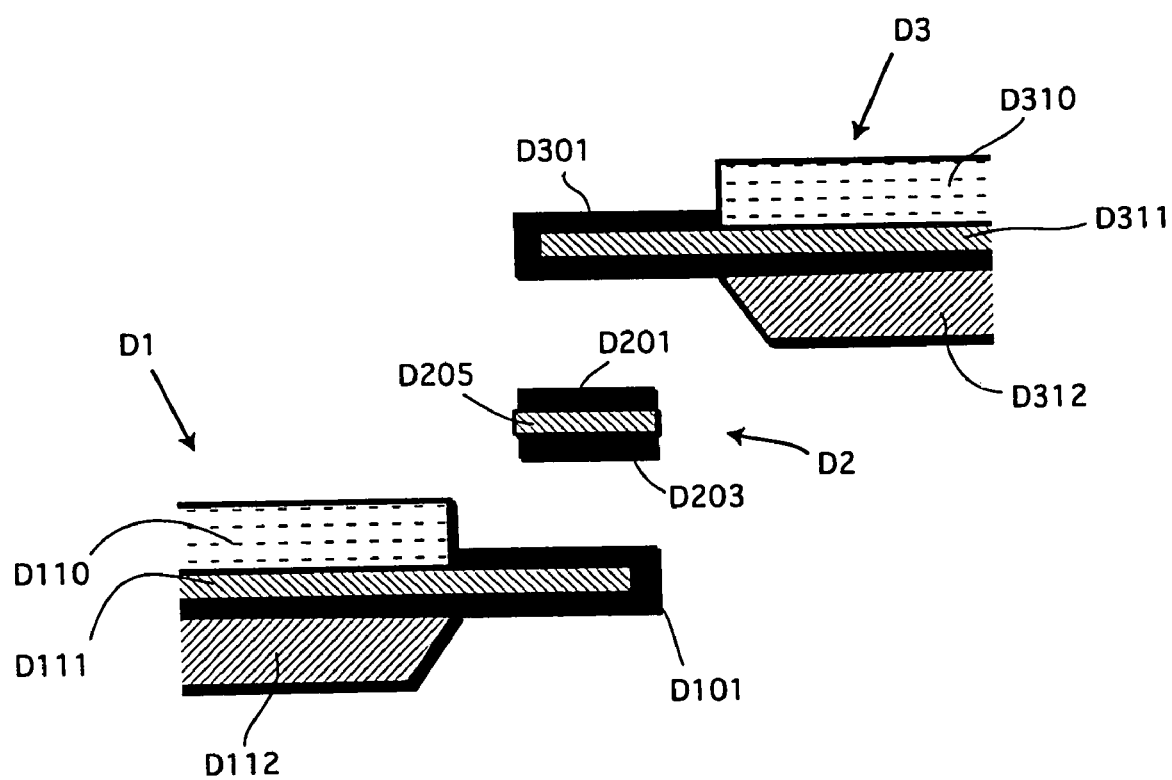
FIG. 54 shows the case where the light-emitting units shown in FIG. 53A are connected by the joint plate shown in FIG. 53B.

The light-emitting unit D1 is connected to another light-emitting unit of the same type using the joint plate D2 in the following manner. FIG. 54 shows the case where the light-emitting unit D1 is connected with a light-emitting unit D3 using the joint plate D2. The drawing shows the cross-sections of the light-emitting units D1 and D3 and joint plate D2.

In FIG. 54, the light-emitting units D1 and D3 are equipped with electrode terminals D101 and D301, light diffusion layers D110 and D310, flexible substrates D111 and D311, and radiating plates D112 and D312. In the joint plate D2, the electrode terminal D201 is formed on one surface of a circuit substrate D205, and the electrode terminal D203 is formed on the other surface.

This being so, the electrode terminal D101 of the light-emitting unit D1 is connected to the electrode terminal D203 of the joint plate D2, and the electrode terminal D301 of the light-emitting unit D3 is connected to the electrode terminal D201 of the joint plate D2. The connections of these electrode terminals can be done using one of the aforementioned connection methods. The electrode terminals D101 and D301 of the light-emitting units D1 and D3 have flexibility, which enables a lighting apparatus of a solid appearance to be realized.

(5) When connecting the light-emitting units using the joint plate in the above way, the following modification may be used to assemble the lighting apparatus more efficiently.

Figure 55A:
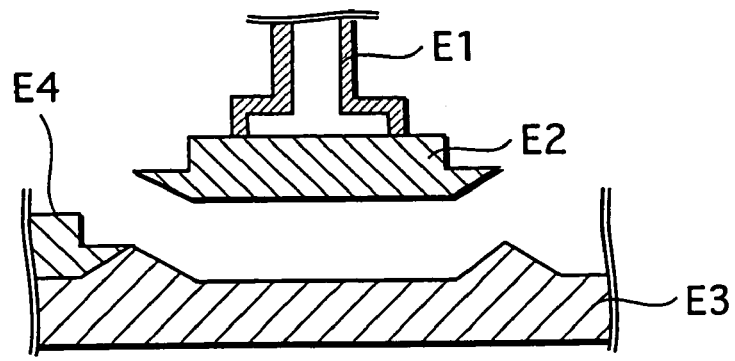
FIGS. 55A–55D show a process of connecting light-emitting units using joint plates.

FIGS. 55A–55D show a device for connecting light-emitting units and a joint plate such as those shown in FIGS. 50A and 50B. For example, to assemble a lighting apparatus of a solid appearance, a jig for holding light-emitting units is made in accordance with a developed figure of the solid shape (e.g. see FIG. 43). Light-emitting units such as E2 and E4 are held under suction using vacuum tweezers E1, and moved to predetermined positions and placed onto a jig E3, as shown in FIG. 55A.

Figure 55B:
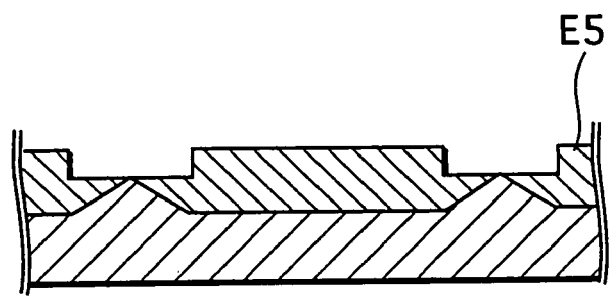
Figure 55C:
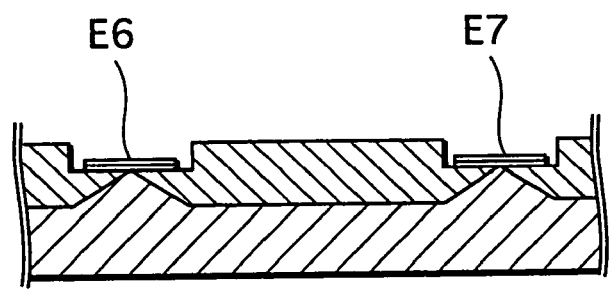

FIG. 55B shows the state where the light-emitting units have been set on the jig E3. Next, joint plates such as E6 and E7 are set on electrode terminals of adjacent light-emitting units which need to be connected, using vacuum tweezers or the like. FIG. 55C shows the state where the joint plates have been set on the electrode terminals of the light-emitting units.

Figure 55D:
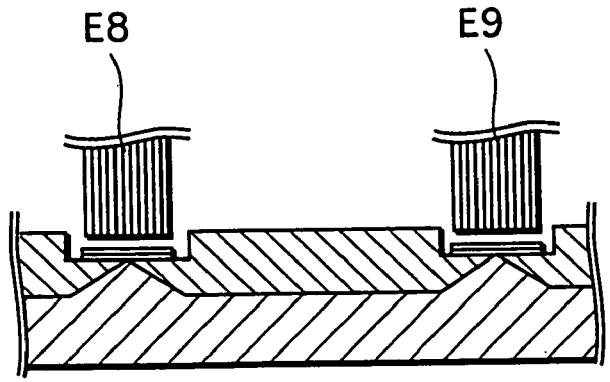

This being so, horns such as E8 and E9 are moved over the joint plates such as E6 and E7 and pressed against them to apply ultrasonic oscillations to the joint plates such as E6 and E7, as shown in FIG. 55D. As a result, the joint plates are attached to the light-emitting units (ultrasonic bonding).

In this way, more joint plates can be mechanically connected by changing the way of developing a three-dimensional figure into a plane figure. This reduces the manual labor required for connection operations, and enables the lighting apparatus to be assembled efficiently.

Figure 56A:
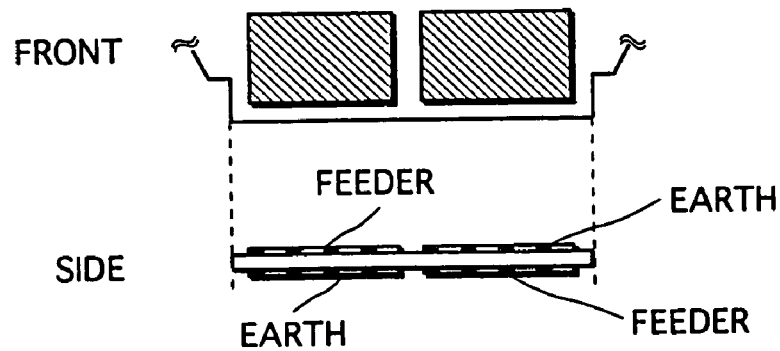
FIG. 56A is a top and side view of a side of a light-emitting unit to which the modification (6) of the third embodiment relates, the side having electrode terminals.
Figure 56B:
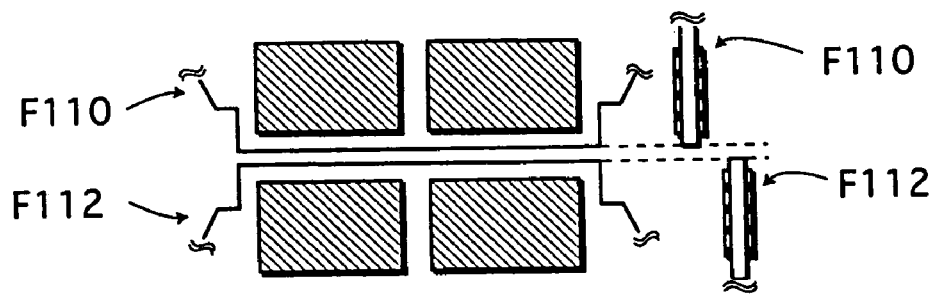
Figure 56C:
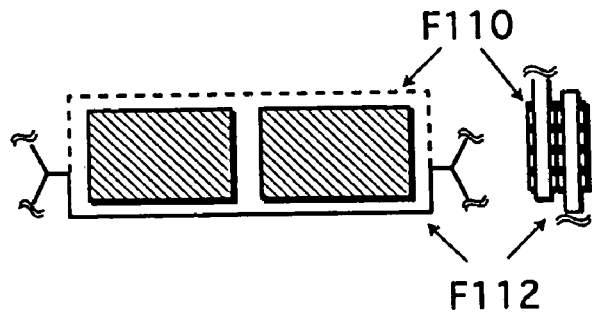
FIG. 56C shows the state where the sides shown in FIG. 56B have been connected.

(6) In addition to the above described connection methods, the following connection method is applicable. FIGS. 56A–56C show one side of a light-emitting unit F110 to which this modification relates. FIG. 56A is a top and side view of the side of the light-emitting unit F110 on which electrode terminals have been provided. As can be seen from the side view, the arrangement order of electrode terminals is reversed on the front and back surfaces of the light-emitting unit F110. Which is to say, an earth electrode terminal and a feeder electrode terminal are arranged in this order from one end on the front surface of the light-emitting unit F110, whereas a feeder electrode terminal and an earth electrode terminal are arranged in this order from the same end on the back surface of the light-emitting unit F110.

The same applies to the case where a plurality of types of feeder electrode terminals are provided in correspondence with different colors. For instance, when a red LED feeder electrode terminal, a green LED feeder electrode terminal, a blue LED feeder electrode terminal, and an earth electrode terminal are arranged in this order from one end on the front surface, an earth electrode terminal, a blue LED feeder electrode terminal, a green LED feeder electrode terminal, and a red LED feeder electrode terminal are arranged in this order form the same end on the back surface.

This allows a construction where only one electrode terminal is provided for each type. Hence the number of electrode terminals provided on one surface of one side of the light-emitting unit can be reduced. As a result, the pitch of electrode terminals provided on the surface of the side of the light-emitting unit is widened, with it being possible to ease the labor of connecting corresponding electrode terminals when connecting light-emitting units.

To connect the light-emitting unit F110 with a light-emitting unit F112 of the same construction, the corresponding sides of the light-emitting units F110 and F112 are placed one on top of the other and the corresponding electrode terminals are adhered using a conductive adhesive or the like, as shown in FIGS. 56B and 56C. In this example, the electrode terminals are formed on the flexible substrates, which are bent after the connection to realize a solid shape.

(7) According to the modification (1), the color of light emitted from the lighting apparatus can be modified by changing the combination of the colors of LEDs. As an alternative, the color of light may be modified using the following control circuit.

Figure 57:
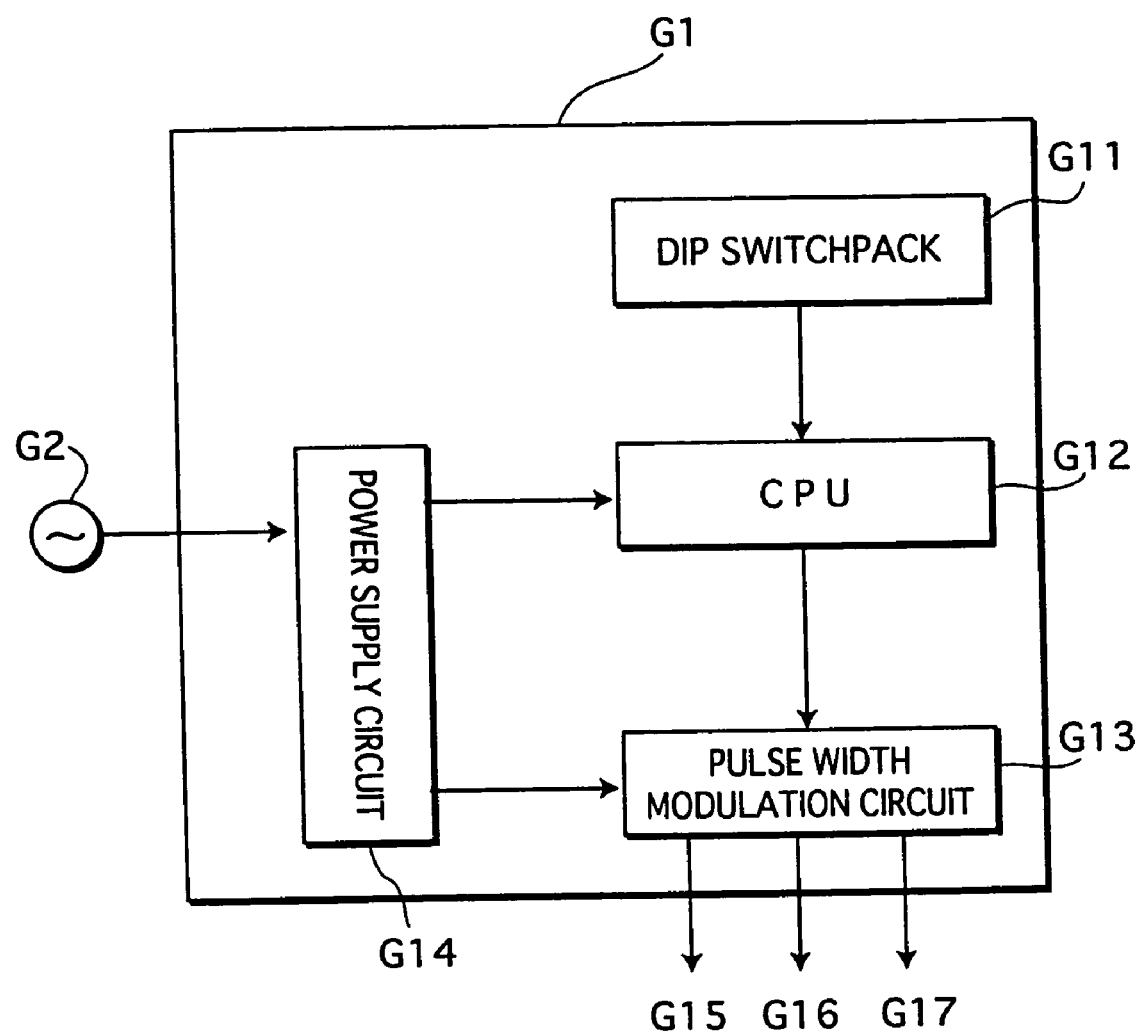
FIG. 57 shows a rough construction of a control circuit to which the modification (6) of the third embodiment relates.

FIG. 57 shows a construction of a control circuit G1 to which this modification relates. The control circuit G1 receives alternating current power from a commercial power supply G2 or the like, through a base or similar. The control circuit G1 converts the alternating current power to direct current power of a predetermined voltage in a power supply circuit G14 that performs full-wave rectification and smoothing. The direct current power is then supplied to a CPU (central processing unit) G12 and a pulse width modulation circuit G13.

The CPU G12 operates according to a program read from an internal ROM (read only memory), and inputs a signal corresponding to the settings of a DIP switchpack G11 into the pulse width modulation circuit G13. The pulse width modulation circuit G13 is a 2-input 3-output circuit. The pulse width modulation circuit G13 modulates the pulse width of the direct current power supplied from the power supply circuit G14 in accordance with the signal received from the CPU G12, and outputs the outcome.

In FIG. 57, the pulse width modulation circuit G13 has three outputs G15, G16, and G17. As one example, the pulse width modulation circuit G13 separately controls the pulse duties that illuminate the three types of LEDs of red, green, and blue arranged as shown in the mesh circuits 71, 72, and 73 in FIG. 47, to change the color mixture ratio. In this way, the pulse width modulation circuit G13 adjusts the color of light emitted from the lighting apparatus. This enables the lighting apparatus to achieve light of various colors.

The photoelectric conversion efficiency of an LED depends on temperature, in such a way that the photoelectric conversion efficiency decreases as the temperature increases. However, since the LEDs are driven by the pulse width conversion circuit G13 in this modification, the current flowing through the light-emitting unit is kept at a constant level, so that the temperature of the light-emitting unit is stable. As a result, the adjustment of the color mixture ratio can be made without difficulty.

(8) The third embodiment describes the case where the lighting apparatus has the shape of truncated octahedron, but this is not a limit for the invention, which can realize lighting apparatuses of other shapes. The following are representative examples of lighting apparatuses that can be achieved by the invention.

Figure 58A:
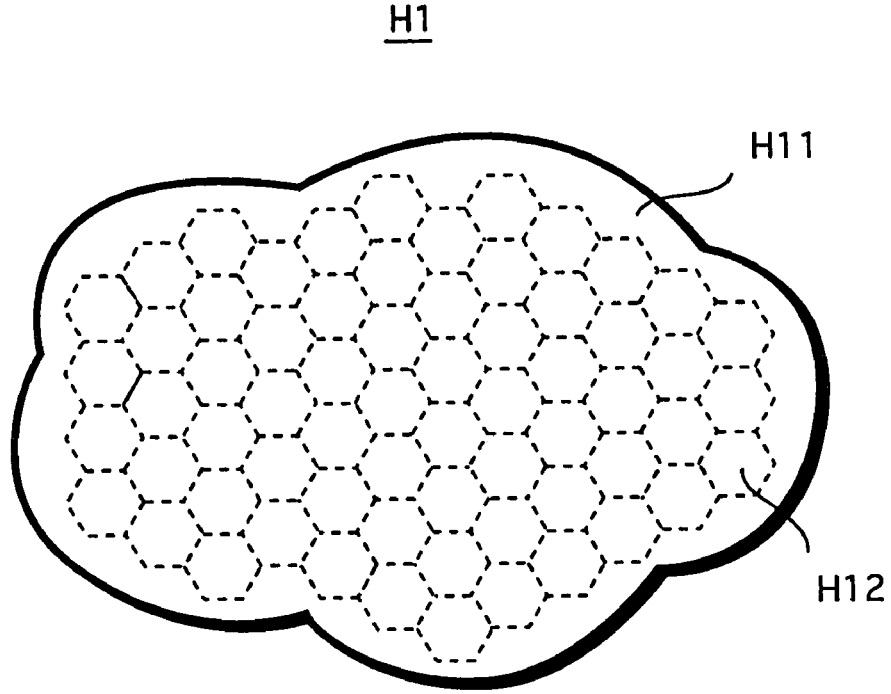
FIG. 58A is a plan view of a flat lighting apparatus to which the modification (8a) of the third embodiment relates.
Figure 58B:
FIG. 58B is a perspective side view of FIG. 58A.

(8a) FIG. 58A is a plan view of a flat lighting apparatus Hi. FIG. 58B is a perspective side view of the lighting apparatus H1. In these drawings, the lighting apparatus H1 has a construction in which sixty-four regular hexagonal light-emitting units H12 with each side being 25 mm long are connected flatly and put in a cloud-shaped cover H11. The cover H11 is made of a light transmittance resin, and converts light emitted from LEDs into soft light of milk white.

A light-emitting unit H12 has a shape shown in FIG. 36, and includes a light diffusion layer with a thickness of 2 mm, a flexible substrate with a thickness of 0.3 mm, and a radiating plate with a thickness of 1 mm so that the total thickness is 3.3 mm. Since the light-emitting unit H12 is thin, the lighting apparatus H1 itself is only 15 mm thick, which is much thinner than the case where a fluorescent lamp is used.

Figure 59A:
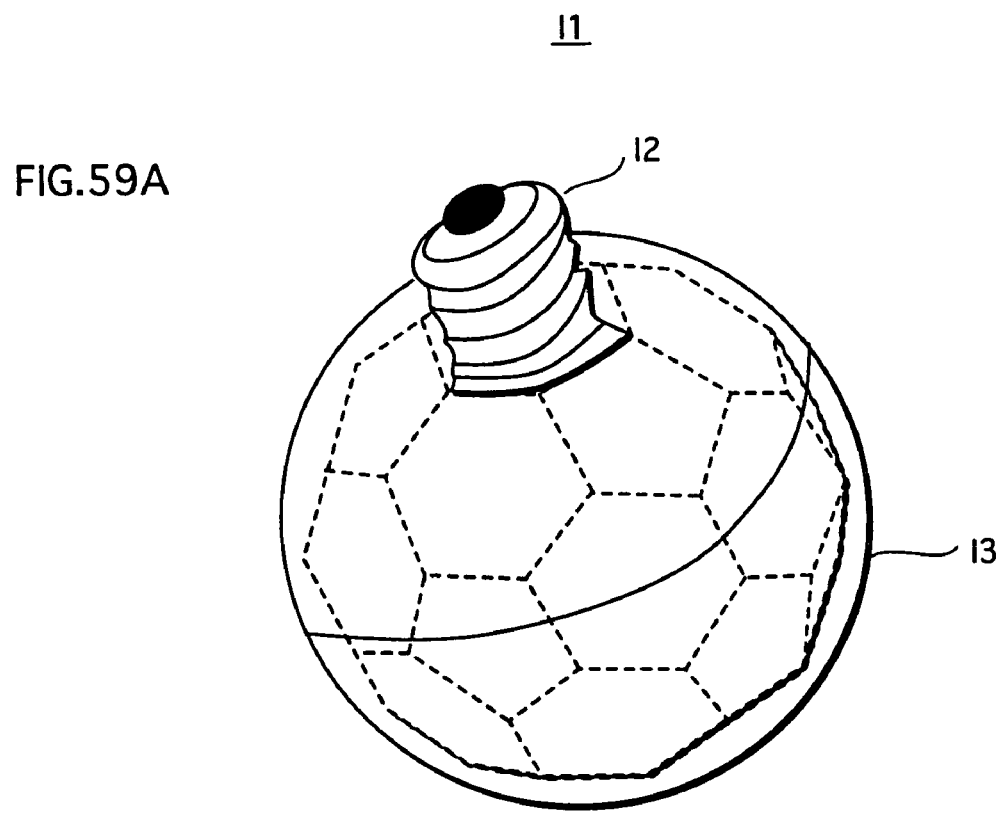
FIG. 59A is a perspective view of a truncated icosahedral lighting apparatus to which the modification (8b) of the third embodiment relates.
Figure 59B:
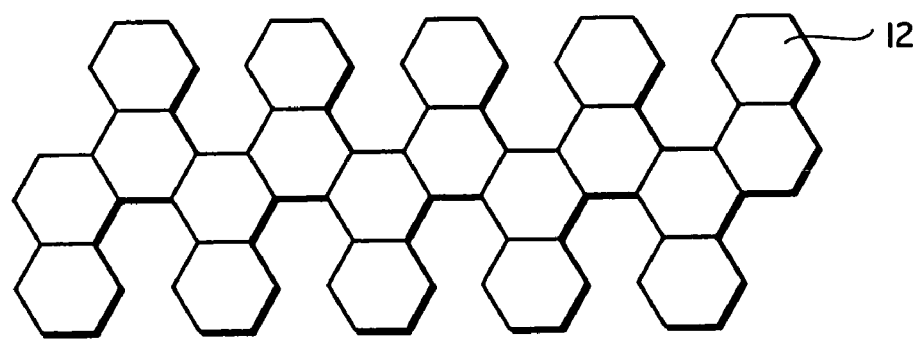
FIG. 59B is a developed plan view of light-emitting units which are connected in the truncated icosahedral lighting apparatus shown in FIG. 59A.

(8b) FIG. 59A is a perspective view of an appearance of a truncated icosahedral lighting apparatus I1. FIG. 59B is a developed plan view of the truncated icosahedral lighting apparatus I1. In FIG. 59A, the lighting apparatus I1 is formed by connecting nineteen regular hexagonal light-emitting units and one base unit I2 and putting the light-emitting units in a ball-shaped capsule I3.

The capsule I3 is made of a light transmittance resin, and is given a color that helps improve the color rendering properties of the light emitted from the lighting apparatus I1. The capsule I3 is made up of two hemispherical components, one of which has an opening for the base unit I2.

FIG. 59B shows the state where the truncated icosahedron made up of the nineteen light-emitting units and the base unit I2 has been developed into a plane figure. With the provision of a jig that corresponds to this shape, the efficiency of assembling the lighting apparatus of this modification can be improved.

In this way, lighting apparatuses that correspond to conventional incandescent lamps or ball-shaped fluorescent lamps can be achieved. The effects of the invention can be attained by providing electrode terminals on only three sides of each light-emitting unit of such lighting apparatuses.

Figure 60:
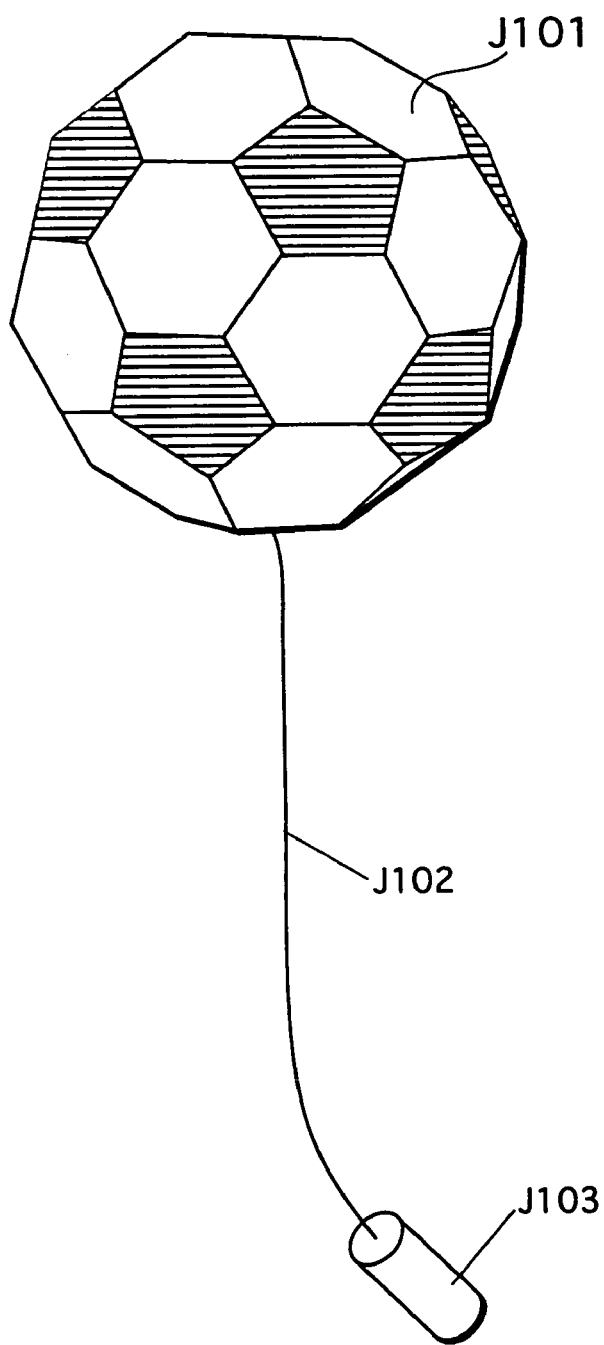
FIG. 60 is a perspective view of an air-floating truncated icosahedral lighting apparatus to which the modification (8c) of the third embodiment relates, where regular hexagonal light-emitting units are provided in regular hexagons among the polygons that compose the truncated icosahedron.

(8c) FIG. 60 is a perspective view of an appearance of a lighting apparatus J1 in which regular hexagonal light-emitting units are provided in regular hexagons of a truncated icosahedron. The lighting apparatus J1 is roughly composed of a body unit J101, a power supply cable J102, and a power supply unit J103. The lighting apparatus J1 emits light, when power is supplied from the power supply unit J103 to the body unit J101 via the power supply cable J102.

The construction of the body unit J101 is the same as that shown in FIG. 59, except that the lighting apparatus J1 is equipped with a light-emitting unit for power reception instead of the base unit I2. This power receptive light-emitting unit has electrode terminals which are connected to the power supply cable J102, in addition to electrode terminals which are connected to other light-emitting units. Therefore, this light-emitting unit has electrode terminals on four sides.

A rubber ball filled with helium gas is provided inside the body unit J101. The body unit J101 floats in the air by the buoyant force of this rubber ball. The power supply cable J102 serves to hold the body unit J101 floating in the air. The power supply unit J103 has a weight enough to prevent the body unit J101 from flying further up in the air.

The user can hold the power supply unit J103 and carry the lighting apparatus J1 to a desired location. Batteries are contained in the power supply unit J103, with the power generated from the batteries being supplied to the body unit J101 via the power supply cable J102.

With such a lighting apparatus, the surroundings of the user can be illuminated from a higher position than when a flashlight or the like is used. This is particularly useful when walking or working in dark places. Furthermore, the buoyant force of the rubber ball in the body unit J101 reduces the power necessary to hold the lighting apparatus J1, which allows users of any physical capabilities to use the lighting apparatus J1 for a long time.

(9) The above embodiment and modifications describe the use of regular hexagonal light-emitting units, but the invention should not be limited to such. The effects of the invention can still be attained by providing electrode terminals only on predetermined sides of light-emitting units of other regular polygons.

Also, the shape of the light-emitting units is not limited to a regular polygon, since the corresponding sides of two light-emitting units can be connected so long as each light-emitting unit has equal-length sides such as a rhombus. The effects of the invention can be attained in this case too.

(10) The third embodiment and modifications describe the use of regular hexagonal light-emitting units, but instead light-emitting units of different shapes may be used in combination.

For example, regular hexagonal light-emitting units may be used in combination with square light-emitting units, or light-emitting units of three or more different shapes may be used in combination. In so doing, the design freedom of the lighting apparatus is further enhanced.

When combining light-emitting units of different shapes, it is preferable for each different light-emitting unit to have an equal-length side. This enables different light-emitting units to be combined and connected together, and the effects of the invention can still be obtained.

(11) The third embodiment describes the case where the base unit is equipped with the E26 base, but the base unit may instead be equipped with a base of other size such as E39 or E17. Also, the base unit may be equipped with an inserting base instead of a screw-in base. The inserting base may be of any size such as B22D or B15D.

Through the use of any of the above bases, the lighting apparatus of the invention can be attached to a standard socket. However, the effects of the invention can still be achieved even when the lighting apparatus receives power from an external power supply by other means.

Fourth Embodiment

The following describes the fourth embodiment of the present invention with reference to drawings.

Figure 61:
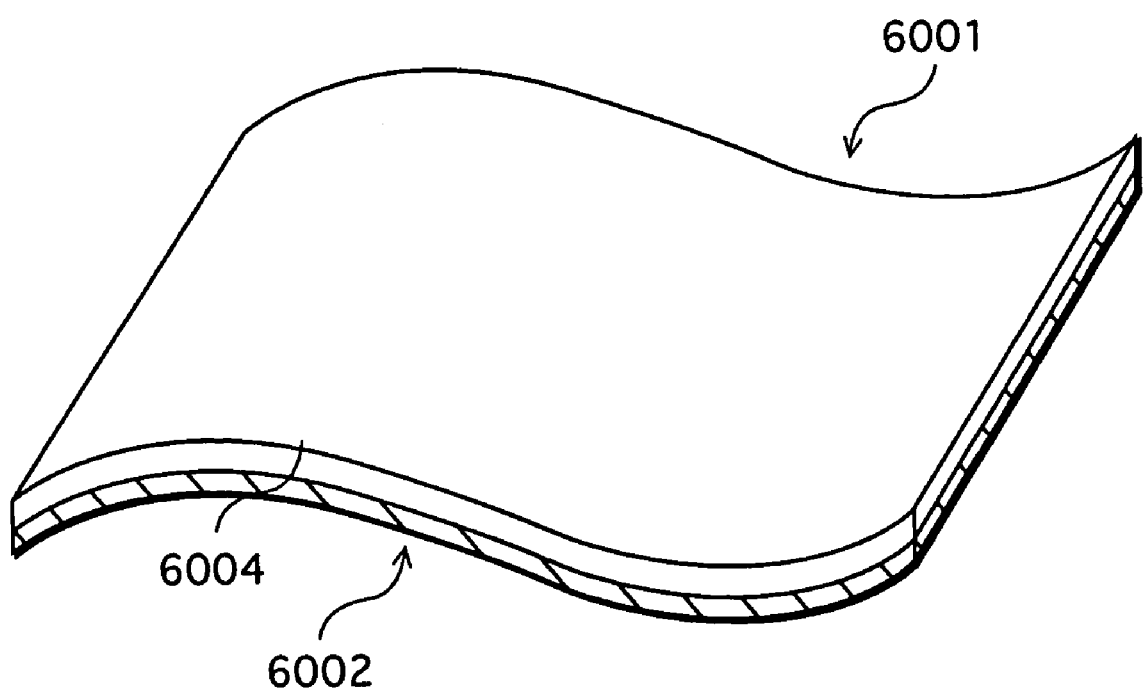
FIG. 61 is a perspective view showing the middle part of a flat light-emitting unit to which the fourth embodiment of the invention relates.

FIG. 61 is a perspective view of the middle part of a flat light-emitting unit 6001 to which the fourth embodiment of the invention relates.

Figure 62:
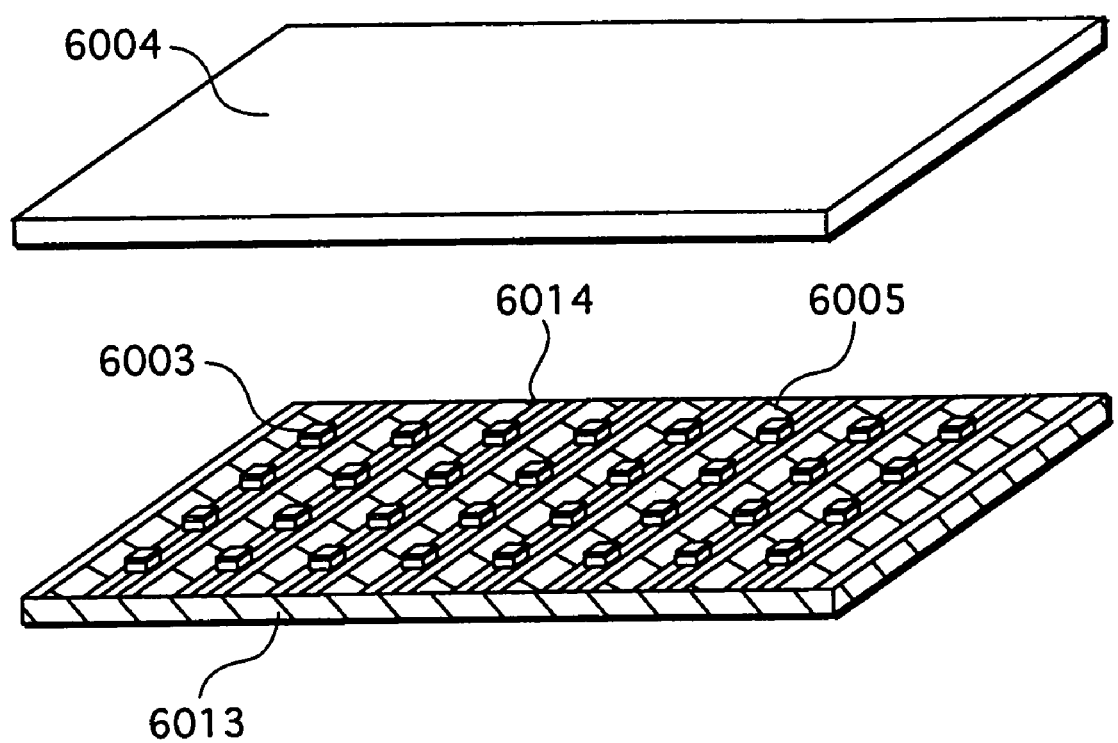
FIG. 62 is an exploded perspective view of the light-emitting unit shown in FIG. 61.
Figure 63:
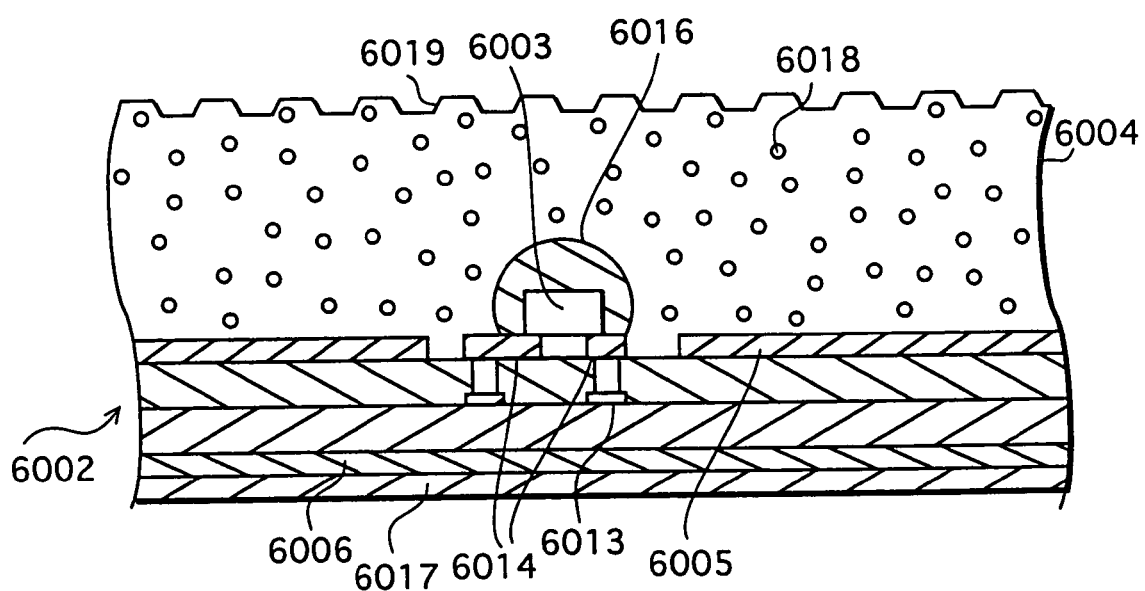
FIG. 63 is a partial sectional view of the light-emitting unit shown in FIG. 61.

FIG. 62 is an exploded perspective view of the light-emitting unit 6001, whereas FIG. 63 is a partial sectional view of the light-emitting unit 6001.

As shown in these drawings, the light-emitting unit 6001 has a construction in which a lot of blue LEDs (hereafter "LED chips") 6003 in bear chip form are mounted on a multilayer flexible substrate (hereafter "multilayer substrate") 6002 with a thickness of 0.3 mm. The multilayer substrate 6002 is formed by providing a wiring pattern on a polyimide resin plate 6013 which is protean and flexible. The LED mounting surface of the multilayer substrate 6002 is covered with a silicon rubber sheet 6004 with a thickness of 2.5 mm that is protean, flexible, and translucent. The total thickness of the multilayer substrate 6002 and silicon rubber sheet 6004 is very small about 3 mm. The light-emitting unit 6001 itself has flexibility. Also, depressions into which the LED chips 6003 are to fit are provided on the surface of the silicon rubber sheet 6004 that faces the multilayer substrate 6002, at the positions corresponding to the LED chips 6003. This prevents the LED chips 6003 and the silicon rubber sheet 6004 from interfering with each other.

The LED mounting surface of the multilayer substrate 6002, apart from the areas where the LED chips 6003 are located, is covered with an aluminum reflective layer 6005. The aluminum reflective layer 6005 has a function of reflecting light emitted from the LED chips 6003 toward the silicon rubber sheet 6004, and a function of diffusing heat generated from the LED chips 6003 across the entire surface.

A copper foil layer 6006 is formed on the surface of the multilayer substrate 6002 opposite to the LED mounting surface. The copper foil layer 6006 has a function of spreading the heat of the LED chips 6003 across the entire surface. The same effects can be obtained by using carbon graphite foil that has superior thermal conductivity, instead of the copper foil. It should be noted that though the original shape of the light-emitting unit 6001 is flat, the light-emitting unit 6001 is shown as being bent in wave form in FIG. 61. The same applies to FIG. 68B.

If necessary, an adhesive layer 6017 may be provided to the light-emitting unit 6001 on the side of the multilayer substrate 6002 or on the side of the silicon rubber sheet 6004, so that the light-emitting unit 6001 can be attached to a wall or glass as if putting up wallpaper. This improves workability. When the adhesive layer 6017 is provided on the side of the silicon rubber sheet 6004, the light-emitting unit 6001 may be attached to the inside of a show window.

Figure 64:
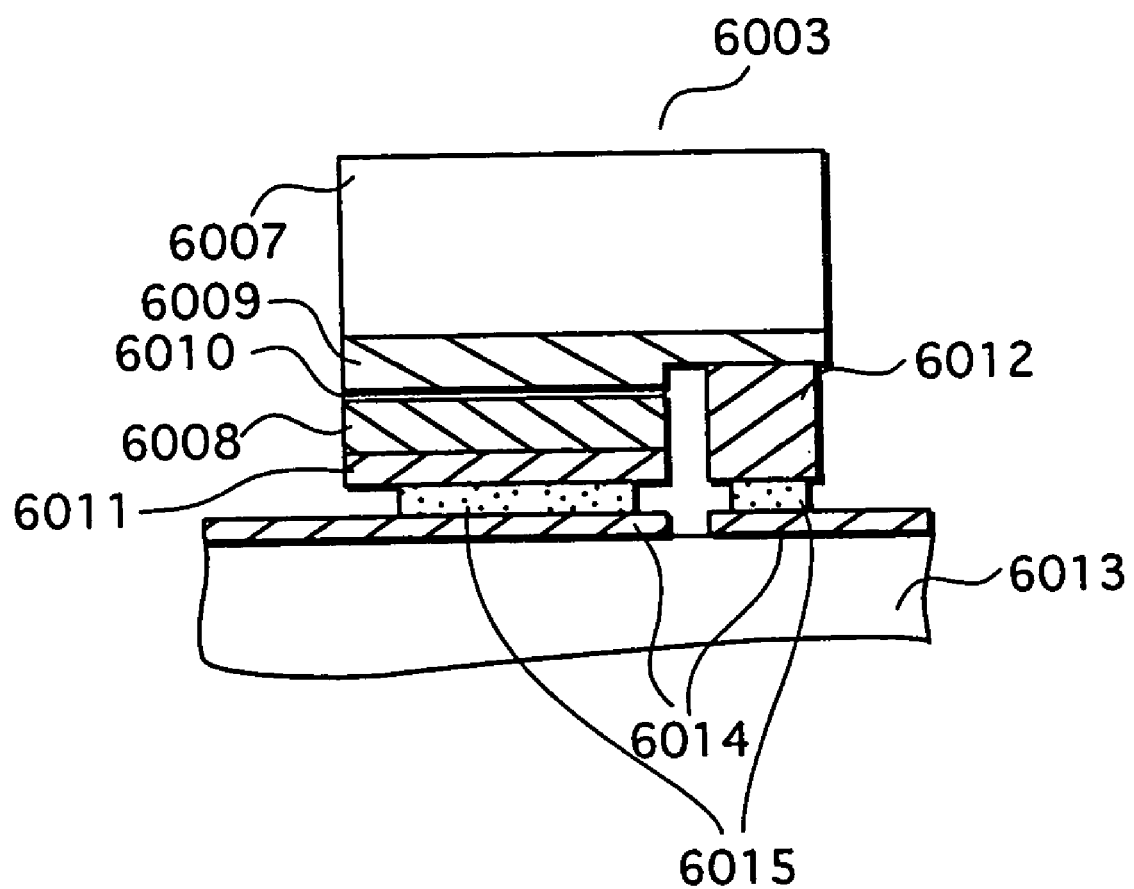
FIG. 64 shows a structure of an LED in the light-emitting unit shown in FIG. 62.

As shown in FIG. 64, an LED chip 6003 is formed by providing a nitrogen compound semiconductor InGaAlN to a sapphire substrate 6007.

When electrons and electron holes recombine to each other in an active layer 6010 that is sandwiched by a P-type nitrogen compound semiconductor 6008 and an N-type nitrogen compound semiconductor 6009 in the LED chip 6003, blue light is generated. An anode electrode 6011 and a cathode electrode 6012 are provided on the sapphire substrate 6007 on which the semiconductors have been formed. The electrodes 6011 and 6012 are bonded to wiring patterns 6014 on a polyimide layer 6013 of the multilayer substrate 6002 by solder 6015.

Since the sapphire substrate 6007 is transparent to blue light, transmitted blue light excites an YAG phosphor 6016 that covers the entire LED chip 6003, which generates yellow light. The mixture of the blue and yellow light produces white light.

The silicon rubber sheet 6004 is bonded to the multilayer substrate 6002 using a translucent silicon rubber adhesive (not illustrated). Also, an alumina powder 6018 is provided as a scatterer in the silicon rubber sheet 6004, so that the entire silicon rubber sheet 6004 uniformly shines in white color. With the provision of the alumina powder 6018 that is a metal oxide, the thermal conductivity of the silicon rubber sheet 6004 is increased by about an order of magnitude to around 1W/m·° C. when compared with the case where the alumina powder 6018 is not present. This improves thermal radiation effects. The same effects can be obtained by using a metal nitride powder such as aluminum nitride, instead of the alumina powder 6018.

Though the phosphor 6016 is applied to the LED chip 6003 in the above example, the same effects can be obtained by including the phosphor 6016 in the silicon rubber sheet 6004. Likewise, the same effects can be obtained by including the alumina powder 6018 in the phosphor 6016 instead of in the silicon rubber sheet 6004. Also, by providing projections and depressions 6019 on the surface of the silicon rubber sheet 6004, it is possible to scatter white light and uniformly illuminate the entire light-emitting unit 6001. Moreover, by providing the projections and depressions 6019 which have lens effects of a concave lens, convex lens, diffraction grating lens, or the like on the parts of the silicon rubber sheet 6004 corresponding to the positions of the LED chips 6003, desired light distribution can be attained easily.

Figure 65:
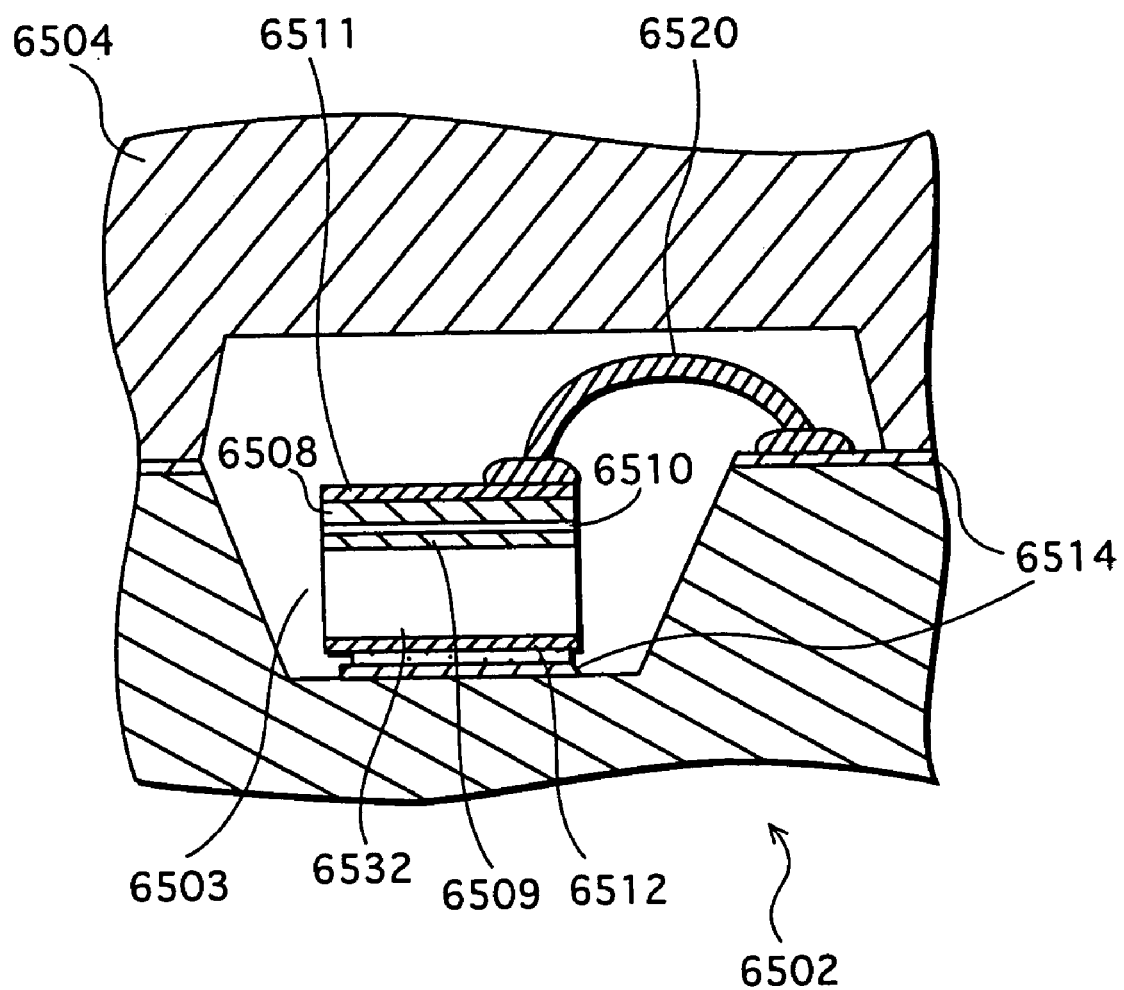
FIG. 65 shows the case where an LED that differs with the LED shown in FIG. 64 has been mounted.

It is also possible to use an LED 6503 shown in FIG. 65. This LED 6503 has a construction where an anode electrode 6511, a P-type semiconductor layer 6508, an active layer 6510, an N-type semiconductor layer 6509, a conductive semiconductor substrate layer 6532, and a cathode electrode 6512 are laminated in this order. In this case, to connect the electrodes of the LED 6503 to wiring patterns 6514 of a multilayer substrate 6502, at least one bonding wire is necessary. However, if a wire 6520 is directly mounted on the flat multilayer substrate 6502, the wire 6520 comes into contact with a silicon rubber sheet 6504. This may cause the wire 6520 to deform and result in a short circuit, or the bonding to be disconnected due to the load. To avoid this, at least one of the multilayer substrate 6502 and the silicon rubber sheet 6504 is depressed where the LED 6503 is present. In so doing, when bonding the multilayer substrate 6502 and the silicon rubber sheet 6504, the wire 6520 will not come into contact with the silicon rubber sheet 6504.

By filling the depression with translucent silicon oil or silicon grease, the heat radiation properties can be improved. Here, by selecting silicon oil or silicon grease whose refractive index lies between the refractive index of the silicon rubber (about 1.5) and the refractive index of the LED (about 3.0), the amount of LED-emitted light which is reflected off the silicon rubber can be reduced and so the light extraction efficiency can be enhanced.

A wiring construction of the light-emitting unit 6001 and a construction of feeder terminals are explained next. The light-emitting unit 6001 has a rectangular shape with a length of 10 cm and a width of 5 cm. A total of 450 LED chips 6003 are mounted on the light-emitting unit 6001.

When a current of 20 mA passes through each LED chip 6003, white light of 4001 m is generated.

Figure 66A:
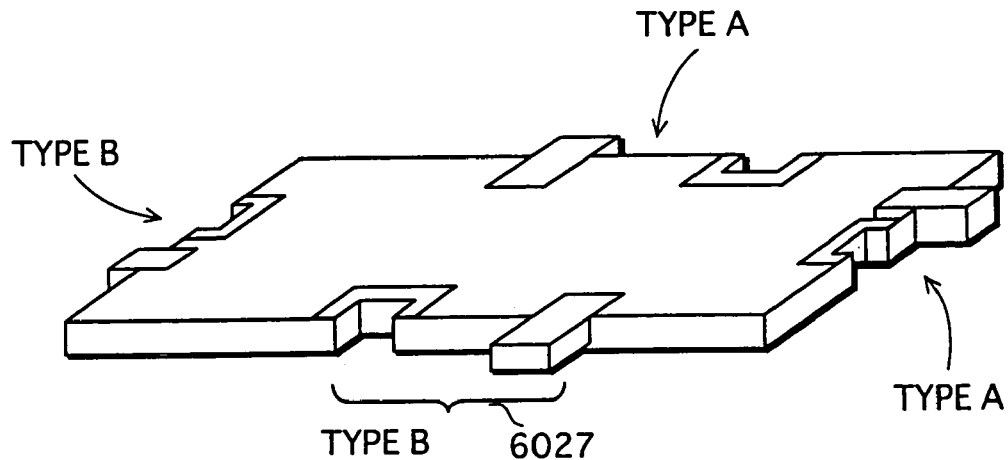
FIG. 66A mainly shows a structure of feeder terminals in a multilayer substrate in the light-emitting unit shown in FIG. 62.

FIG. 66A is a perspective view of an appearance of the multilayer substrate 6002 in the light-emitting unit 6001, looked at from the opposite side of the silicon rubber sheet 6004. Therefore, the LED mounting surface is the back surface in FIG. 66A. Also, no copper foil layer 6006 is provided in this example.

A pair of feeder terminals 6027 for supplying power to the LED chips 6003 is formed on each side of the light-emitting unit 6001. The pair of feeder terminals 6027 is made up of a high-potential terminal 6023 and a low-potential terminal 6024.

Figure 66B:
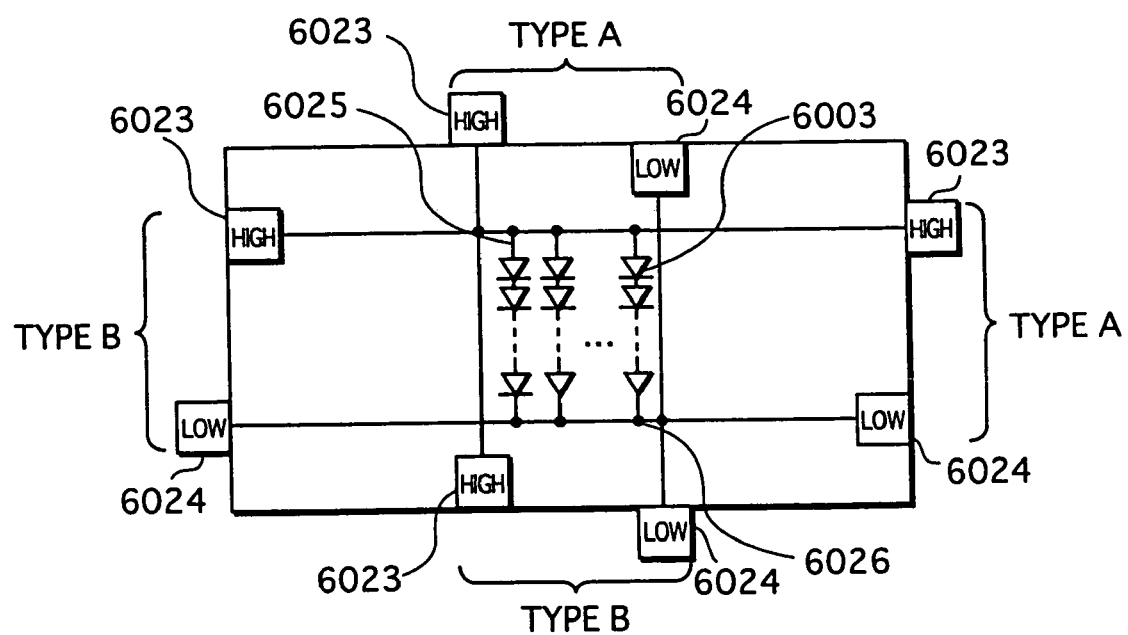
FIG. 66B is a conceptual wiring diagram showing connections between different-colored LEDs and feeder terminals in the light-emitting unit shown in FIG. 62.

Trains of series-connected LED chips 6003 are connected in parallel on the multilayer substrate 6002, as shown in FIG. 66B. This is the same as that shown in FIG. 5B.

The connections between the LED chips 6003 themselves and the connections between the LED chips 6003 at both ends of each series-connected LED chip train and the feeder terminals are the same as the connections relating to the red LED chips which are explained in the first embodiment, except that the feeder terminals are provided on the surface of the multilayer substrate 6002 opposite to the LED mounting surface. Accordingly, its explanation has been omitted.

In more detail, an anode electrode of an LED chip 6003 at the high-potential end of each LED chip train is connected to the high-potential terminal 6023, while a cathode electrode of an LED chip 6003 at the low-potential end of each LED chip train is connected to the low-potential terminal 6024. As a result, the high-potential terminal 6023 of each side will end up having the same potential, and the low-potential terminal 6024 of each side will en up having the same potential. This being so, if power is supplied to one of the feeder terminals 6027 provided on the four sides, all LED chips 6003 emit light.

Figure 67A:
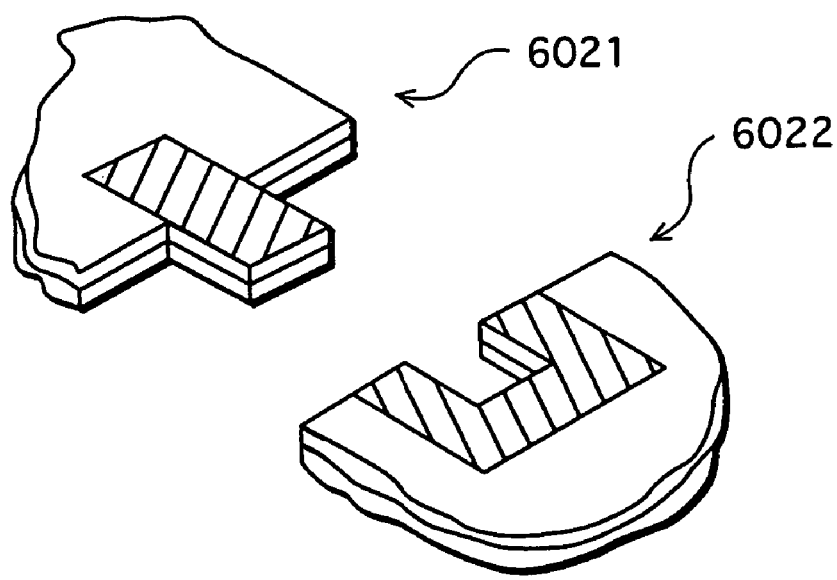
FIG. 67A is an expanded view of feeder terminals in multilayer substrates of the type shown in FIG. 66A.
Figure 67B:
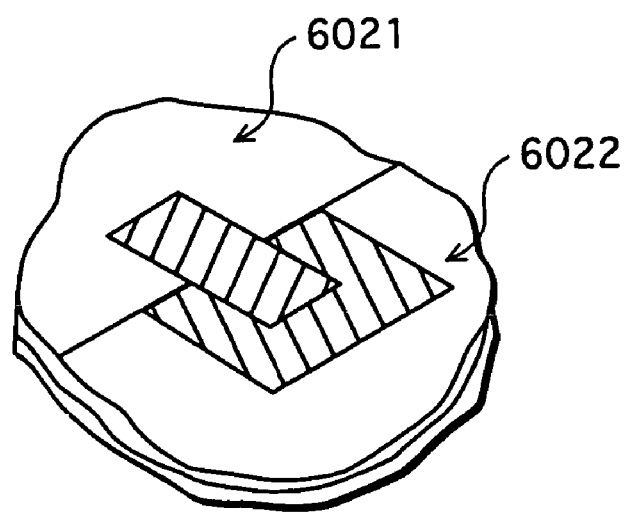
FIG. 67B shows the state where the feeder terminals shown in FIG. 67A have been combined.

The high-potential terminal 6023 and the low-potential terminal 6024 takes a different one of the forms of a convex terminal 6021 or concave terminal 6022 shown in FIG. 67A. This enables the convex terminal 6021 and the concave terminal 6022 to be connected together. In other words, the two terminals 6021 and 6022 are soldered with the convex part of the convex terminal 6021 being engaged with the concave part of the concave terminal 6022.

Figure 68A:
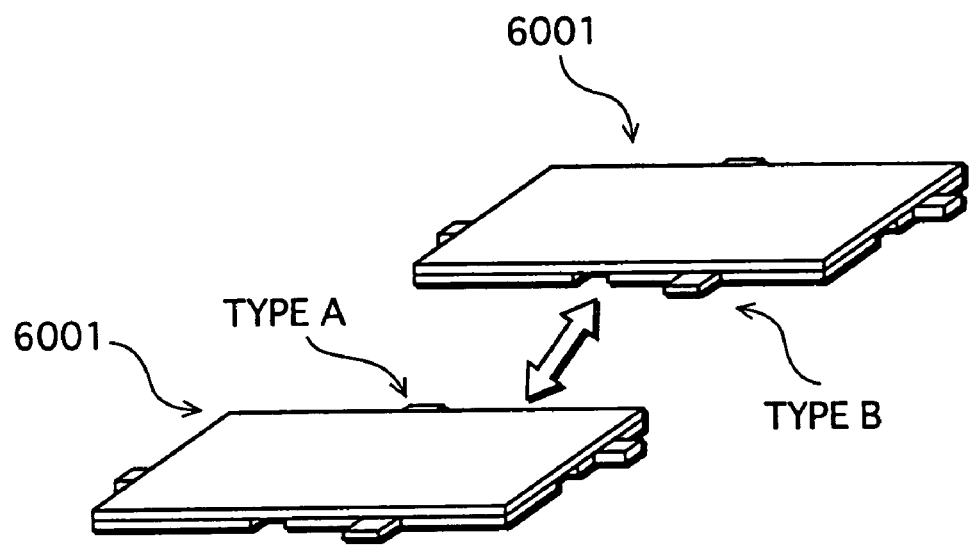
FIG. 68A shows a method of combining light-emitting units in the fourth embodiment.

In FIGS. 66A and 66B, each pair of feeder terminals 6027 takes one of the two different patterns, so that a plurality of light-emitting units 6001 can be connected together or a light-emitting unit 6001 can be rolled with feeder terminals being connected to each other. In this embodiment, type A denotes the pattern where the high-potential terminal is convex and is positioned on the left when looked at from the center of the light-emitting unit 6001, and the low-potential terminal is concave and is positioned on the right. Type B denotes the pattern where the high-potential terminal is concave and is positioned on the right, and the low-potential terminal is convex and is positioned on the left. As is clear from the drawings, each feeder terminal pair is arranged so that feeder terminal pairs of the different types can be connected but feeder terminal pairs of the same type cannot be connected. In other words, a feeder terminal pair of type A is positioned opposite to a feeder terminal pair of type B. In this way, a plurality of light-emitting units 6001 can be connected as shown in FIG. 68A.

Figure 68B:
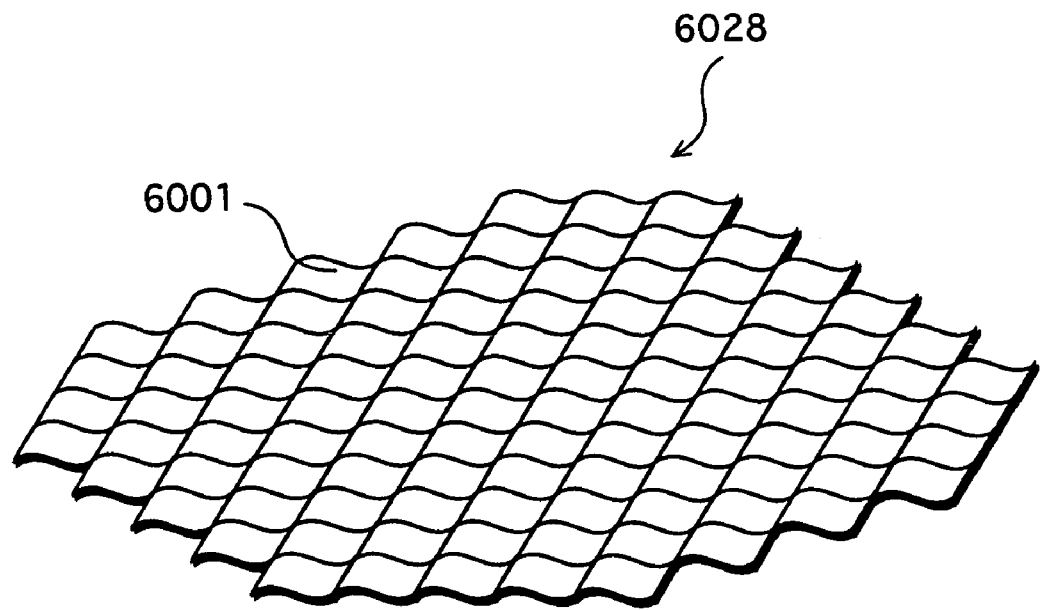
FIG. 68B shows the state where a number of light-emitting units have been connected.

FIG. 68B shows a wall lighting apparatus 6028 that is obtained by connecting a lot of light-emitting units 6001 like tiles and laying the result to wavy wall. Note that the wall is not shown in the drawing. By supplying power through a pair of the feeder terminals 6027 which are provided on the periphery of the wall lighting apparatus 6028 and are not related to the connections between the light-emitting units 6001, all light-emitting units 6001 can be illuminated. This simplifies wiring and save the labor of connection operations, when compared with the case where adjacent light-emitting units are connected one by one using wires or the like.

When constructing the lighting apparatus in the above way, the color of light emitted from each light-emitting unit may be differed (by mounting different types of LED chips on different light-emitting units). This enables mosaics or gradations to be realized, with it being possible to provide a variety of designs. Apart from the aforementioned methods, the color of light of each light-emitting unit can also be differed by mixing LEDs of multiple colors represented by the three primary colors.

Figure 69A:
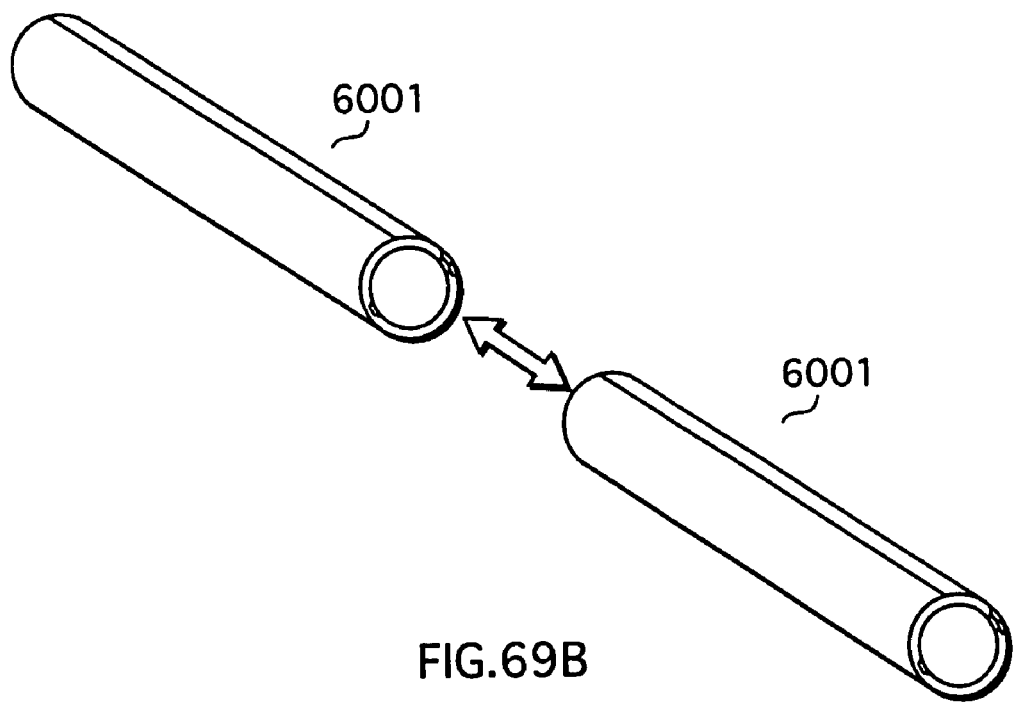
FIG. 69A shows a method of combining light-emitting units which have been rolled into cylindrical shape.
Figure 69B:
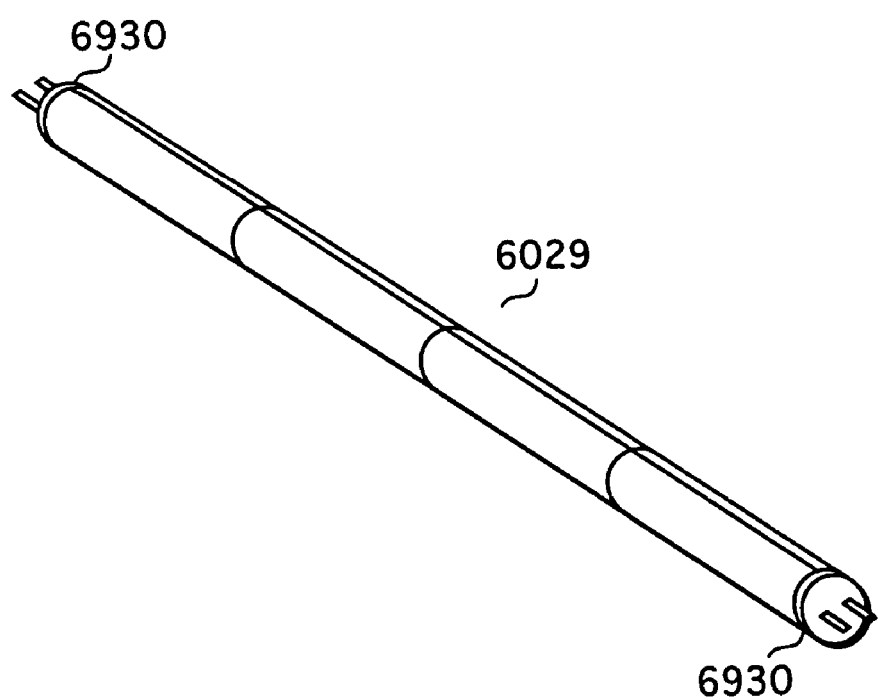
FIG. 69B is a perspective view of a lighting apparatus which is assembled by connecting a plurality of rolled light-emitting units.

As shown in FIGS. 69A and 69B, the opposite sides of one light-emitting unit 6001 may be connected to form a roll. If other rolled light-emitting units 6001 are connected to this light-emitting unit 6001 and two bases 6930 are provided at both ends of the resulting long roll, a tubular lighting apparatus 6029 can be obtained. This can be substituted for conventional straight or circular fluorescent lamps.

In this case, a silicon adhesive can be used to connect the opposite sides of one light-emitting unit 6001, since they need not be electrically connected.

Figure 70A:
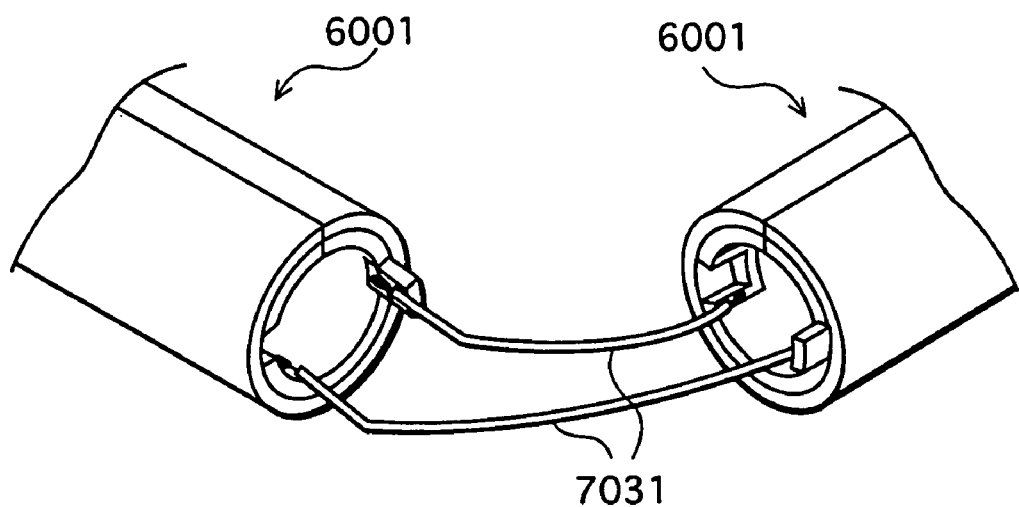
FIGS. 70A and 70B show how to assemble the lighting apparatus shown in FIG. 69B.
Figure 70B:
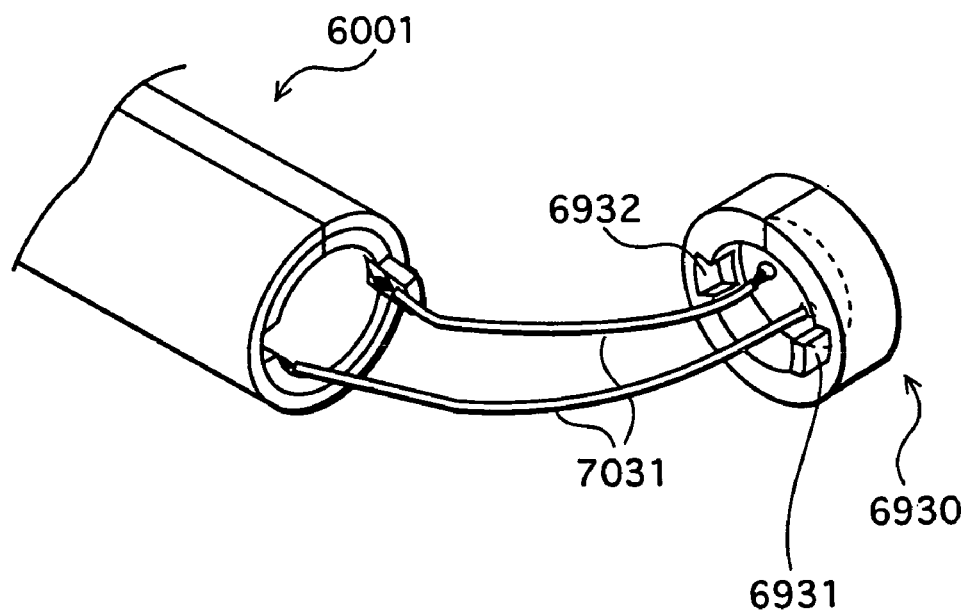

To connect two tubular light-emitting units 6001 or to connect a tubular light-emitting unit 6001 and a base 6930, after corresponding terminals are electrically connected using electric wires 7031, the facing surfaces are adhered using a silicon adhesive, as shown in FIGS. 70A and 70B. As shown in FIG. 70B, the base 6930 is equipped with a convex part 6931 and a concave part 6932 which are to be engaged with concave and convex terminals of the light-emitting unit 6001.

In the case of straight fluorescent lamps in particular, the manufacturing line needs to be changed in accordance with the length that varies with wattage. With the above construction, however, different wattages can be achieved just by changing the length of the lighting apparatus 6029, i.e., by changing the number of light-emitting units 6001 to be connected together. This simplifies production facilities.

Figure 71A:
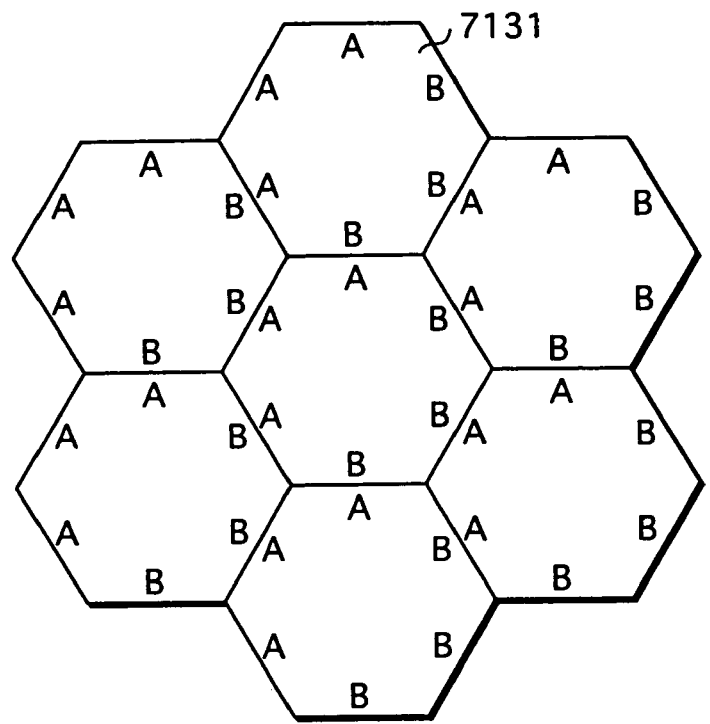
FIGS. 71A and 71B each show a lighting apparatus to which a modification of the fourth embodiment relates.
Figure 71B:
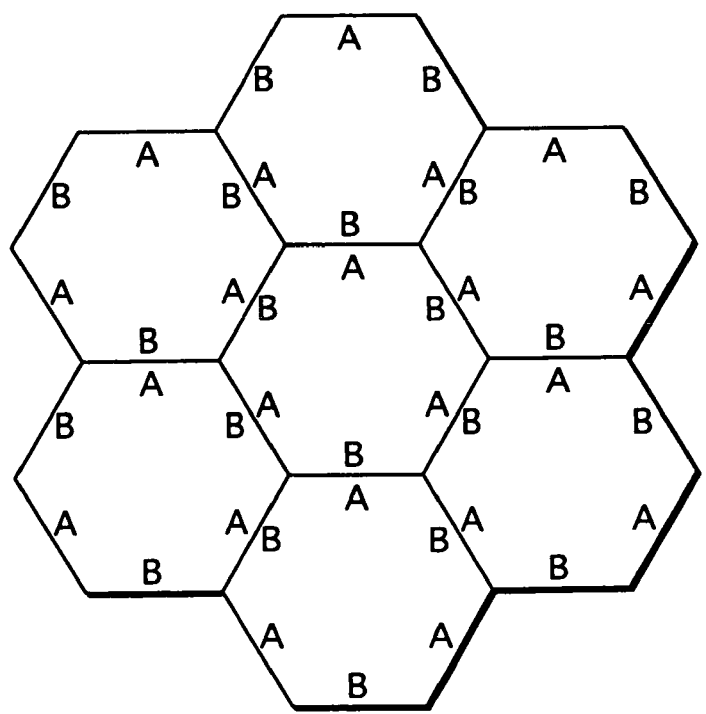

The fourth embodiment describes the use of rectangular light-emitting units 6001, but the same effects can be attained by using square light-emitting units, or by using regular hexagonal light-emitting units 7131 shown in FIGS. 71A and 71B. In the case of regular hexagon, feeder terminals of the same type may be formed on three adjacent sides as shown in FIG. 71A, or on three alternate sides as shown in FIG. 71B.

In the first to fourth embodiments, the cathode electrodes of the LED chips at the low-potential end of the different-colored LED chip trains are connected to the common terminals, and the anode electrodes of the LED chips at the high-potential end of the different-colored LED chip trains are connected to the feeder terminals of the corresponding colors. However, circuit patterns and the like may be constructed so as to reverse this connection relationship. Which is to say, it is possible to connect the anode electrodes of the LED chips at the high-potential end of the different-colored LED chip trains to the common terminals, and connect the cathode electrodes of the LED chips at the low-potential end of the different-colored LED chip trains to the feeder terminals of the corresponding colors. Even with this construction, the amount of light emission can be varied according to color by setting different potentials for the different-colored terminals.

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. A lighting apparatus comprising:
   a plurality of light-emitting units; and
   a feeder unit which is connected to an external power supply,
   wherein each light-emitting unit includes:
   a flat polygonal member;
   a light-emitting member which is provided on a main surface of the polygonal member;
   three sets of terminals, each set of terminals being provided on a different side of a periphery of the polygonal member; and
   a wiring pattern which is provided to the polygonal member to-connect the set of terminals with the light-emitting member,
   the feeder unit includes:
   a polygonal substrate; and
   three sets of feeder terminals, each set of feeder terminals being provided on a different side of a periphery of the polygonal substrate, each feeder terminal being connected in parallel to corresponding feeder terminals on other sides,
   the plurality of light-emitting units and the feeder unit are joined at predetermined sides so as to form a polyhedral shape, the predetermined sides each being a side on which a set of terminal or a set of feeder terminal has been provided, and
   corresponding terminals on joined sides of the plurality of light-emitting units are electrically connected, and the plurality of light-emitting units are each electrically connected to the feeder unit in parallel.

2. The lighting apparatus of claim 1,
   wherein the plurality of light-emitting units are joined by soldering the corresponding terminals on the joined sides of the plurality of light emitting units.

3. The lighting apparatus of claim 1 further comprising:
   a plurality of joint members which have connector electrodes to be connected to terminals of the plurality of light-emitting units,
   wherein the plurality of joint plates are used to join the plurality of light-emitting units.

4. The lighting apparatus of claim 1 wherein the lighting apparatus includes a flexible flat polygonal member for supporting the light-emitting member laminated to a Fresnell lens cover member and a heat radiating plate with a plurality of fins.

5. The lighting apparatus of claim 4 wherein the flat polygonal member is an isosceles triangle.

6. A lighting apparatus that comprises a plurality of light-emitting units and receives power from an external power supply circuit,
   wherein each light-emitting unit includes:
   a flat polygonal member;
   a light-emitting member which is provided on a main surface of the polygonal member;
   three sets of terminals, each set of terminals being provided on a different side of a periphery of the polygonal member; and
   a wiring pattern which is provided to the polygonal member to connect the set of terminals with the light-emitting member, and
   wherein the plurality of light-emitting units are joined at predetermined sides so as to form a polyhedral shape, the predetermined sides each being a side on which a set of terminal has been provided, and
   corresponding terminals on joined sides of the plurality of light-emitting units are electrically connected, and the plurality of light-emitting units are each electrically connected to the external power supply circuit in parallel.

7. The lighting apparatus of claim 6,
   wherein the plurality of light-emitting units are joined by soldering the corresponding terminals on the joined sides of the plurality of light emitting units.

8. The lighting apparatus of claim 6 further comprising:
   a plurality of joint members which have connector electrodes to be connected to terminals of the plurality of light-emitting units,
   wherein the plurality of joint plates are used to join the plurality of light-emitting units.

9. The lighting apparatus of claim 6 wherein the lighting apparatus includes a flexible flat polygonal member for supporting the light-emitting member laminated to a Fresnell lens cover member and a heat radiating plate with a plurality of fins.

* * * * *